United States Patent
Ribierre et al.

(10) Patent No.: US 11,165,027 B2
(45) Date of Patent: Nov. 2, 2021

(54) ORGANIC ELECTROLUMINESCENT DEVICE, COMPOUND AND USE THEREOF

(71) Applicants: KYUSHU UNIVERSITY, NATIONAL UNIVERSITY CORPORATION, Fukuoka (JP); CENTRE NATIONAL DE LA RECHERCHE SCIENTIFIQUE, Paris (FR); UNIVERSITÉ D'AIX-MARSEILLE, Marseilles (FR)

(72) Inventors: Jean-Charles Ribierre, Fukuoka (JP); Sangarange Don Atula Sandanayaka, Fukuoka (JP); DaeHyeon Kim, Fukuoka (JP); Chihaya Adachi, Fukuoka (JP); Anthony D'Aleo, Marseilles (FR); Frederic Fages, Sanary sur Mer (FR); Elena Zaborova, Marseilles (FR)

(73) Assignees: KYUSHU UNIVERSITY, NATIONAL UNIVERSITY CORPORATION, Fukuoka (JP); CENTRE NATIONAL DE LA RECHERCHE SCIENTIFIQUE, Paris (FR); UNIVERSITE D'AIX-MARSEILLE, Marseilles (FR)

( * ) Notice: Subject to any disclaimer, the term of this patent is extended or adjusted under 35 U.S.C. 154(b) by 0 days.

(21) Appl. No.: 16/487,277

(22) PCT Filed: Feb. 21, 2018

(86) PCT No.: PCT/JP2018/007382
§ 371 (c)(1),
(2) Date: Aug. 20, 2019

(87) PCT Pub. No.: WO2018/155724
PCT Pub. Date: Aug. 30, 2018

(65) Prior Publication Data
US 2020/0058873 A1 Feb. 20, 2020

(30) Foreign Application Priority Data
Feb. 21, 2017 (JP) .............................. JP2017-030528

(51) Int. Cl.
| | |
|---|---|
| C09K 11/06 | (2006.01) |
| C07F 5/04 | (2006.01) |
| H01L 51/42 | (2006.01) |
| H01L 51/00 | (2006.01) |
| H01S 5/12 | (2021.01) |
| H01S 5/125 | (2006.01) |
| H01S 5/36 | (2006.01) |
| H01L 51/50 | (2006.01) |
| H01S 5/024 | (2006.01) |
| H01S 5/04 | (2006.01) |

(52) U.S. Cl.
CPC .............. *H01L 51/008* (2013.01); *C07F 5/04* (2013.01); *C09K 11/06* (2013.01); *H01S 5/125* (2013.01); *H01S 5/1215* (2013.01); *H01S 5/36* (2013.01); *C09K 2211/1018* (2013.01); *H01L 51/42* (2013.01); *H01L 51/5012* (2013.01); *H01S 5/02469* (2013.01); *H01S 5/041* (2013.01)

(58) Field of Classification Search
None
See application file for complete search history.

(56) References Cited

U.S. PATENT DOCUMENTS

2004/0065867 A1   4/2004   Hartmann et al.

FOREIGN PATENT DOCUMENTS

| JP | 2000159777 A | 6/2000 |
|---|---|---|
| WO | 2010/078973 A1 | 7/2010 |
| WO | 2014/025808 A1 | 2/2014 |
| WO | 2017/089123 A1 | 6/2017 |

OTHER PUBLICATIONS

Fitter, Demar R. G. One probe, two-channel imaging of nuclear and cytosolic compartments with orange and red emissive dyes. Royal Society of Chemistry. 2015, 3, 9477-9484.*
International Preliminary Report on Patentability of Chapter I for International Application No. PCT/JP2018/007382 dated Aug. 27, 2019.
International Search Report and Search Opinion or International Application No. PCT/JP2018/007382 dated May 29, 2018.
(Continued)

*Primary Examiner* — Samantha L Shterengarts
(74) *Attorney, Agent, or Firm* — Browdy and Neimark, PLLC

(57) ABSTRACT

A compound represented by the following formula (1) is an excellent near-infrared emitter. $R^1$ to $R^6$ are H or a substituent and $R^7$ is represented by the following formula (2). $Ar^{11}$ is an aryl group, $R^{11}$ is a substituent other than an aryl group and n11 is 1 or more.

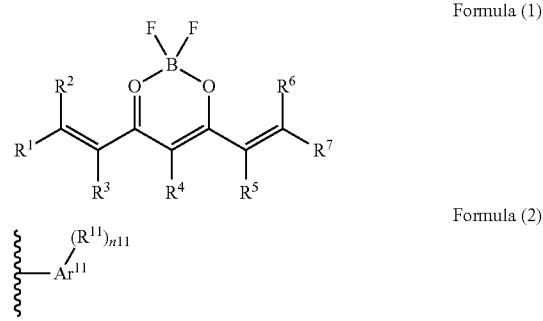

12 Claims, 19 Drawing Sheets

(56) References Cited

OTHER PUBLICATIONS

Lu Zhai et al., "Nanofibers generated from nonclassical organogelators based on difluoroboron p-diketonate complexes to detect aliphatic primary amine vapors", Journal of Materials Chemistry C, www.vsc/org/materials, The Royal Society of Chemistry, 4:34, p. 7939-7947, (2016).

Kotowski et al., "New donor-acceptor chromogene laser dyes generating in the visible spectral range", Laser Technology 11, SPIE, 1987, p. 10-13.

Kotowski et al., "Eighteen new laser dyes generating in the visible spectral range", Optica Applicata, vol. XIV, No. 2, 1984, p. 267-271.

Rivoal et al., "Synthesis, electrochemical and photophysical studies of the borondifluoride complex of a meta-linked biscurcuminoidt", The Royal Society of Chemistry, 2016, p. 1297-1305.

Martins et al., "Low-Threshold Nanoimprinted Lasers Using Substructured Gratings for Control of Distributed Feedback" Advanced Optical Materials, 2013, p. 563-566.

Liu et al., "Organic semiconductor distributed feedback laser pixels for lab-on-a-chip applications fabricated by laser-assisted", The Royal Society of Chemistry, 2014, p. 153-164.

Owen H. Wheeler et al., "Near Infrared Spectra of Organic Compounds", Chem. Rev., 1959, 4, p. 629-666.

M. Cocchi et al., "Single-dopant organic white electrophosphorescent diodes with very high efficiency and its reduced current density roll-off", Appl. Phys. Lett., 2007, 90, 163508.

Kenneth R. Graham et al., "Extended Conjugation Platinum(II) Porphyrins for use in Near-Infrared Emitting Organic Light Emitting Diodes", Chem. Mater., 2011, 24, 5305-5312.

HyoJoong Lee et al., "PbS and CdS Quantum Dot-Sensitized Solid-State Solar Cells: Old Concepts, New Results", Adv. Funct. Mater., 2009, 19, 2735-2742.

Renqiang Yang et al., "Deep-Red Electroluminescent Polymers: Synthesis and Characterization of New Low-Band-Gap Conjugated Copolymers for Light-Emitting Diodes and Photovoltaic Devices", Macromolecules, 2005, 38, 244-253.

Leyu Wang et al., "Multifunctional Nanoparticles Displaying Magnetization and Near-IR Absorption", Angew. Chem. Int. Ed., 2008, 47, 2439-2442.

Jie Xue et al., "High-efficiency and low efficiency roll-off nearinfrared fluorescent OLEOs through triplet fusiont", Chem. Sci., 2016, 7, 2888-2895.

Gerhard Mann et al., "Zur Darstellung unsymmetrisrher Curcuminoide", Z. Chem., 27, 172-173, 1987.

Eun Kyoung Ryu et al., "Curcumin and Dehydrozingerone Derivatives: Synthesis, Radiolabeling, and Evaluation for ă-Amyloid Plaque Imaging", J. Med. Chem. 2006, 49, 6111-6119.

Li Zhao et al., "Singlet-Triplet Exciton Annihilation Nearly Suppressed in Organic Semiconductor Laser Materials Using Oxygen as a Triplet Quencher", IEEE J. Sel. Topics Quantum Electron., 2016, 22, 1.

Atula S. D. Sandanayaka et al., "Quasi-Continuous-Wave Organic Thin-Film Distributed Feedback Laser", Adv. Opt. Mater., 2016, 4, 834-839.

M. Cocchi et al., "Highly efficient near-infrared organic excimer electrophosphorescent diodes", Appl. Phys. Lett., 2007, 90, 023506.

Extended European Search Report dated Nov. 17, 2020 issued in the corresponding European patent application No. 18756938.9.

Office Action dated Jul. 14, 2021 issued in the corresponding Chinese patent application No. 201880013186.0 with its English Translation.

* cited by examiner

[Fig. 1]
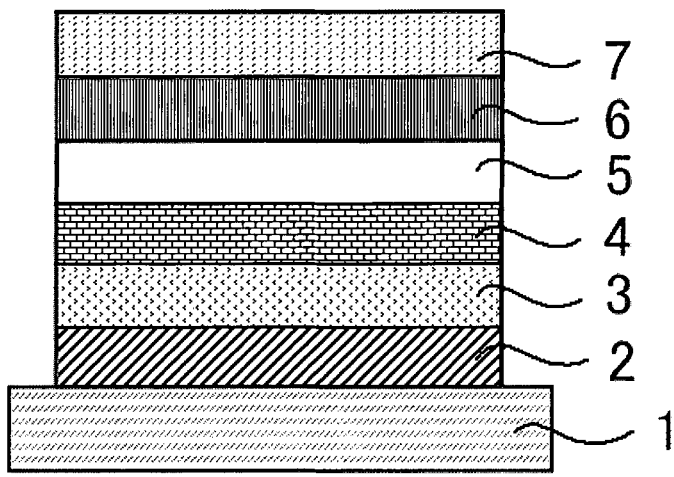
[Fig. 2]
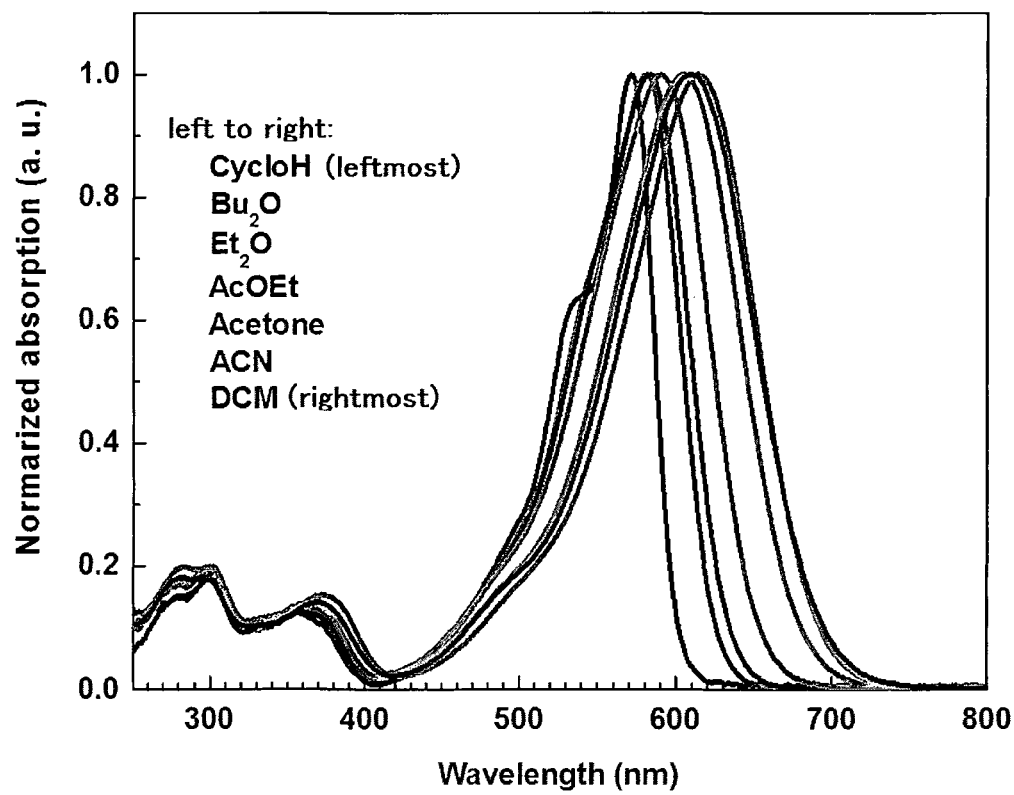

[Fig. 3]
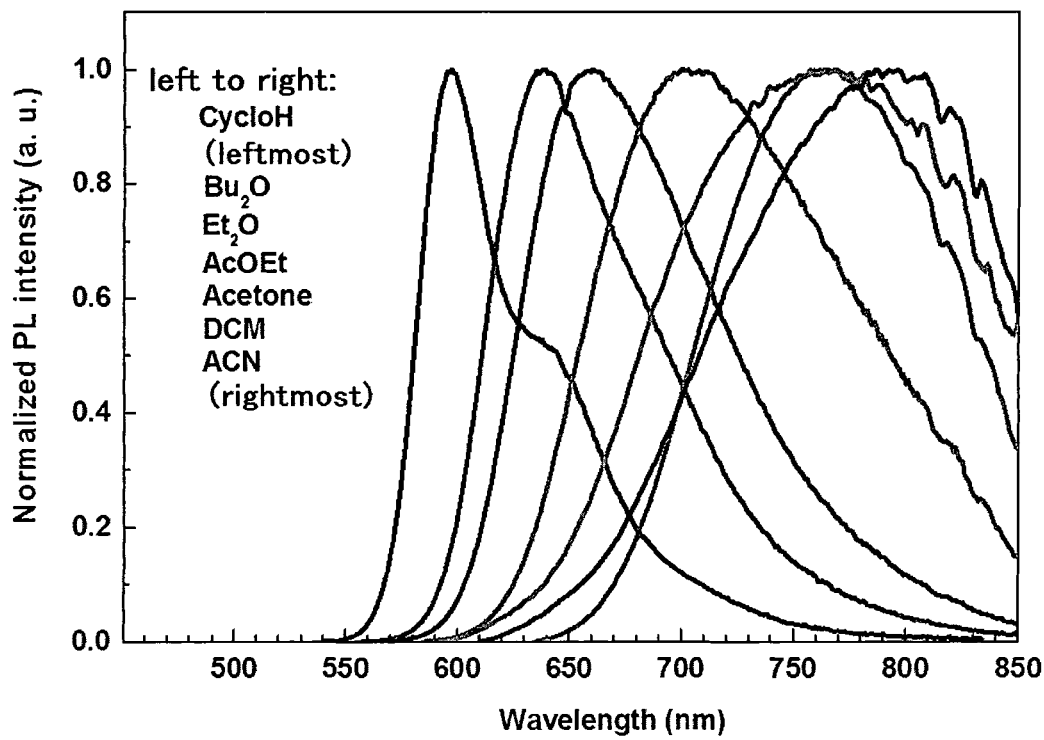
[Fig. 4]
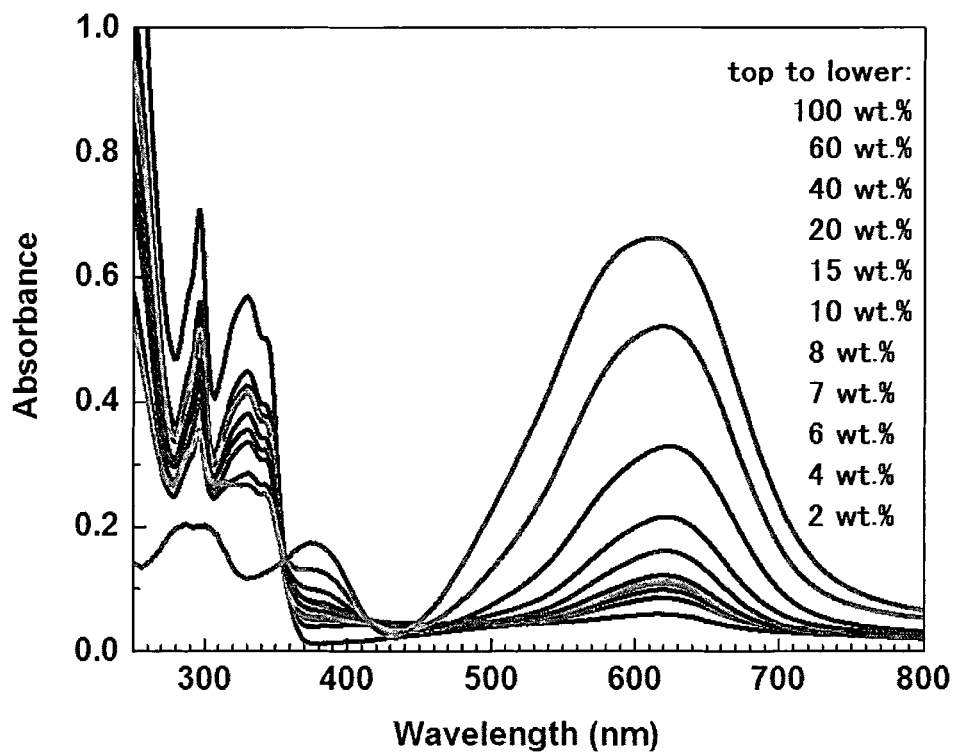

[Fig. 5]
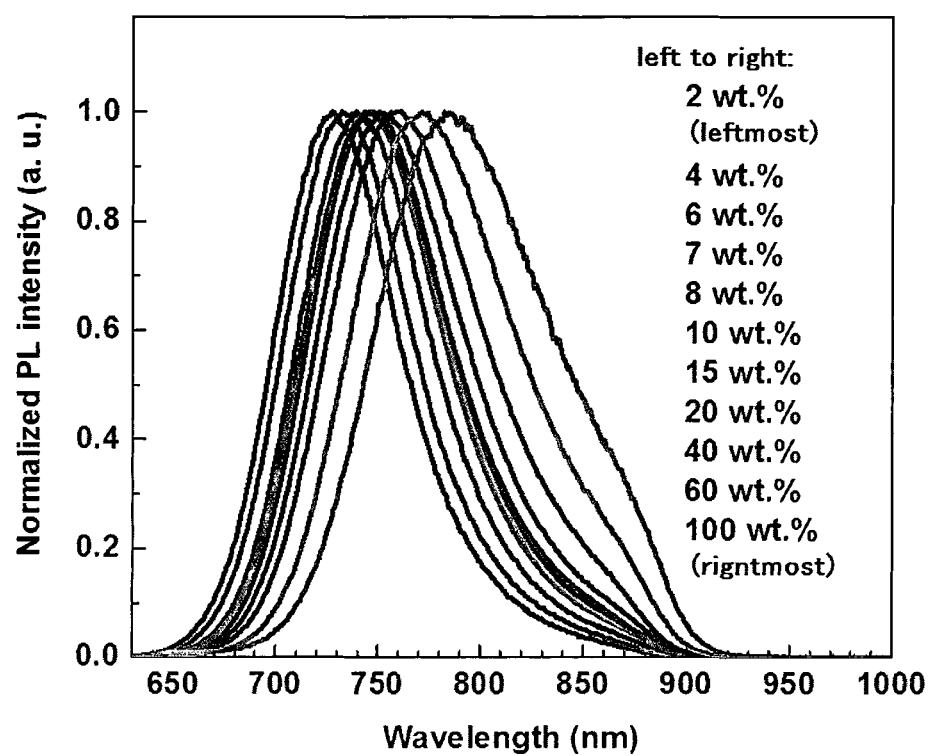

[Fig. 6]
(a)
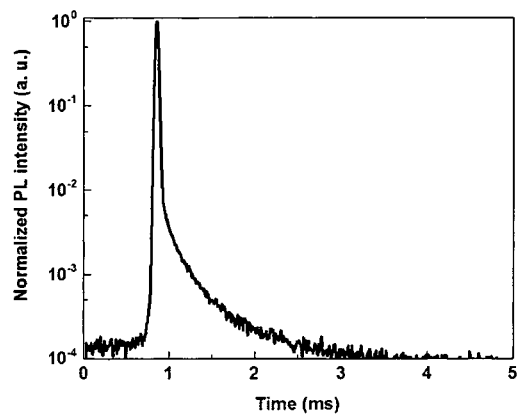
(b)
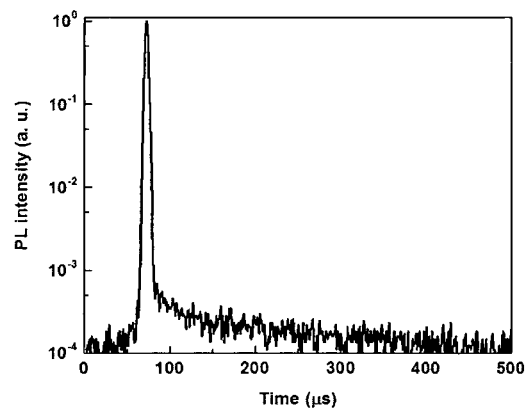
(c)
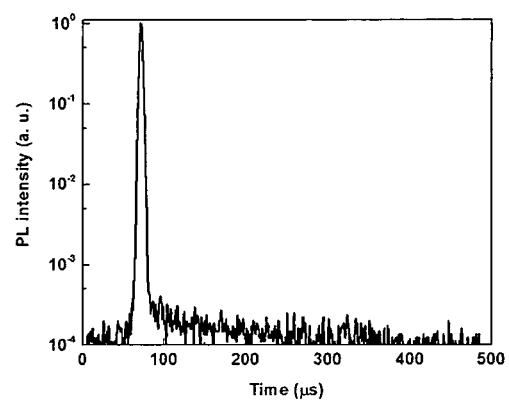
(d)
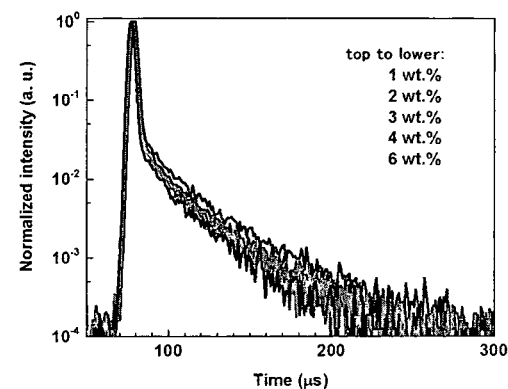
(e)
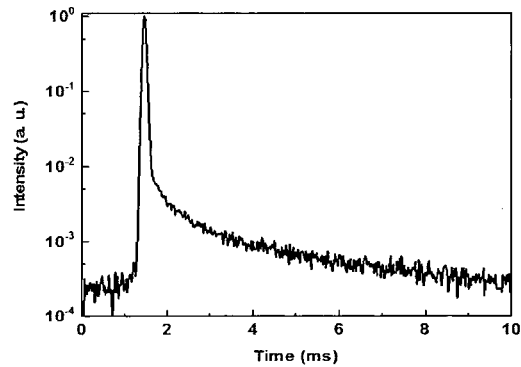

[Fig. 7]
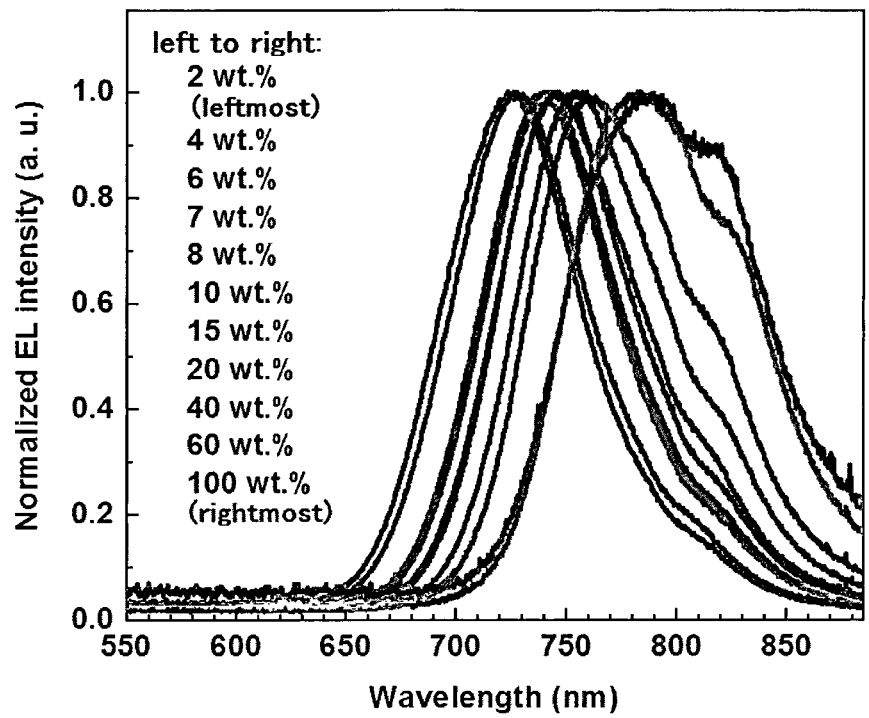
[Fig. 8]
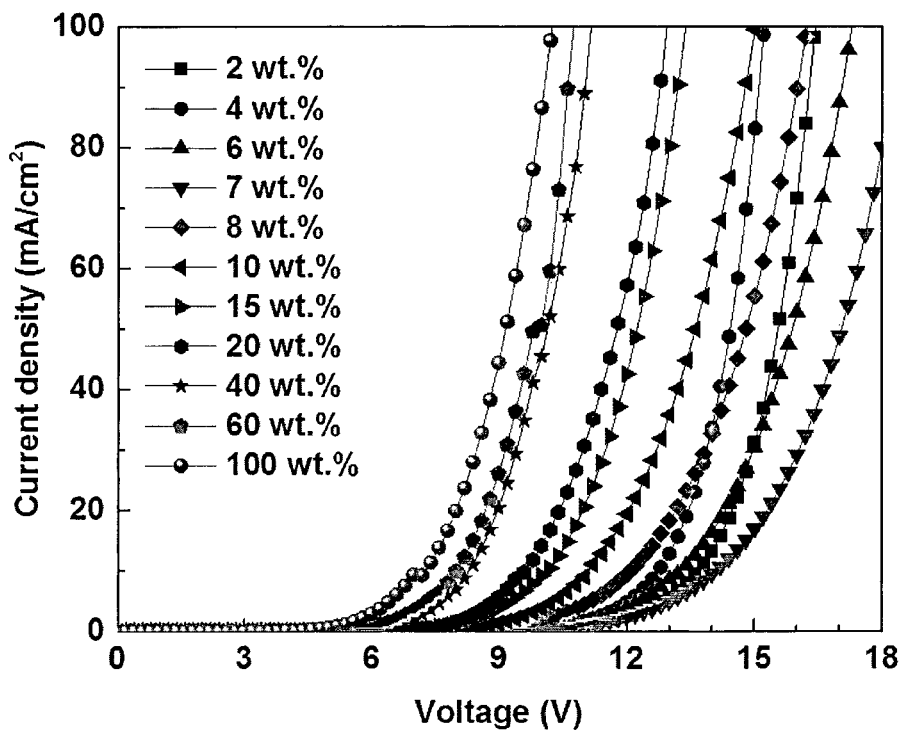

[Fig. 9]
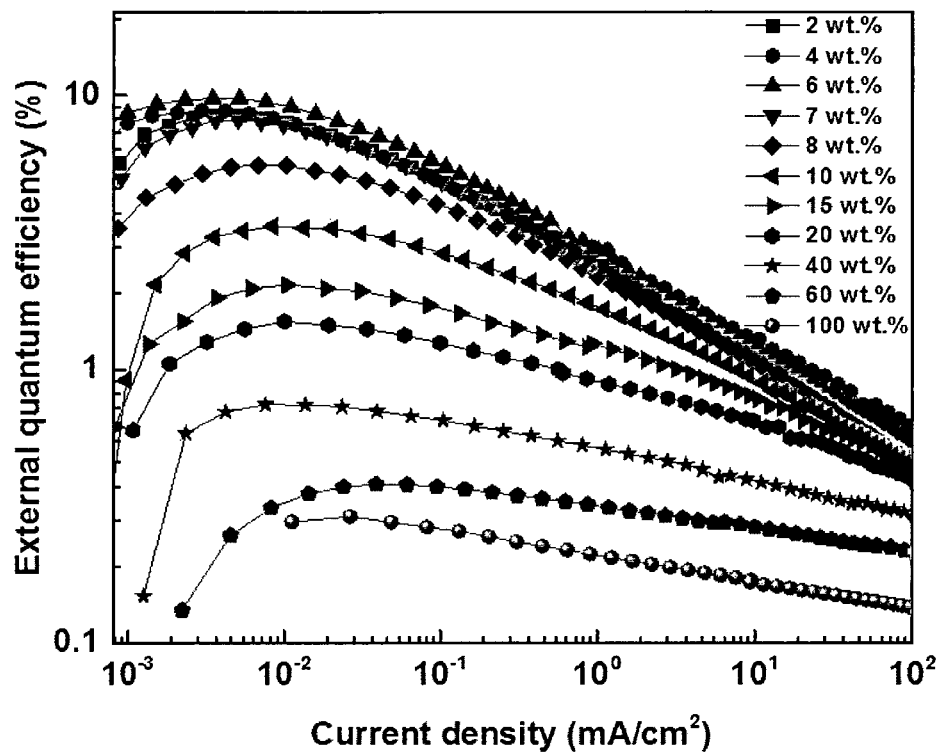
[Fig. 10]
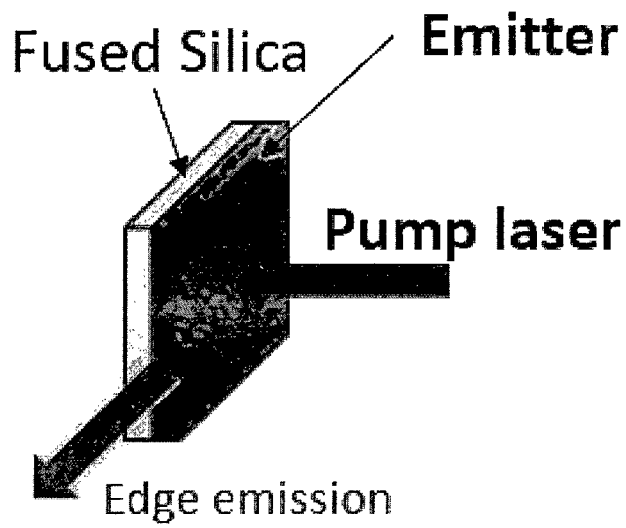

[Fig. 11]
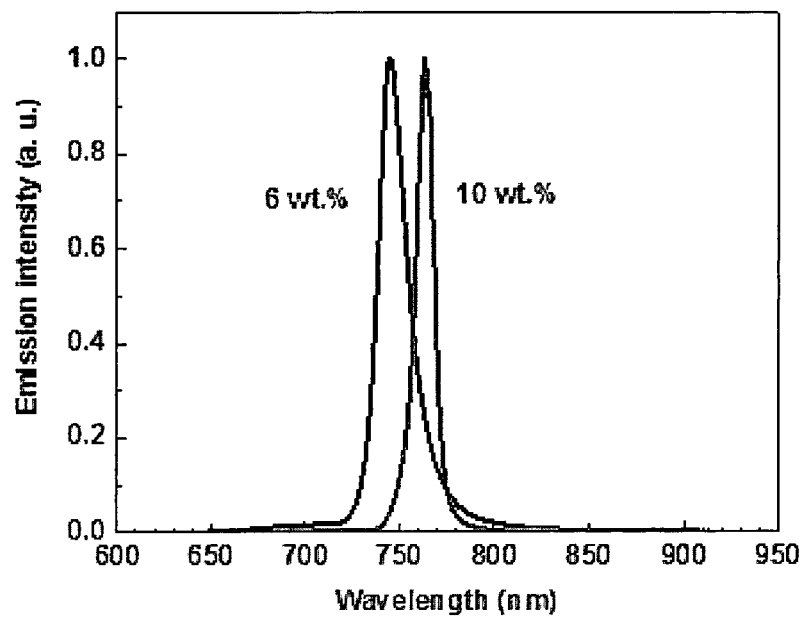
[Fig. 12]
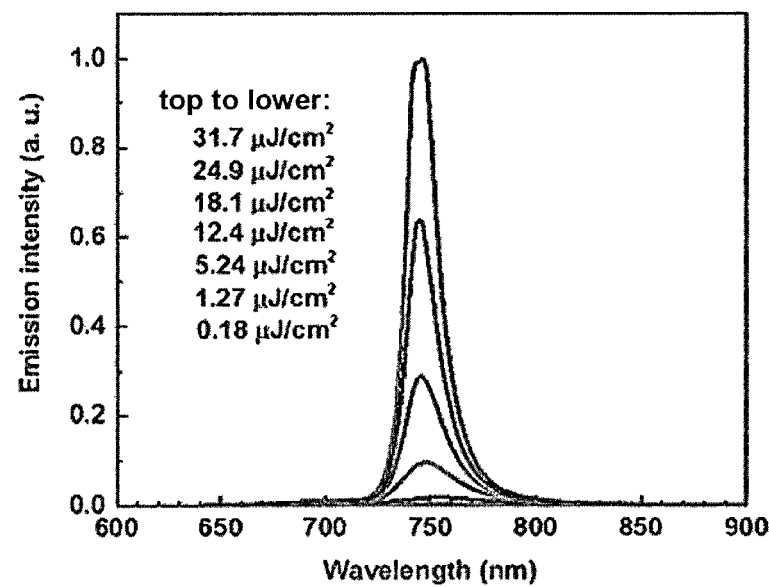

[Fig. 13]
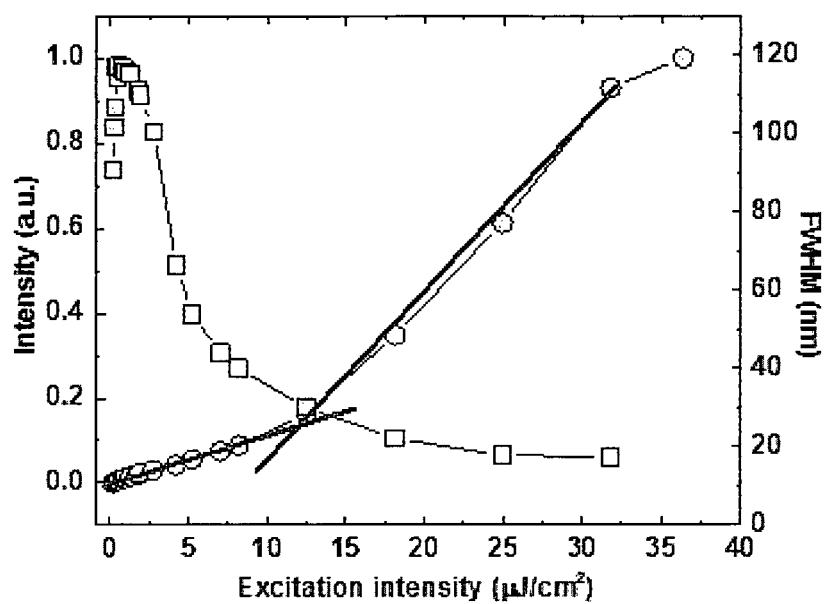

[Fig. 14]
(a)
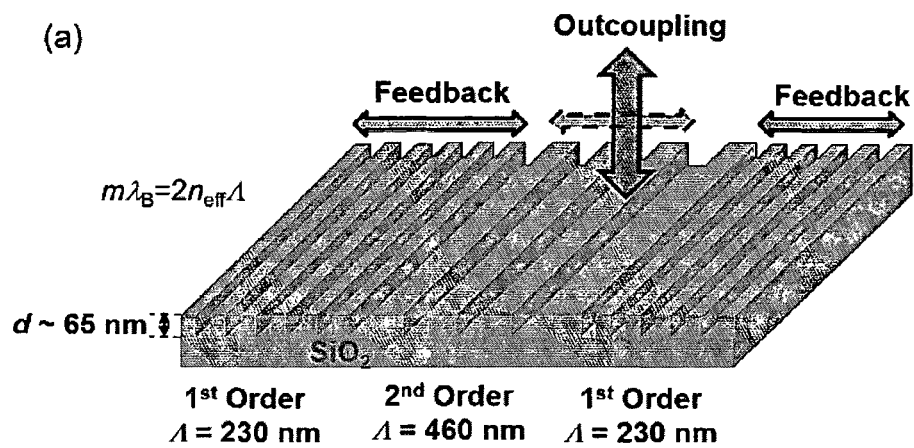
(b)
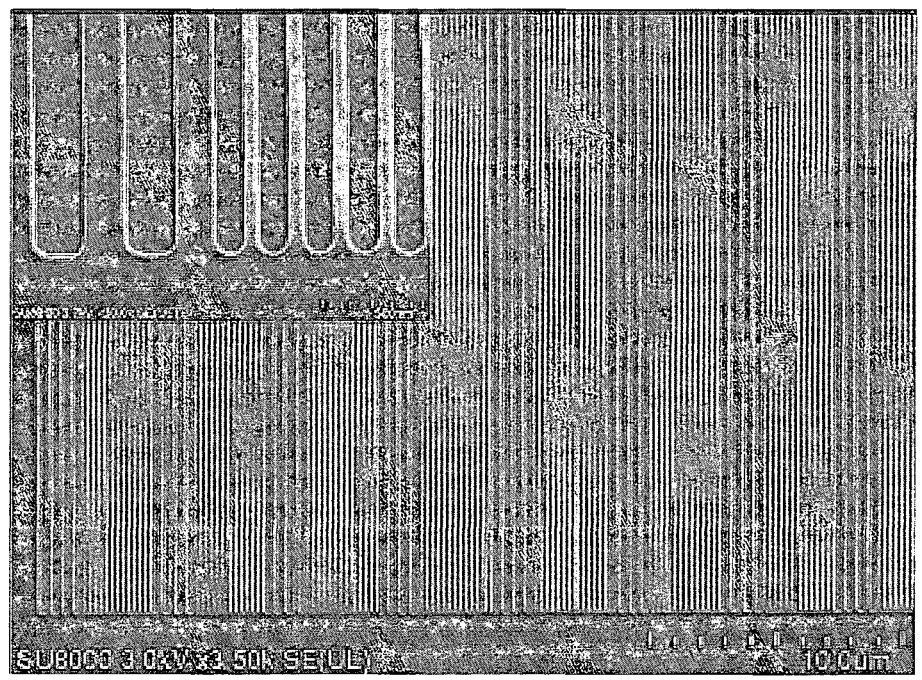
(c)
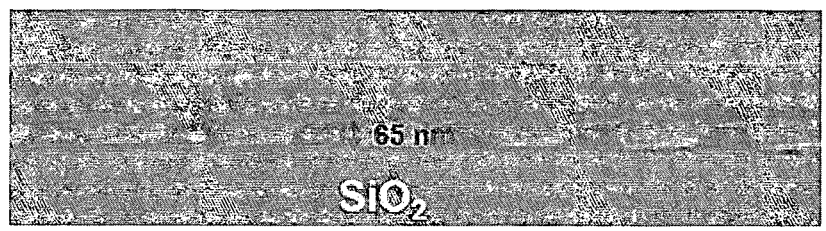

[Fig. 15]
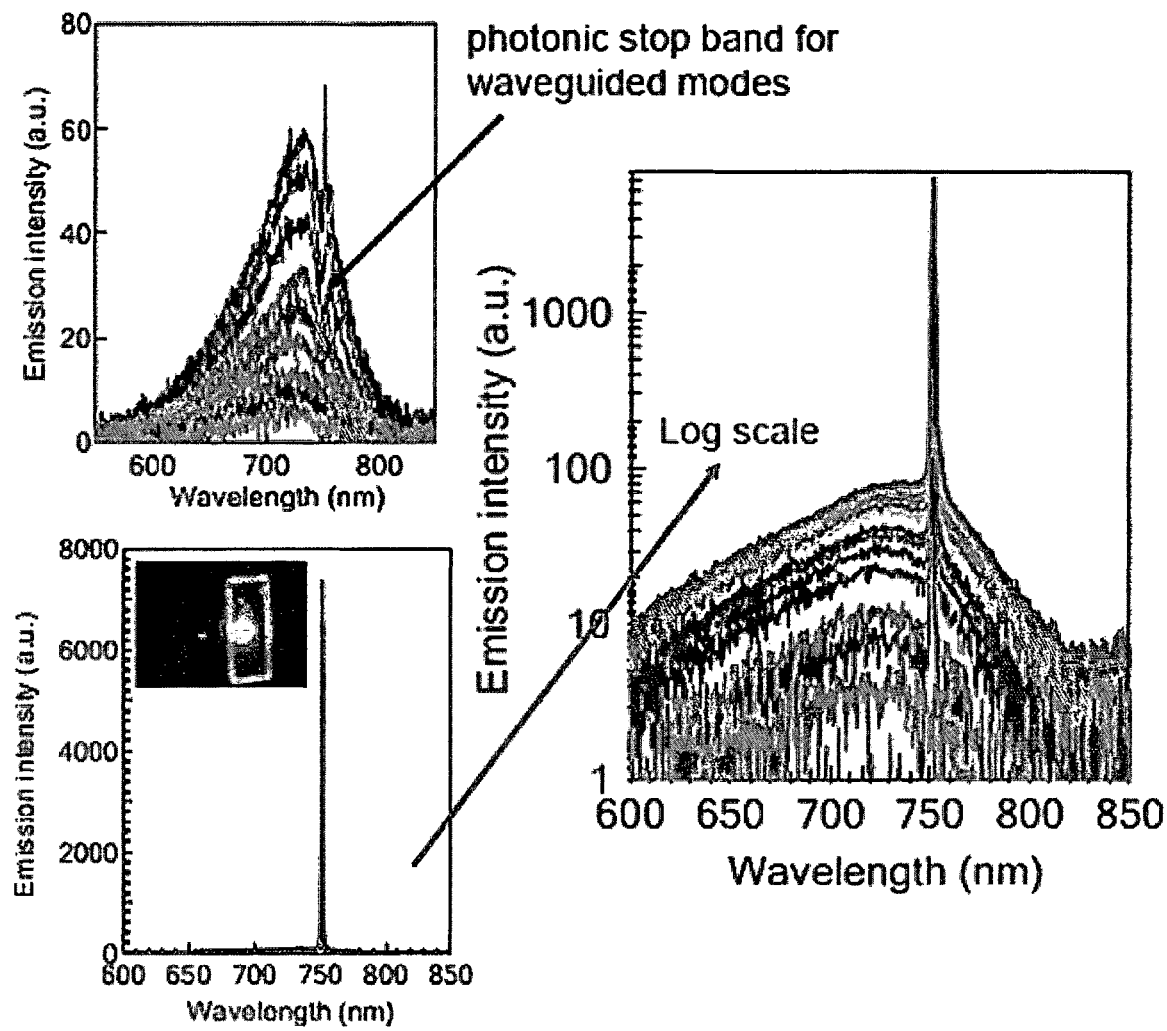

[Fig. 16]
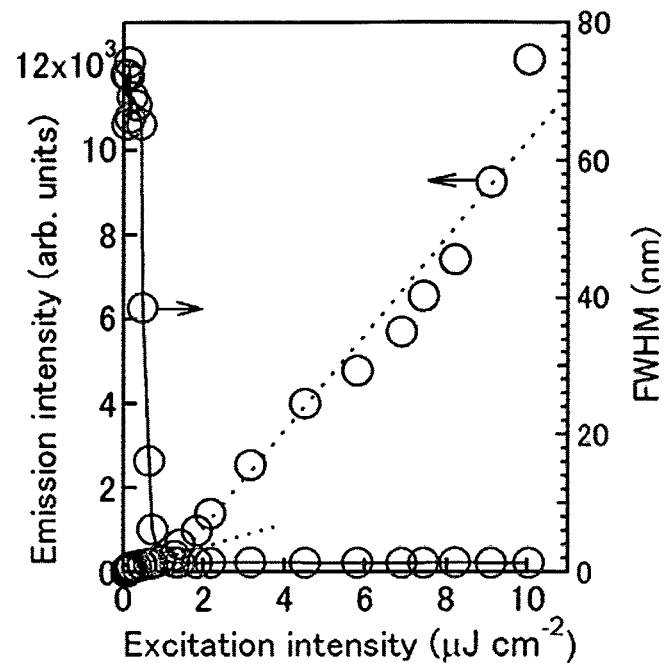
[Fig. 17]
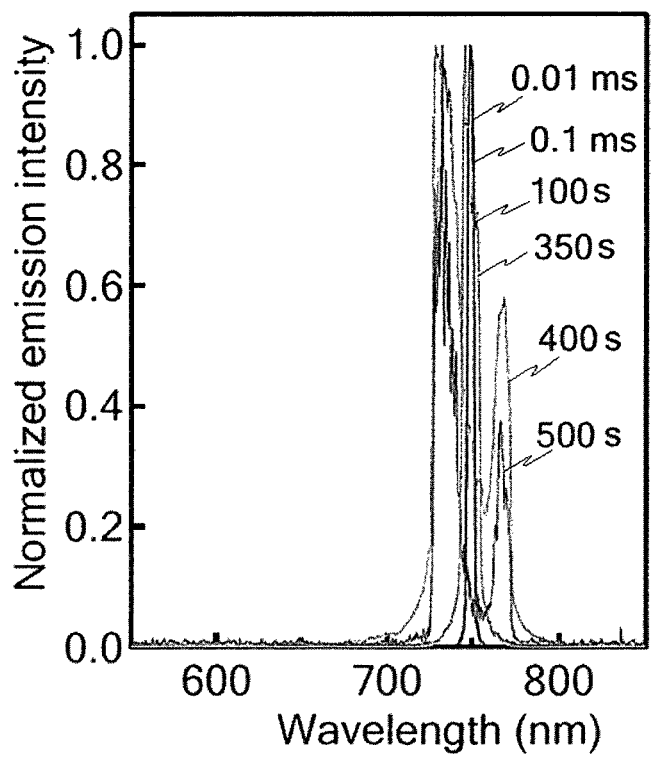

ORGANIC ELECTROLUMINESCENT DEVICE, COMPOUND AND USE THEREOF

BACKGROUND OF THE INVENTION

Field of the Invention

The present invention relates to an organic electroluminescent device, a compound and use of the compound.

Description of the Related Art

Organic electroluminescent devices in the visible spectrum region have achieved significant progress. Recently, there has been a growing interest in organic electroluminescent devices that emit in near-infrared (NIR) region (i.e. 700-2500 nm). Potential application of these NIR organic electroluminescent devices is of interest for bio-imaging, medical cameras, sensors, security cameras, night-vision displays and information-secured displays. Highly efficient NIR emitters are urgently needed for use in the organic electroluminescent devices.

Effective triplet harvesting is one of the key issues to fabricate high performance NIR electroluminescent devices. For instance, fluorescent heavy metal complexes have been successfully used in high performance NIR organic electroluminescent devices with an external quantum efficiency above 10% and an emission peak at longer wavelength than 700 nm. Nevertheless, the high cost and shortage of rare heavy metals such as platinum and iridium are serious drawbacks for commercial applications based on such metal complexes. An alternative way in NIR organic electroluminescent devices is based on the use of heavy-metal-free organic molecules. In 1959, the first NIR organic light-emitting molecules were developed by Owen G. Wheeler and his co-workers (see Non-patent Literature 1). Nearly 60 years later, external quantum efficiency of NIR organic electroluminescent devices has only reached the values of 2.1% and 1.9% for an electroluminescence peak wavelength of 710 and 760 nm, respectively (see Non-patent Literatures 2 to 7).

Non-Patent Literature 1:
Owen H. Wheeler, *Chem. Rev.*, 1959, 4, 629-666.

Non-Patent Literature 2:
M. Cocchi, J. Kalinowski, D. Virgili, V. Fattori, S. Develay and J. A. G. Williams, *Appl. Phys. Lett.*, 2007, 90, 163508.

Non-Patent Literature 3:
Kenneth R. Graham, Yixing Yang, Jonathan R. Sommer, Abigail H. Shelton, Kirk S. Schanze, Jiangeng Xue and John R. Reynolds, *Chem. Mater*, 2011, 24, 5305-5312.

Non-Patent Literature 4:
HyoJoong Lee, Henry C. Leventis, Soo-Jin Moon, Peter Chen, Seigo Ito, Saif A. Hague,
Tomas Torres, Frank Nüesch, Thomas Geiger, Shaik M. Zakeeruddin, Michael Grätzel and Md. Khaja Nazeeruddin, *Adv. Funct. Mater*, 2009, 19, 2735-2742.

Non-Patent Literature 5:
Renqiang Yang, Renyu Tian, Jingai Yan, Yong Zhang, Jian Yang, Qiong Hou, Wei Yang, Chi Zhang and Yong Cao, *Macromolecules*, 2005, 38, 244-253.

Non-Patent Literature 6:
Leyu Wang, Jingwei Bai, Yujing Li and Yu Huang, *Angew. Chem. Int. Ed.*, 2008, 47, 2439-2442.

Non-Patent Literature 7:
Jie Xue, Chen Li, Lijun Xin, Lian Duan and Juan Qiao, *Chem. Sci.*, 2016, 2888-2895.

SUMMARY OF THE INVENTION

An object of the invention is to develop novel efficient NIR organic emitters that are free from heavy metals.

As a result of earnest investigations, the inventors have found that a group of compounds having a particular structure have excellent properties as NIR emitters. Furthermore, the inventors have found that the group of compounds include a compound that is useful as a delayed fluorescent emitter, and have clarified that an organic light-emitting device having a high NIR emission efficiency can be provided. Thus, the inventors have provided the following invention:

[1] An organic electroluminescent device containing a compound represented by the following formula (1):

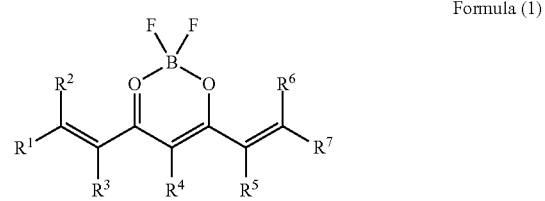

Formula (1)

wherein $R^1$ to $R^6$ each independently represent a hydrogen atom or a substituent; $R^1$ and $R^2$, $R^2$ and $R^3$, $R^3$ and $R^4$, $R^4$ and $R^5$, $R^5$ and $R^6$ and $R^6$ and $R^7$ may be taken together to form a ring; and $R^7$ represents a group represented by the following formula (2) or formula (3):

Formula (2)

wherein $Ar^{11}$ represents an aryl group or an aryl-substituted aryl group; $R^{11}$ represents a substituent other than an aryl group; n11 represents an integer of from 1 to the number of substitutable positions in $Ar^{11}$; when n11 is 2 or more, then each $R^{11}$ may be the same or different; and at least one $R^{11}$ is an electron-donating group;

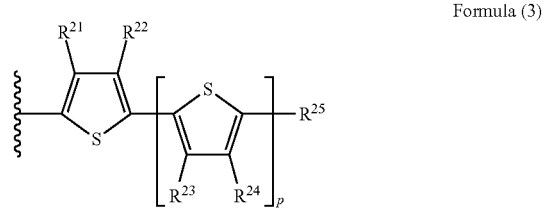

Formula (3)

wherein $R^{21}$ to $R^{25}$ each independently represent a hydrogen atom or a substituent; and p is an integer of from 0 to 2.

[2] The organic electroluminescent device of [1], wherein the compound is represented by the following formula (11):

Formula (11)

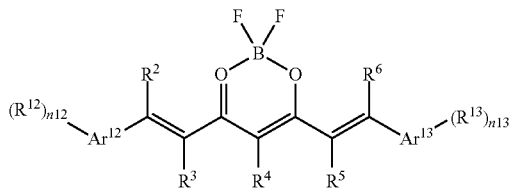

wherein $Ar^{12}$ and $Ar^{13}$ each independently represent an aryl group or an aryl-substituted aryl group; $R^2$ to $R^6$ each independently represent a hydrogen atom or a substituent; $R^{12}$ and $R^{13}$ each independently represent a substituent; $R^3$ and $R^4$, and $R^4$ and $R^5$ may be taken together to form a ring; $R^2$ may be bonded to $Ar^{12}$ to form a ring and $R^6$ may be bonded to $Ar^{13}$ to form a ring; n12 represents an integer of from 1 to the number of substitutable positions in $Ar^{12}$; when n12 is 2 or more, then each $R^{12}$ may be the same or different; at least one $R^{12}$ is an electron-donating group; n13 represents an integer of from 1 to the number of substitutable positions in $Ar^{13}$; when n13 is 2 or more, then each $R^{13}$ may be the same or different; and at least one $R^{13}$ is an electron-donating group.

[3] The organic electroluminescent device of [2], wherein at least one $R^{12}$ and at least one $R^{13}$ are each independently a substituted or unsubstituted diarylamino group.

[4] The organic electroluminescent device of [2] or [3], wherein $Ar^{12}$ and $Ar^{13}$ each independently have a benzene structure, a naphthalene structure, an anthrathene structure or a fluorene structure.

[5] The organic electroluminescent device according to any one of [1] to [4], wherein the compound is represented by the following formula (12):

Formula (12)

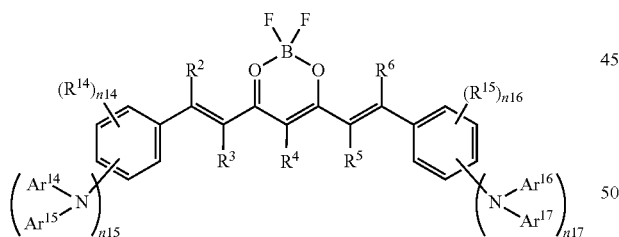

wherein $Ar^{14}$ to $Ar^{17}$ each independently represent a substituted or unsubstituted aryl group; $R^2$ to $R^6$ each independently represent a hydrogen atom or a substituent; $R^{14}$ and $R^{15}$ each independently represent a substituent other than a substituted or unsubstituted diarylamino group; $R^{14}$ and $R^2$, $R^3$ and $R^4$, $R^4$ and $R^5$, and $R^6$ and $R^{15}$ may be taken together to form a ring; n14 and n16 each independently represent an integer of 0 or more; n15 and n17 each independently represent an integer of 1 or more; n14+n15 is an integer of from 1 to 5 and n16+n17 is an integer of from 1 to 5; when n14 is 2 or more, then each $R^{14}$ may be the same or different; when n15 is 2 or more, then each $Ar^{14}$ may be the same or different and each $Ar^{15}$ may be the same or different; when n16 is 2 or more, then each $R^{15}$ may be the same or different; when n17 is 2 or more, then each $Ar^{16}$ may be the same or different and each $Ar^{17}$ may be the same or different.

[6] The organic electroluminescent device according to any one of [1] to [5], wherein $R^4$ is a hydrogen atom, a substituted or unsubstituted alkyl group, a substituted or unsubstituted aryl group, a substituted or unsubstituted heteroaryl group, a substituted or unsubstituted alkoxycarbonyl group, a substituted or unsubstituted aryloxycarbonyl group, a halogen atom, or a group containing a boron difluoride diketonate ring.

[7] The organic electroluminescent device according to any one of [1] to [6], wherein $R^3$ and $R^4$, or $R^4$ and $R^5$ are taken together to form a ring.

[8] The organic electroluminescent device according to [1], wherein the compound is represented by the following formula (21):

Formula (21)

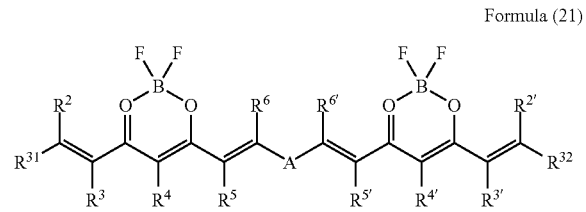

wherein $R^2$ to $R^6$ and $R^{2'}$ to $R^{6'}$ each independently represent a hydrogen atom or a substituent; $R^{31}$ and $R^{32}$ each independently represent one of the Group A below; $R^{31}$ and $R^2$, $R^3$ and $R^4$, $R^4$ and $R^5$, $R^{32}$ and $R^{2'}$, $R^{3'}$ and $R^{4'}$, and $R^{4'}$ and $R^{5'}$ may be taken together to form a ring; $R^6$ may be bonded to A to form a ring and $R^7$ may be bonded to A to form a ring; A represents a linking group represented by the following formula (22) or (24):

Formula (22)

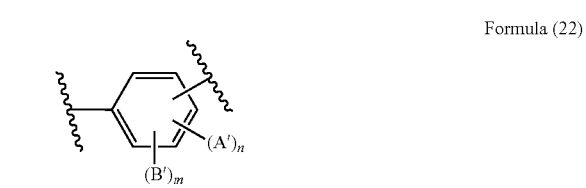

wherein n is an integer of from 0 to 4; m is 0 or 1; A' represents an alkoxy group having 1 to 12 carbon atoms; and B' represents a group represented by the following formula (23):

Formula (23)

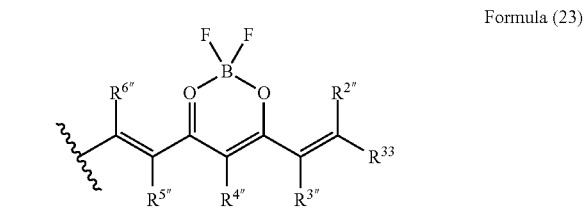

wherein $R^{2''}$ to $R^{6''}$ each independently represent a hydrogen atom or a substituent; and $R^{33}$ represents one of the Group A below;

Formula (24)

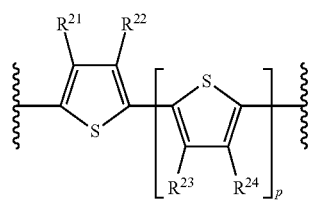

wherein $R^{21}$ to $R^{24}$ each independently represent a hydrogen atom or a substituent; and p is an integer of from 0 to 2;

Group A

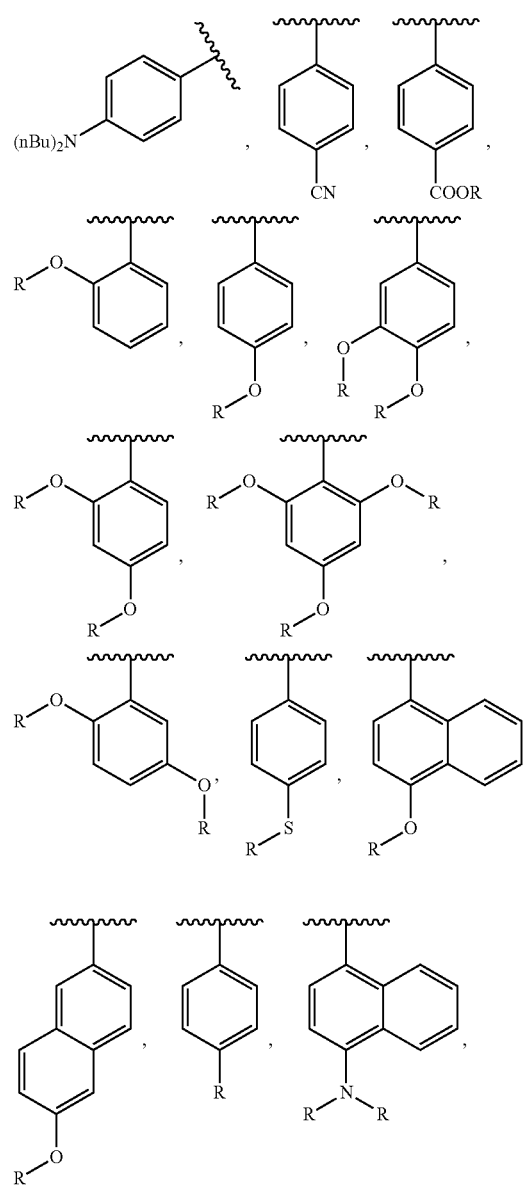

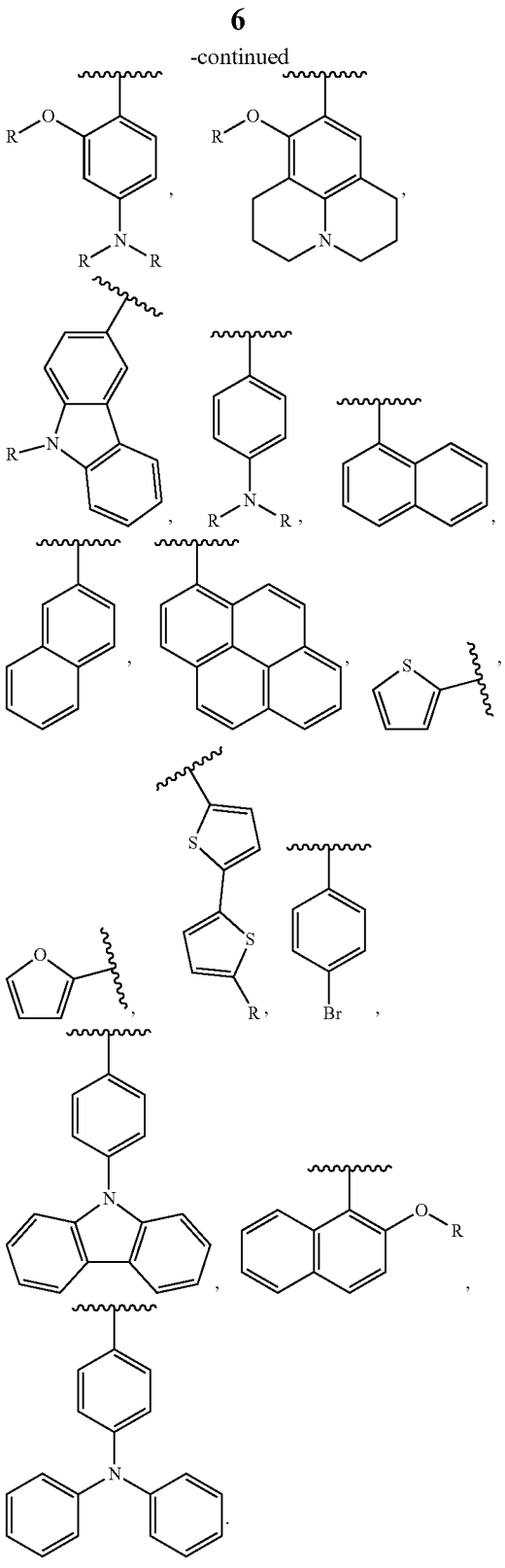

wherein each R independently represents a hydrogen atom, a substituted or unsubstituted alkyl group having 1 to 12 carbon atoms, a substituted or unsubstituted aryl group having 6 to 10 carbon atoms, or, a substituted or unsubstituted heteroaryl group; and nBu represents a normal butyl group.

[9] The organic electroluminescent device of any one of [1] to [8], which emits delayed fluorescence.

[10] The organic electroluminescent device according to any one of [1] to [9], which exhibits a maximum emission wavelength at a range of from 700 to 1500 nm.

[11] A compound represented by the formula (11).

[12] A compound represented by the formula (12).

[13] Use of a compound of [11] or [12], in bioimaging, as sensors of volatile acid/base, in photodynamic therapy, in diagnosis of Alzheimer's disease, in theranostics, as optical sensors for anaerobic environment, in display and telecommunication technologies, or in photovoltaics.

[14] Use of a compound represented by the formula (1) as a delayed fluorescence emitter.

[15] Use of a compound represented by the formula (1) as an emitter in an organic semiconductor laser.

[16] The use of a compound of [15], wherein the organic semiconductor laser has an optical resonator structure composed of a second-order Bragg scattering region surrounded by a first-order Bragg scattering region.

The compounds represented by the formula (1) are excellent NIR emitters. The formula (1) includes a compound that is useful as a NIR delayed fluorescent emitter and a compound that can be used as an emitter in an organic electroluminescent device and an organic semiconductor laser. An organic light-emitting device containing a compound of the formula (1) exhibits high light emission efficiency in NIR region.

BRIEF DESCRIPTION OF THE DRAWINGS

FIG. 1 is a schematic cross sectional view showing an example of a layer structure of an organic electroluminescent device.

FIG. 2 is normalized electronic absorption spectra of the solutions of Compound 1.

FIG. 3 is normalized fluorescence emission spectra of the solutions of Compound 1.

FIG. 4 is normalized electronic absorption spectra of the thin films of Compound 1.

FIG. 5 is normalized fluorescence emission spectra of the thin films of Compound 1.

FIG. 6 (a)-(e) are transient photoluminescence spectra of the thin films of Compounds 1 to 5, respectively.

FIG. 7 is light emission spectra of the organic electroluminescent devices of Compound 1.

FIG. 8 is voltage-electric current density characteristics of the organic electroluminescent devices of Compound 1.

FIG. 9 is electric current density-external quantum efficiency characteristics of the organic electroluminescent devices of Compound 1.

FIG. 10 is a schematic representation of the ASE measurement configuration of Example 4.

FIG. 11 is ASE speatra of CBP/Compound 1 blend films with different doping concentrations.

FIG. 12 is ASE speatra of CBP/Compound 1 blend films at different pump intensities.

FIG. 13 is output intensity as a function of the excitation intensity measured in CBP/Compound 1 blend film.

FIG. 14 (a)-(c) are a schematic view and SEM images of the DFB structure in the DFB laser of Example 5.

FIG. 15 is emission spectra measured normal to the surface of the DFB laser of Example 5 for different excitation intensities.

FIG. 16 is output intensity plotted as a function of the excitation intensity measured in the DFB laser of Example 5.

FIG. 17 is emission spectra of the DFB laser of Example 5 for different pulse durations.

DETAILED DESCRIPTION OF THE INVENTION

Figure 18A:
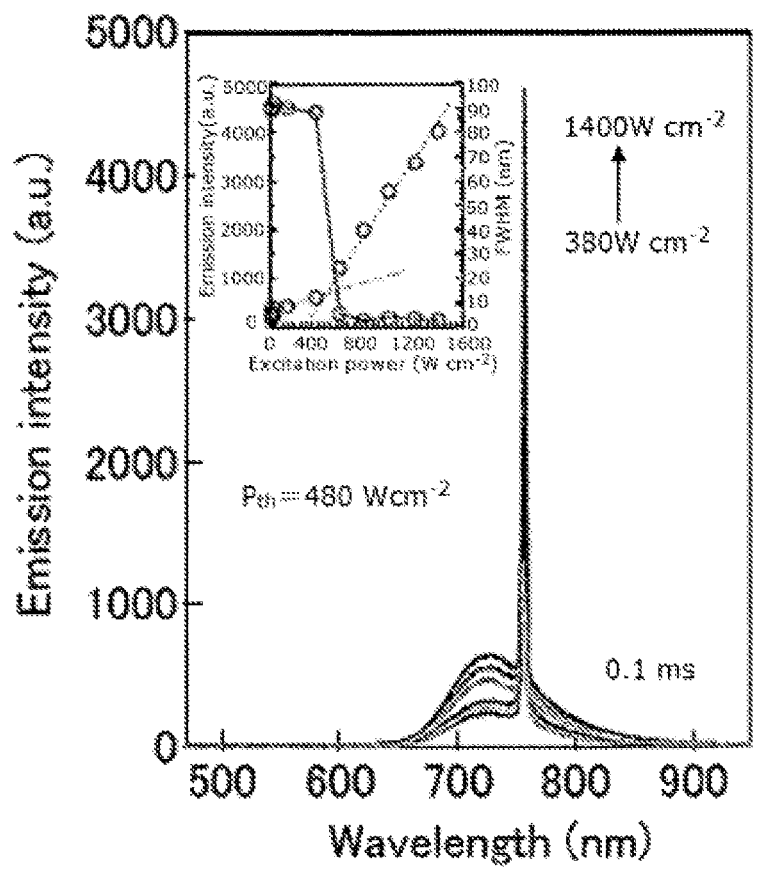
FIGS. 18A-18D are emission spectra of the DFB laser of Example 5 for each different pulse duration, 0.1 ms (FIG. 18A), 10 ms (FIG. 18B), 100 ms (FIG. 18C), and 1000 ms (FIG. 18D).

The contents of the invention will be described in detail below. The elements of the invention may be described below with reference to representative embodiments and specific examples of the invention, but the invention is not limited to the embodiments and the examples. In the description, a numerical range expressed with reference to an upper limit and/or a lower limit means a range that includes the upper limit and/or the lower limit. The room temperature means 25° C.

The hydrogen atoms that are present in the compounds used in the invention are not particularly limited in isotope species, and for example, all the hydrogen atoms in the molecule may be $^1$H, and all or a part of them may be $^2$H (deuterium (D)).

The alkyl group referred in the present application may be linear, branched or cyclic, and a linear or branched alkyl group is preferred. The alkyl group preferably has from 1 to 20 carbon atoms, more preferably from 1 to 12 carbon atoms, further preferably from 1 to 8 carbon atoms, still further preferably from 1 to 6 carbon atoms (e.g., a methyl group, an ethyl group, an n-propyl group, an isopropyl group, an n-butyl group, an isobutyl group, a tert-butyl group, an n-pentyl group, an isopentyl group, an n-hexyl group, an isohexyl group, an n-heptyl group, an n-octyl group, an n-nonyl group, an n-decyl group, an n-undecyl group and an n-dodecyl group). Examples of the cyclic alkyl group include a cyclopropyl group, a cyclobutyl group, a cyclopentyl group, a cyclohexyl group, a cycloheptyl group, a bicylo[2.1.1]hexyl group and a bicyclo[2.2.1]heptyl group. The alkyl group may be substituted. Examples of the substituent in this case include an alkoxy group, an aryl group, an aryloxy group, an acyl group, a hydroxyl group, a halogen atom, a nitro group, a diarylamino group (including a 9-carbazolyl group) and a cyano group, and preferred are an alkoxy group, an aryl group and an aryloxy group.

The alkenyl group referred in the present application may be linear, branched or cyclic, and a linear or branched alkyl group is preferred. The alkenyl group preferably has from 2 to 20 carbon atoms, more preferably from 2 to 12 carbon atoms, further preferably from 2 to 8 carbon atoms, still further preferably from 2 to 6 carbon atoms. Examples of the alkenyl group include a vinyl group, a butadienyl group, a hexatrienyl group, a 1-cyclohexenyl group. The alkenyl group may be substituted. Examples of the substituent in this case include an alkoxy group, an aryl group, an aryloxy group, an acyl group, a hydroxyl group, a halogen atom, a nitro group, a diarylamino group (including a 9-carbazolyl group) and a cyano group.

The aryl group referred in the present application may have a structure containing only one aromatic ring or a structure containing two or more aromatic rings condensed with each other. The aryl group preferably has from 6 to 22 ring skeleton-forming carbon atoms, more preferably from 6 to 18 ring skeleton-forming carbon atoms, further preferably from 6 to 14 ring skeleton-forming carbon atoms, and still further preferably from 6 to 10 ring skeleton-forming carbon atoms. Examples of the aryl group include a phenyl group, a 1-naphthyl group, a 2-naphthyl group, a 1-anthranyl group, a 2-anthranyl group, a 9-anthranyl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 1-pyrenyl group and a 2-pyrenyl group. The aryl group may be substituted. Examples of the substituent in this case include an alkyl group, an alkoxy group, an aryl group, an aryloxy group, an acyl group, a hydroxyl group, a halogen atom, a nitro group, a diarylamino group (including a 9-carbazolyl group) and a cyano group, and preferred are an alkyl group, an alkoxy group, an aryl group, and an aryloxy group.

The heteroaryl group referred in the present application may have a structure containing only one heteroaromatic ring or a structure containing two or more heteroaromatic rings condensed with each other. The heteroaryl group may contain at least one heteroaromatic ring and at least one aromatic ring. The heteroaryl group preferably has from 5 to 22 ring skeleton-forming atoms, more preferably from 5 to 18 ring skeleton-forming atoms, further preferably from 5 to 14 ring skeleton-forming atoms, and still further preferably from 5 to 10 ring skeleton-forming atoms. Examples of the heteroaryl group include a 2-thienyl group, a 3-thienyl group, a 2-furyl group, a 3-furyl group, a 2-pyridyl group, a 3-pyridyl group, a 4-pyridyl group, a 2-pyrazinyl group, a 2-quinolyl group, a 3-quinolyl group, a 4-quinolyl group, a 1-isoquinolyl group and a 3-isoquinolyl group. Other examples of the heteroaryl group include a benzofuryl group, a pyrrolyl group, an indolyl group, an isoindolyl group, an azaindolyl group, a benzothienyl group, a pyridyl group, a quinolinyl group, an isoquinolyl group, an imidazolyl group, a benzimidazolyl group, a pyrazolyl group, an oxazolyl group, an isoxazolyl group, a benzoxazolyl group, a thiazolyl group, a benzothiazolyl group, an isothiazolyl group, a pyridazinyl group, a pyrimidinyl group, a pyrazinyl group, a triazinyl group, a cinnolinyl group, a phthalazinyl group and a quinazolinyl group. The heteroaryl group may be substituted. Examples of the substituent in this case include an alkyl group, an alkoxy group, an aryl group, an aryloxy group, a hydroxyl group, a halogen atom, a nitro group, a diarylamino group (including a 9-carbazolyl group) and a cyano group, and preferred are an alkyl group, an alkoxy group, an aryl group, and an aryloxy group.

For the alkyl moiety of the alkoxy group referred in the present application, reference may be made to the description for the alkyl group.

For the aryl moiety of the aryloxy group referred in the present application, reference may be made to the description for the aryl group.

The halogen atom referred in the present application is preferably a fluorine atom, a chlorine atom, a bromine atom or an iodine atom.

Compound Represented by the Formula (1)

The compound of the invention has a structure represented by the following formula (1):

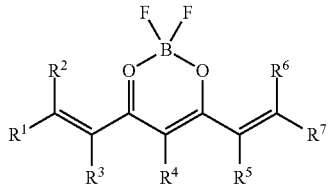

wherein $R^1$ to $R^6$ each independently represent a hydrogen atom or a substituent; $R^1$ and $R^2$, $R^2$ and $R^3$, $R^3$ and $R^4$, $R^4$ and $R^5$, $R^5$ and $R^6$ and $R^6$ and $R^7$ may be taken together to form a ring; and $R^7$ represents a group represented by the following formula (2) or formula (3):

Formula (2)

wherein $Ar^{11}$ represents an aryl group or an aryl-substituted aryl group; $R^{11}$ represents a substituent other than an aryl group; n11 represents an integer of from 1 to the number of substitutable positions in $Ar^{11}$; when n is 2 or more, then each $R^{11}$ may be the same or different; and at least one $R^{11}$ is an electron-donating group;

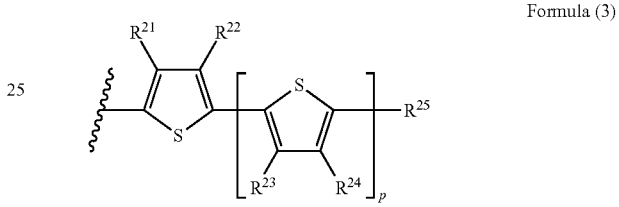

Formula (3)

wherein $R^{21}$ to $R^{25}$ each independently represent a hydrogen atom or a substituent; and p is an integer of from 0 to 2.

$R^1$ to $R^6$ in the formula (1) each independently represent a hydrogen atom or a substituent. The substituent for $R^1$ to $R^6$ are preferably a substituted or unsubstituted alkyl group, a substituted or unsubstituted aryl group, a substituted or unsubstituted heteroaryl group, a substituted or unsubstituted alkoxycarbonyl group, a substituted or unsubstituted aryloxycarbonyl group and a halogen atom. In a preferable embodiment, $R^1$ is a substituent, $R^2$, $R^3$, $R^5$ and $R^6$ are a hydrogen atom, and $R^4$ is a hydrogen atom or a substituent. In a more preferable embodiment, $R^1$ is a substituted or unsubstituted aryl group or a substituted or unsubstituted heteroaryl group, $R^2$, $R^3$, $R^5$ and $R^6$ are a hydrogen atom, and $R^4$ is a hydrogen atom, a substituted or unsubstituted alkyl group, a substituted or unsubstituted aryl group, a substituted or unsubstituted heteroaryl group, a substituted or unsubstituted alkoxycarbonyl group, a substituted or unsubstituted aryloxycarbonyl group, a halogen atom, or a group containing a boron difluoride diketonate ring. The boron difluoride diketonate ring is represented by the following formula:

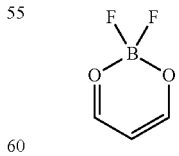

In the formula (1), $R^1$ and $R^2$, $R^2$ and $R^3$, $R^3$ and $R^4$, $R^4$ and $R^5$, $R^5$ and $R^6$ and $R^6$ and $R^7$ may be taken together to be an atomic group that is required for forming a ring. $R^1$ and $R^2$, $R^2$ and $R^3$, $R^3$ and $R^4$, $R^4$ and $R^5$, $R^5$ and $R^6$ and $R^6$ and $R^7$ are taken together to be preferably a substituted or unsubstituted alkylene group, a substituted or unsubstituted alkenylene group, or a substituted or unsubstituted alkynylene group, more preferably a substituted or unsubstituted alkylene group or a substituted or unsubstituted alkenylene group, and further preferably a substituted or unsubstituted alkylene group. Examples of the substituent that may be substituted on the alkylene, alkenylene or alkynylene group include an alkyl group, an alkoxy group, an aryl group, and an aryloxy group. $R^1$ and $R^2$, $R^2$ and $R^3$, $R^3$ and $R^4$, $R^4$ and $R^5$, $R^5$ and $R^6$ and $R^6$ and $R^7$ are taken together to form a ring having from 4 to 10 ring skeleton-forming atoms, more preferably a ring having from 5 to 8 ring skeleton-forming atoms, further preferably a ring having from 5 to 7 ring skeleton-forming atoms. Examples of the ring include a cyclopentane ring, a cyclohexane ring and a cycloheptane ring.

$R^7$ in the formula (1) may be a group represented by the following formula (2):

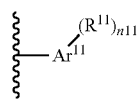

Formula (2)

$Ar^{11}$ in the formula (2) represents an aryl group or an aryl-substituted aryl group. Examples of the aryl group include a phenyl group, a 1-naphthyl group, a 2-naphthyl group, a 1-anthranyl group, a 2-anthranyl group and a 9-anthranyl group, and preferred are a phenyl group, a 1-naphthyl group and a 2-naphthyl group. Examples of the aryl-substituted aryl group include a biphenyl-2-yl group, a biphenyl-3-yl group, a biphenyl-4-yl group, a para-terhenyl-2-yl group, a para-terhenyl-3-yl group, a para-terhenyl-4-yl group, a meta-terhenyl-2-yl group, a meta-terhenyl-3-yl group and a meta-terhenyl-4-yl group, and preferred are a biphenyl-3-yl group and a biphenyl-4-yl group. Two or more aromatic rings in the aryl-substituted aryl group may be bonded to each other via a direct bond or a linking group such as a substituted or unsubstituted methylene group to form an additional ring.

$R^{11}$ in the formula (2) represents a substituent other than an aryl group. Examples of the substituent include a halogen atom, an alkyl group, an alkenyl group, an alkynyl group, an aryl group, a heteroaryl group, a halogen atom, a hydroxyl group, a nitro group, a carboxyl group, a cyano group, an alkoxy group, an aryloxy group, an acyl group, an acyloxy group, a carbamoyloxy group (including an alkoxycarbonyloxy group), a primary amino group, an alkylamino group, an arylamino group, a dialkylamino group, a diarylamino group, an alkylarylamino group, an acylamino group, an aminocarbonylamino group, an alkoxycarbonylamino group, an aryloxycarbonylamino group, a sulfamoylamino group, an alkylsulfonylamino group, an arylsulfonylamino group, an alkylthio group, an arylthio group, a sulfo group, a sulfamoyl group, an alkylsulfinyl group, arylsulfinyl group, an alkylsulfonyl group, arylsulfonyl group, an alkoxycarbonyl group, an aryloxycarbonyl group, a carbamoyl group, an imido group, an alkoxysulfonyl group, an aryloxysulfonyl group, a trialkylsilyl group, and a trialkylsilyloxy group. These groups may be further substituted.

n11 in the formula (2) represents an integer of from 1 to the number of substitutable positions in $Ar^{11}$. n11 is preferably from 1 to 3, more preferably 1 or 2. When n is 2 or more, then each $R^{11}$ may be the same or different. At least one $R^{11}$ is an electron-donating group. In the present application, the electron-donating group means a substituent having a Hammett $\sigma_p$ value of less than 0. The electron-donating group is preferably a substituent having a Hammett $\sigma_p$ value of less than −0.1, more preferably a substituent having a Hammett $\sigma_p$ value of less than −0.2. The Hammett $\sigma_p$ value is calculated by the following expression (I):

$$\sigma_p = \log K_X - \log K_H \qquad \text{Expression (I)}$$

wherein $K_H$ represents an ionization constant of benzoic acid in water at 25° C., and $K_X$ represents an ionization constant of benzoic acid having a substituent at the para position thereof in water at 25° C. Examples of the electron-donating group include a hydroxyl group, an alkoxy group, a cyano group, a primary amino group, an alkylamino group, an arylamino group, a dialkylamino group, a diarylamino group, an alkylarylamino group, an acylamino group, an aminocarbonylamino group, an alkoxycarbonylamino group, a trialkylsilyl group, and a trialkylsilyloxy group.

$R^7$ in the formula (1) may be a group represented by the following formula (3):

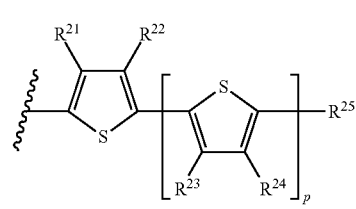

Formula (3)

$R^{21}$ to $R^{25}$ in the formula (3) each independently represent a hydrogen atom or a substituent. For the substituent as $R^{21}$ to $R^{25}$, reference may be made to the description for the substituent as $R^{11}$ in the formula (2). Preferable examples of the substituent as $R^{21}$ to $R^{24}$ include an alkyl group, an aryl group and a heteroaryl group, and more preferred is an alkyl group. Preferable examples of the substituent as $R^{25}$ include an alkenyl group, an alkynyl group, an aryl group and a heteroaryl group, and more preferred is an alkenyl group. These alkyl, aryl, heteroaryl, alkenyl and alkynyl group may be substituted further. In a preferable embodiment of the formula (3), $R^{21}$ to $R^{24}$ are independently a hydrogen atom or an alkyl group and $R^{25}$ is a substituent. In more preferable embodiment of the formula (3), $R^{21}$ to $R^{24}$ are independently a hydrogen atom and $R^{25}$ is a substituted or unsubstituted alkenyl group.

p in the formula (3) is an integer of from 0 to 2.

The formula (1) preferably includes the compounds represented by the following formula (11):

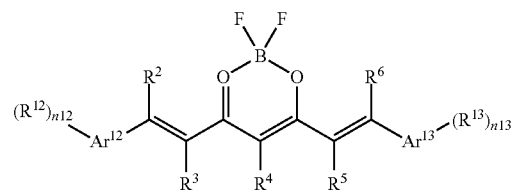

$Ar^{12}$ and $Ar^{13}$ in the formula (11) each independently represent an aryl group or an aryl-substituted aryl group. For the aryl-substituted aryl group, reference may be made to the description for the aryl-substituted aryl group as $Ar^{11}$ in the formula (2).

$R^2$ to $R^6$ each independently represent a hydrogen atom or a substituent. $R^{12}$ and $R^{13}$ each independently represent a substituent. $R^3$ and $R^4$, and $R^4$ and $R^5$ may be taken together to form a ring. $R^2$ may be bonded to $Ar^{12}$ to form a ring and $R^6$ may be bonded to $Ar^{13}$ to form a ring. n12 represents an integer of from 1 to the number of substitutable positions in $Ar^{12}$. When n12 is 2 or more, then each $R^{12}$ may be the same or different. At least one $R^{12}$ is an electron-donating group. n13 represents an integer of from 1 to the number of substitutable positions in $Ar^{13}$. When n13 is 2 or more, then each $R^{13}$ may be the same or different. At least one $R^{13}$ is an electron-donating group. n12 and n13 are preferably from 1 to 3, more preferably 1 or 2.

For the substituent as $R^2$ to $R^6$ in the formula (11), reference may be made to the description for the substituent as $R^2$ to $R^6$ in the formula (1). For the substituent and the electron-donating group as $R^{12}$ to $R^{13}$ in the formula (11), reference may be made to the description for the substituent and the electron-donating group as $R^{11}$ in the formula (2). For the ring that $R^3$ and $R^4$, $R^4$ and $R^5$, $R^2$ and $Ar^{12}$, or $R^6$ and $Ar^{13}$ are taken together to form, reference may be made to the description for the ring in the formula (1). As the electron-donating group for $R^{12}$ and $R^{13}$, a diarylamino group is preferable. Examples of the diarylamino group include a diphenylamino group, a di(1-naphthyl)amino group, a di(2-naphthyl)amino group and 9-carbazolyl group. The diarylamino group may be substituted. Examples of the substituent in this case include an alkyl group, an alkoxy group, an aryl group, an aryloxy group, and a diarylamino group (including a 9-carbazolyl group).

In a first preferable embodiment of the formula (11), $Ar^{12}$ and $Ar^{13}$ each independently has a benzene structure, a naphthalene structure, an anthrathene structure or a fluorene structure.

In a second preferable embodiment of the formula (11), $Ar^{12}$ and $Ar^{13}$ are each independently a substituted or unsubstituted phenyl group, a substituted or unsubstituted 1-naphthyl group, a substituted or unsubstituted 2-naphthyl group, a substituted or unsubstituted biphenyl-2-yl group, a substituted or unsubstituted biphenyl-3-yl group or a substituted or unsubstituted biphenyl-4-yl group. The two benzene rings in the biphenyl-2-yl group, the biphenyl-3-yl group and the biphenyl-4-yl group may be bonded to each other via a direct bond or a linking group such as a substituted or unsubstituted methylene group.

In a third preferable embodiment of the formula (11), at least one $R^{12}$ and at least one $R^{13}$ are a substituted or unsubstituted diarylamino group.

In a fourth preferable embodiment of the formula (11), all $R^{12}$ and all $R^{13}$ are a substituted or unsubstituted diarylamino group.

In a fifth preferable embodiment of the formula (11), $R^1$ is a substituted or unsubstituted aryl group or a substituted or unsubstituted heteroaryl group, $R^2$, $R^3$, $R^5$ and $R^6$ are a hydrogen atom, and $R^4$ is a hydrogen atom, a substituted or unsubstituted alkyl group, a substituted or unsubstituted aryl group, a substituted or unsubstituted heteroaryl group, a substituted or unsubstituted alkoxycarbonyl group, a substituted or unsubstituted aryloxycarbonyl group, a halogen atom, or a group containing a boron difluoride diketonate ring.

In a sixth preferable embodiment of the formula (11), $R^2$, $R^3$, $R^5$ and $R^6$ are a hydrogen atom.

In a seventh preferable embodiment of the formula (11), $R^3$ and $R^4$, or $R^3$ and $R^5$ are taken together to form a ring.

In an eighth preferable embodiment of the formula (11), $R^3$ and $R^5$, $R^2$ and $R^6$, $Ar^{12}$ and $Ar^{13}$, $R^{12}$ and $R^{13}$ are the same.

The formula (11) preferably includes the compounds represented by the following formula (12):

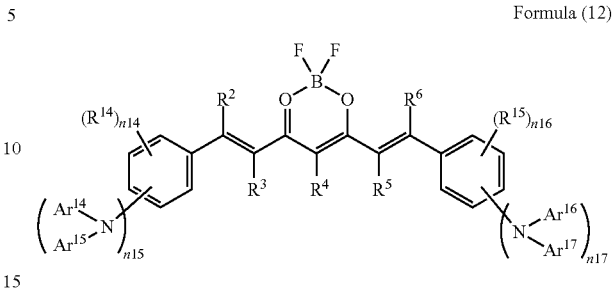

Formula (12)

$Ar^{14}$ to $Ar^{17}$ in the formula (12) each independently represent a substituted or unsubstituted aryl group. $Ar^{14}$ and $Ar^{15}$, or $Ar^{16}$ and $Ar^{17}$ may be bonded to each other via a direct bond or a linking group such as a substituted or unsubstituted methylene group to form a ring. Examples of —N($Ar^{14}$)($Ar^{15}$) and —N($Ar^{16}$)($Ar^{17}$) include a substituted or unsubstituted diphenylamino group, a substituted or unsubstituted di(1-naphthyl)amino group, a substituted or unsubstituted di(2-naphthyl)amino group, and a substituted or unsubstituted 9-carbazolyl group.

$R^2$ to $R^6$ each independently represent a hydrogen atom or a substituent. For the substituent as $R^2$ to $R^6$ in the formula (12), reference may be made to the description for the substituent as $R^2$ to $R^6$ in the formula (1).

$R^{14}$ and $R^{15}$ each independently represent a substituent other than a substituted or unsubstituted diarylamino group. For the substituent as $R^{14}$ and $R^{15}$, reference may be made to the description for the substituent as $R^{11}$ in the formula (2). Preferred are a substituted or unsubstituted alkyl group, a substituted or unsubstituted alkoxy group, a substituted or unsubstituted aryl group, a substituted or unsubstituted aryloxy group, and a substituted or unsubstituted heteroaryl group.

$R^{14}$ and $R^2$, $R^3$ and $R^4$, $R^4$ and $R^5$, and $R^6$ and $R^{15}$ may be taken together to form a ring. For the ring in the case, reference may be made to the description for the ring in the formula (1).

n14 and n16 each independently represent an integer of 0 or more, preferably 0 or 1. n15 and n17 each independently represent an integer of 1 or more, preferably from 1 to 3. n14+n15 is an integer of from 1 to 5 and n16+n17 is an integer of from 1 to 5. When n14 is 2 or more, then each $R^{14}$ may be the same or different. When n15 is 2 or more, then each $Ar^{14}$ may be the same or different and each $Ar^{15}$ may be the same or different. When n16 is 2 or more, then each $R^{15}$ may be the same or different. When n17 is 2 or more, then each $Ar^{16}$ may be the same or different and each $Ar^{17}$ may be the same or different.

The formula (1) includes the compounds represented by the following formula (21):

Formula (21)

$R^2$ to $R^6$ and $R^{2'}$ to $R^{6'}$ in the formula (21) each independently represent a hydrogen atom or a substituent.

$R^{31}$ and $R^{32}$ each independently represent one of the Group A below.

$R^{31}$ and $R^2$, $R^3$ and $R^4$, $R^4$ and $R^5$, $R^{32}$ and $R^{2'}$, $R^{3'}$ and $R^{4'}$, and $R^{4'}$ and $R^{5'}$ may be taken together to form a ring; $R^6$ may be bonded to A to form a ring and $R^7$ may be bonded to A to form a ring. For the ring in the case, reference may be made to the description for the ring in the formula (1).

A represents a linking group represented by the following formula (22) or (24):

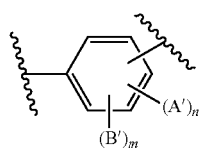

Formula (22)

n in the formula (22) is an integer of from 0 to 4. m is 0 or 1. A' represents an alkoxy group having 1 to 12 carbon atoms and B' represents a group represented by the following formula (23):

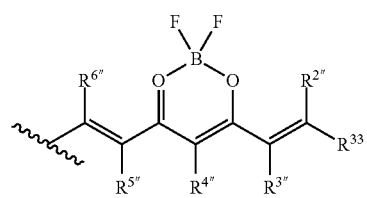

Formula (23)

$R^{2''}$ to $R^{6''}$ in the formula (23) each independently represent a hydrogen atom or a substituent and $R^{33}$ represents one of the Group A below.

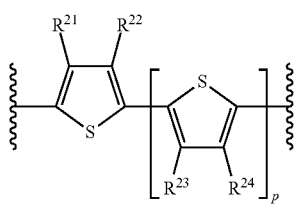

Formula (24)

$R^{21}$ to $R^{24}$ in the formula (24) each independently represent a hydrogen atom or a substituent; and p is an integer of from 0 to 2;

Group A

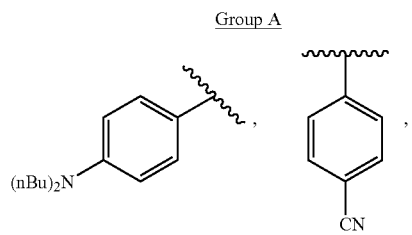

-continued

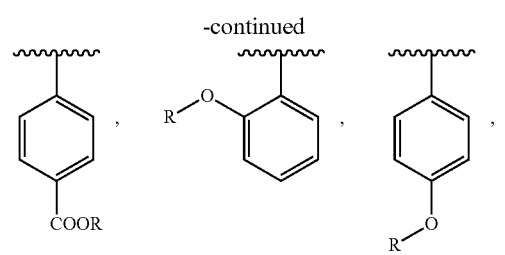

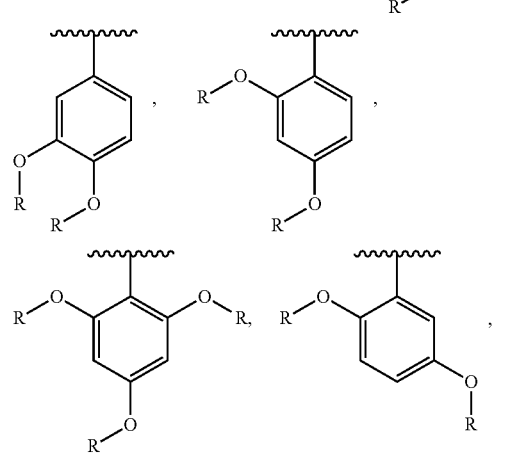

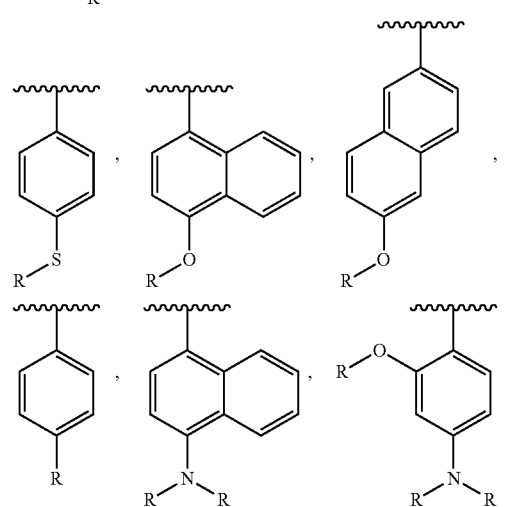

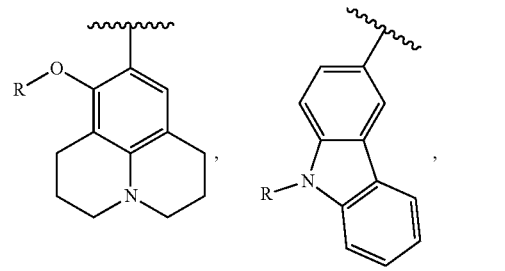

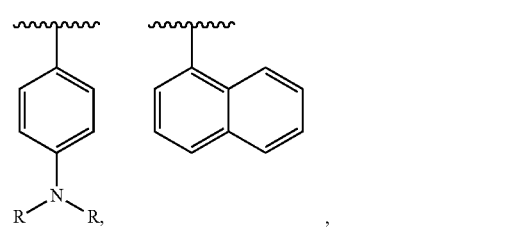

-continued

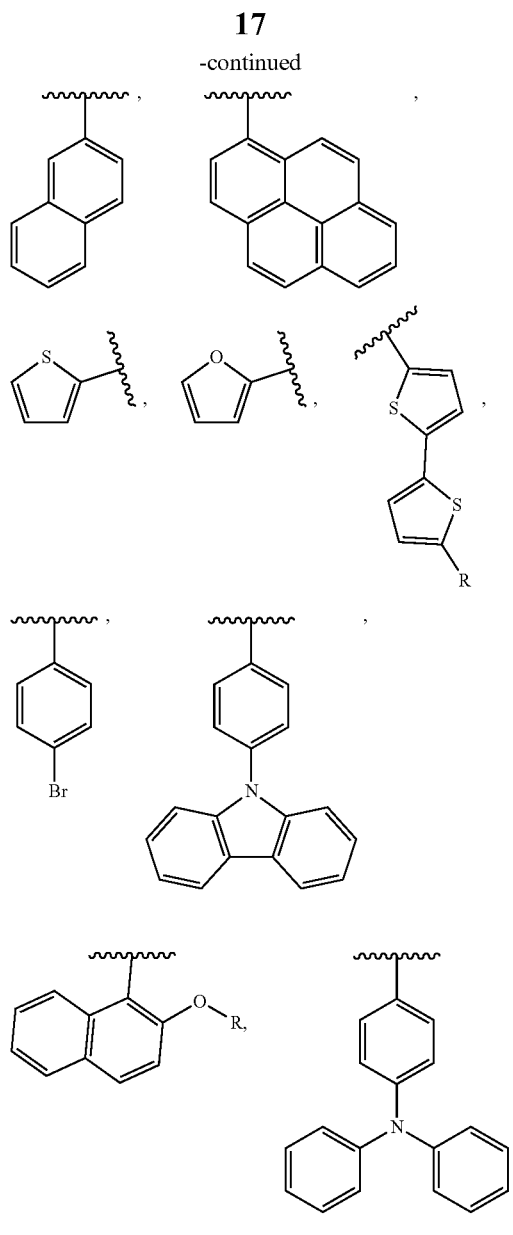

wherein each R independently represents a hydrogen atom, a substituted or unsubstituted alkyl group having 1 to 12 carbon atoms, a substituted or unsubstituted aryl group having 6 to 10 carbon atoms, or a substituted or unsubstituted heteroaryl group; and nBu represents a normal butyl group.

Among the Group A, the substituents in the following Group B are preferable:

Group B

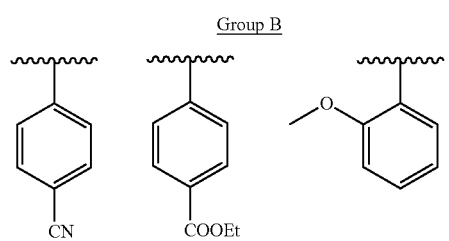

-continued

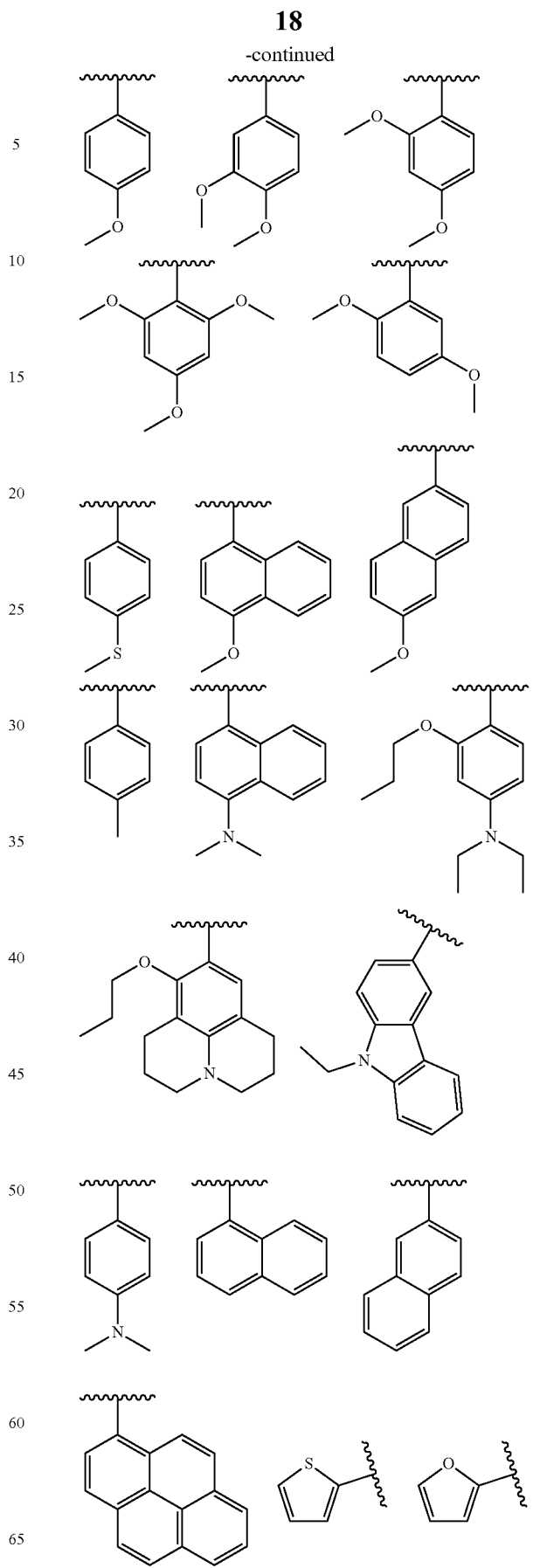

-continued

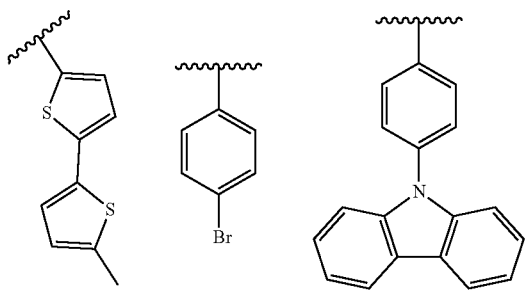

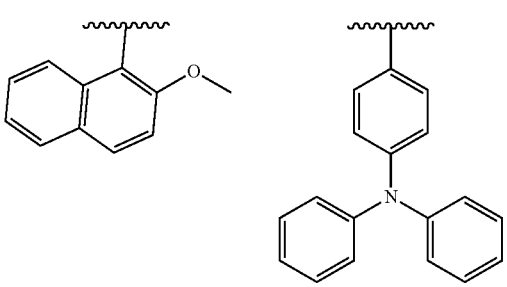

wherein Et represents an ethyl group.

Among the Group A, the substituents in the following Group C are also preferable:

Group C

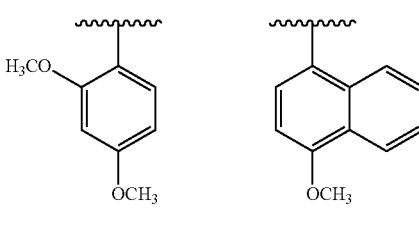

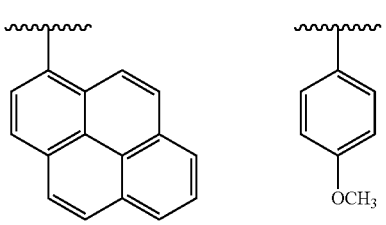

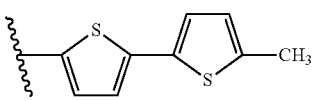

-continued

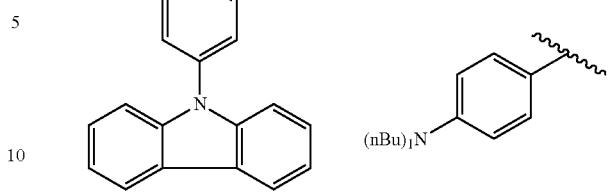

wherein nBu represents a normal butyl group.

For the substituent as $R^2$ to $R^6$ and $R^{2'}$ to $R^{6'}$ in the formula (21) and $R^{2''}$ to $R^{6'''}$ in the formula (23), reference may be made to the description for the substituent as $R^2$ to $R^6$ in the formula (1).

In a first preferable embodiment of the formula (21), A is an ortho-phenylene group represented by the formula (22). Preferably, $R^{31}$, $R^{32}$ and $R^{33}$ are each independently one of the Group B above.

In a second preferable embodiment of the formula (21), A is an ortho-phenylene group represented by the formula (22), m is 0, n is 0, and $R^{31}$ and $R^{32}$ are each independently one of the Group C above.

In a third preferable embodiment of the formula (21), A is a meta-phenylene group represented by the formula (22). Preferably, $R^{31}$, $R^{32}$ and $R^{33}$ are each independently one of the Group B above.

In a fourth preferable embodiment of the formula (21), A is a meta-phenylene group represented by the formula (22), and $R^{31}$, $R^{32}$ and $R^{33}$ are each independently one of the Group C above.

In a fifth preferable embodiment of the formula (21), A is a meta-phenylene group represented by the formula (22), m is 0, and $R^{31}$ and $R^{32}$ are each independently one of the Group C above. n is preferably 3.

In a sixth preferable embodiment of the formula (21), A is a para-phenylene group represented by the formula (22). Preferably, $R^{31}$, $R^{32}$ and $R^{33}$ are each independently one of the Group B above.

In a seventh preferable embodiment of the formula (21), A is a para-phenylene group represented by the formula (22), and $R^{31}$, $R^{32}$ and $R^{33}$ are each independently one of the Group C above.

In an eighth preferable embodiment of the formula (21), A is a para-phenylene group represented by the formula (22), m is 0, and $R^{31}$ and $R^{32}$ are each independently one of the Group C above. A' is preferably an alkoxy group having 1 to 8 carbon atoms.

In a ninth preferable embodiment of the formula (21), A is a linking group represented by the formula (24). Preferably, $R^{31}$ and $R^{32}$ are each independently one of the Group B above.

In a tenth preferable embodiment of the formula (21), A is a linking group represented by the formula (24), and $R^{31}$ and $R^{32}$ are each independently one of the Group C above.

In an eleventh preferable embodiment of the formula (21), $R^2$ and $R^{2'}$, $R^3$ and $R^{3'}$, $R^4$ and $R^{4'}$, $R^5$ and $R^{5'}$, $R^6$ and $R^{6'}$, and $R^{31}$ and $R^{32}$ are the same.

Specific examples of the compounds represented by the formula (1) shown below. However, the compounds represented by the formula (1) capable of being used in the invention are not limited to the specific examples.

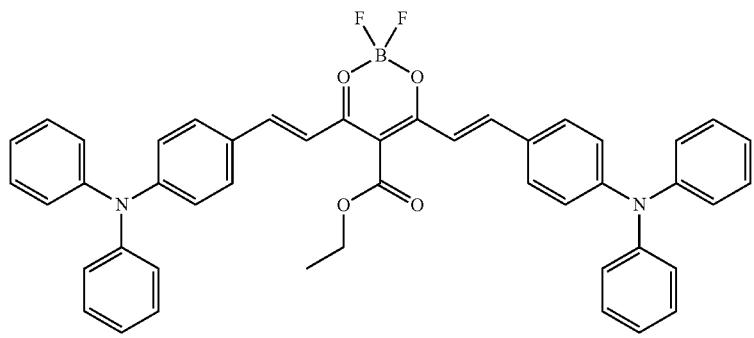
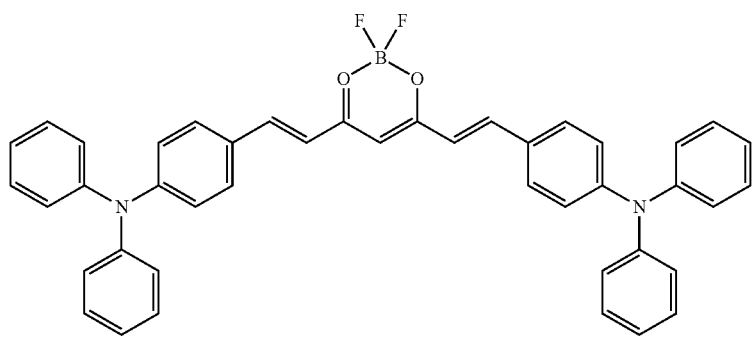
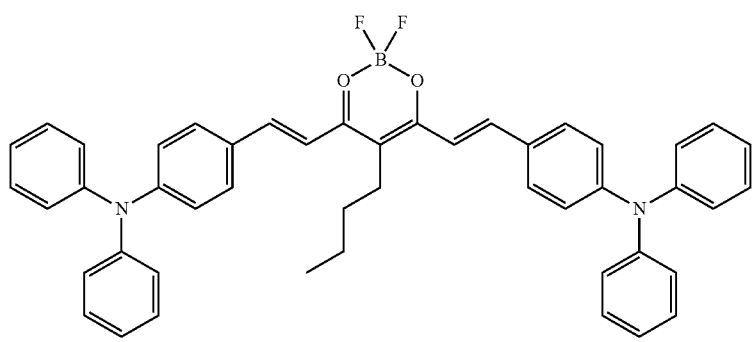
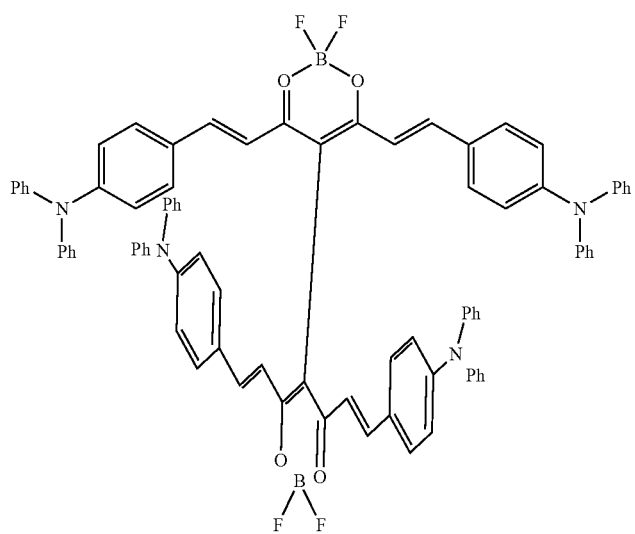

-continued
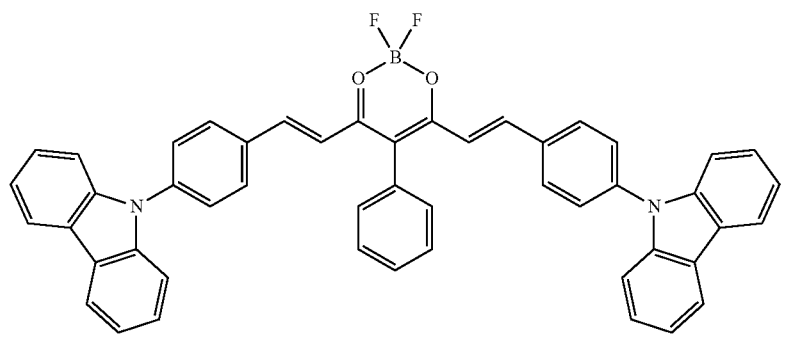
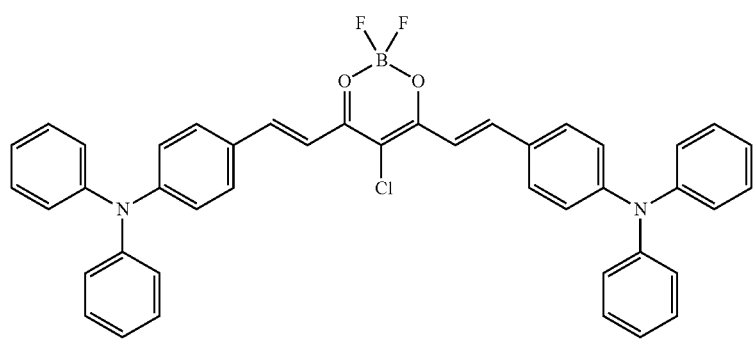
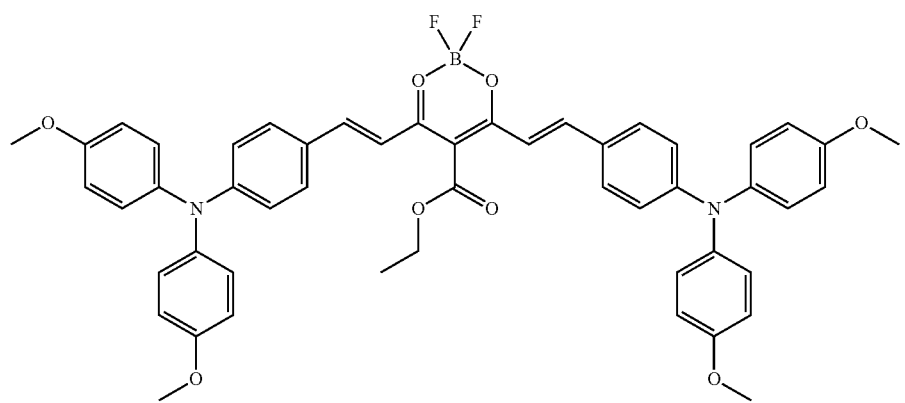
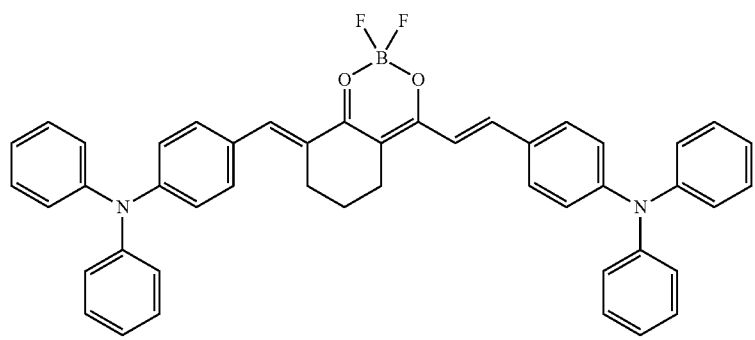

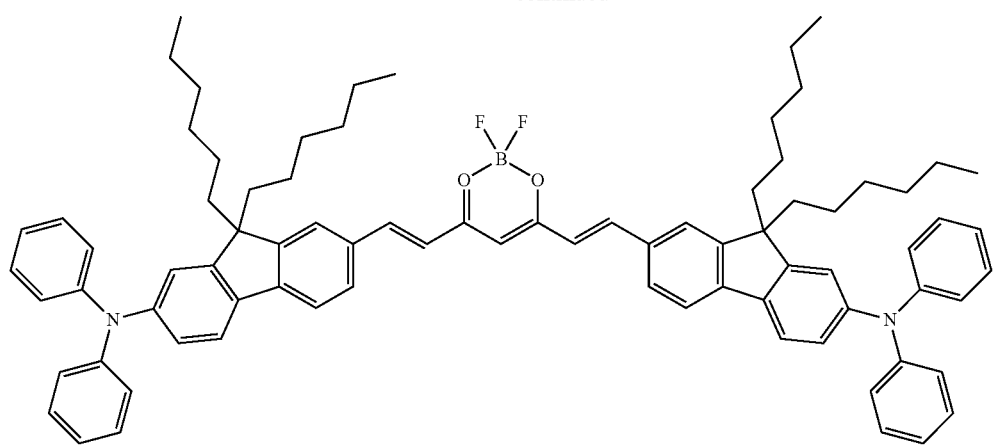
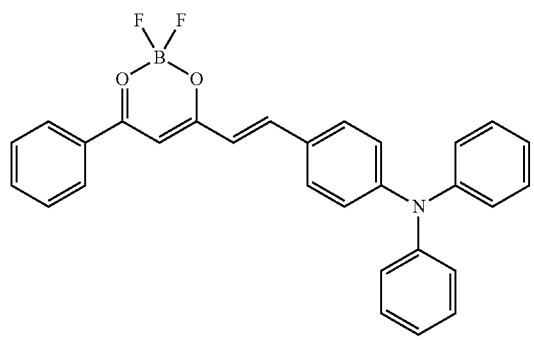
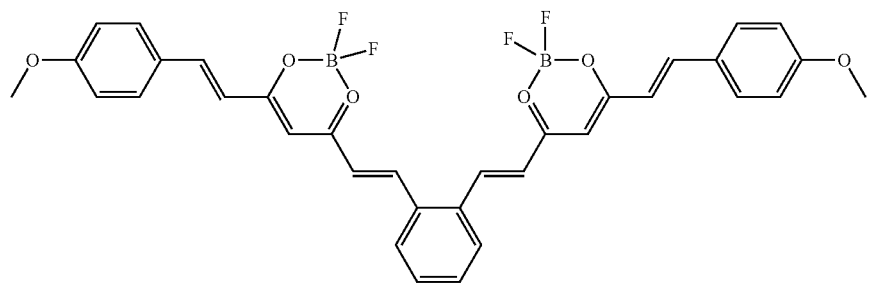
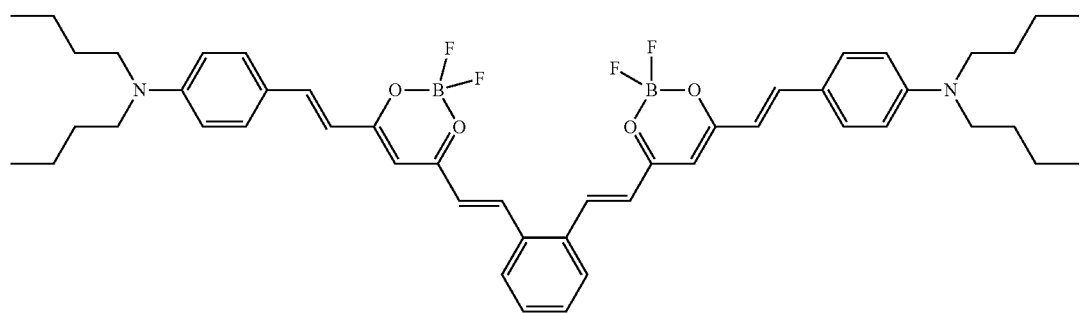

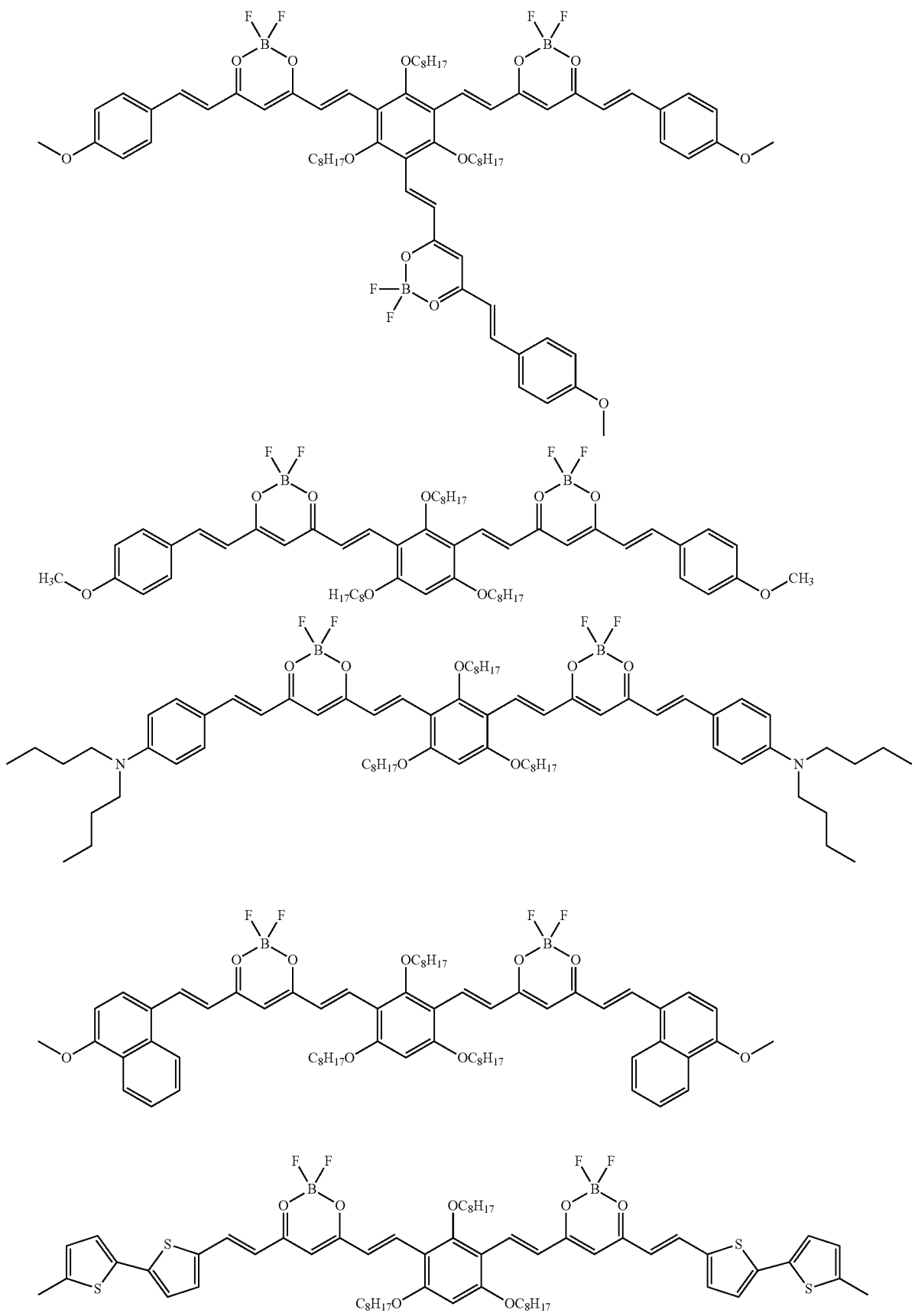

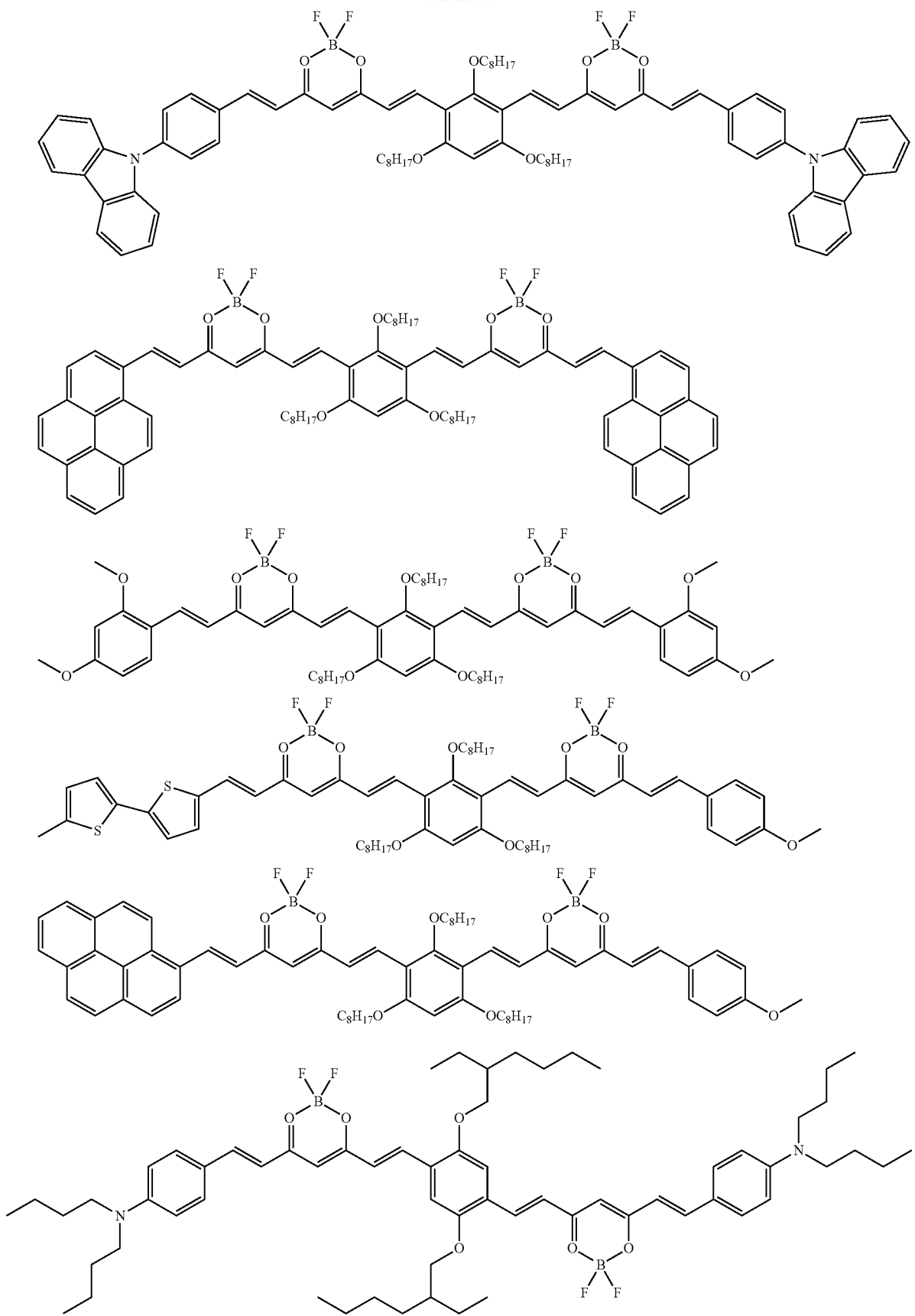

-continued
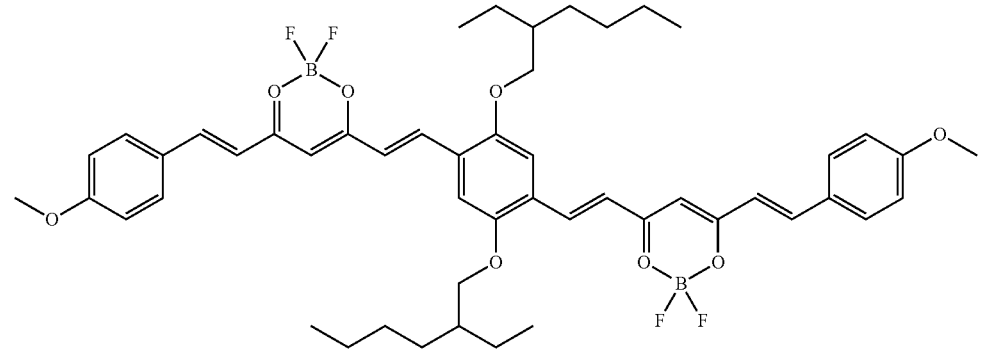
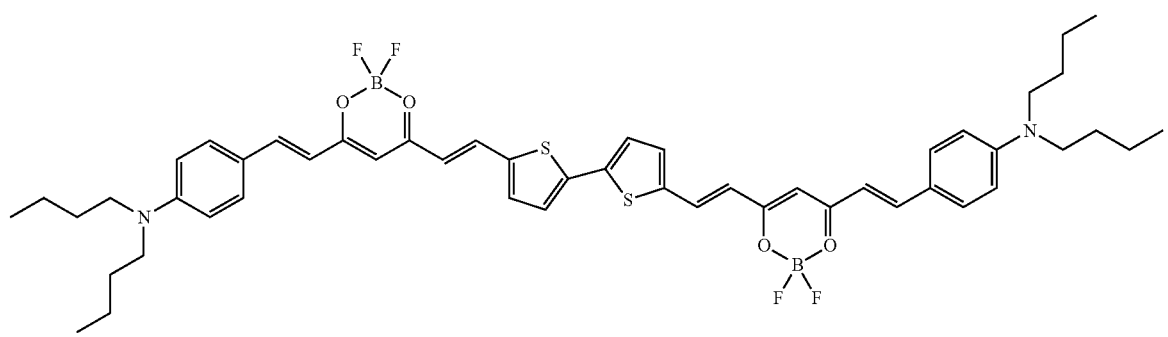
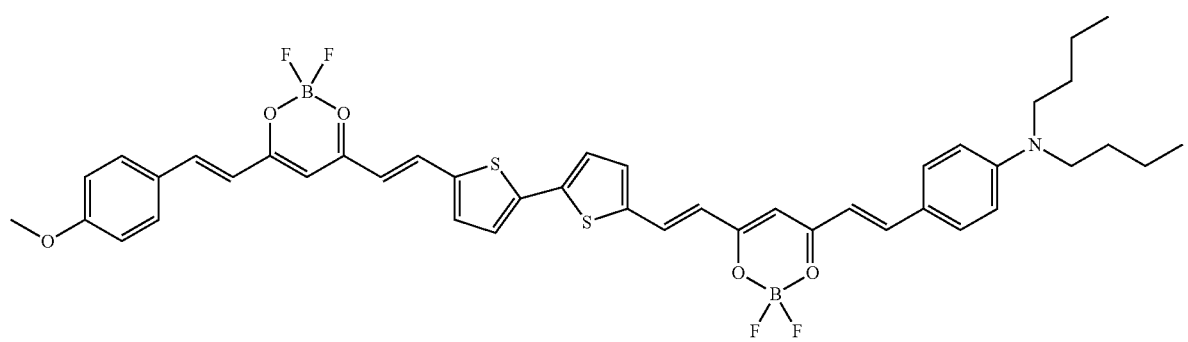
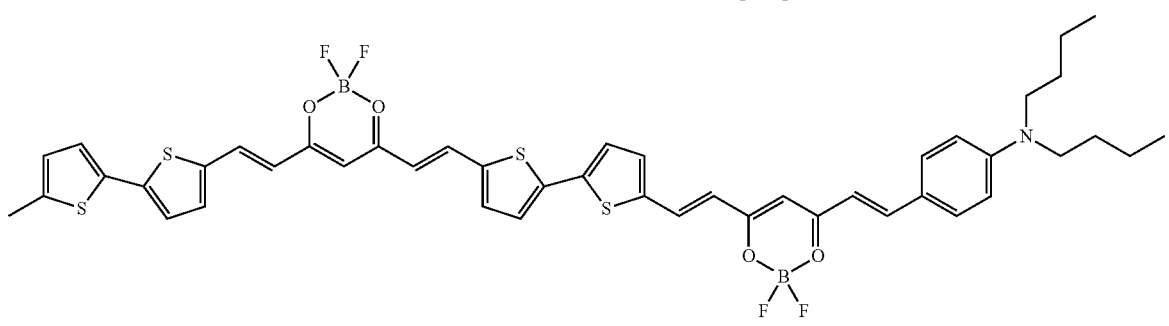
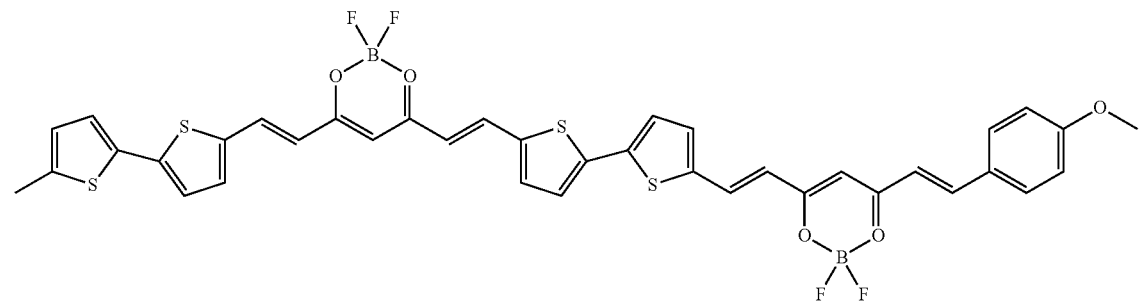

The molecular weight of the compound represented by the formula (1) is preferably 1,500 or less, more preferably 1,200 or less, further preferably 1,000 or less, and still further preferably 800 or less, for example, in the case where an organic layer containing the compound represented by the formula (1) is intended to be formed as a film by a vapor deposition method. The lower limit of the molecular weight is the molecular weight of the smallest compound represented by the formula (1).

The compound represented by the formula (1) may be formed into a film by a coating method irrespective of the molecular weight thereof. The compound that has a relatively large molecular weight may be formed into a film by a coating method.

As an application of the invention, a compound that contains plural structures each represented by the formula (1) in the molecule may be used as a light-emitting material.

For example, it may be considered that a polymerizable group is introduced in advance to the structure represented by the formula (1), and a polymer obtained by polymerizing the polymerizable group is used as a light-emitting material. Specifically, it may be considered that a monomer that has a polymerizable functional group at any of $R^1$ to $R^7$ in the formula (1) is prepared, and is homopolymerized or copolymerized with another monomer to prepare a polymer containing repeating units, and the polymer is used as a light-emitting material. In alternative, it may be considered that the compounds containing a structure represented by the formula (1) are reacted to form a dimer or a trimer, and the dimer or the trimer is used as a light-emitting material.

Examples of the polymer having the repeating unit containing the structure represented by the formula (1) include a polymer containing a structure represented by the following formula (31) or (32).

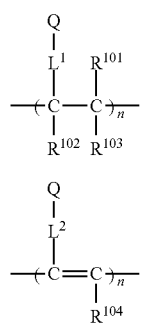

Formula (31)

Formula (32)

In the formulae (31) and (32), Q represents a group containing the structure represented by the formula (1), and $L^1$ and $L^2$ each represent a linking group. The linking group preferably has from 0 to 20 carbon atoms, more preferably from 1 to 15 carbon atoms, and further preferably from 2 to 10 carbon atoms. The linking group preferably has a structure represented by $-X^{11}-L^{11}-$, wherein $X^{11}$ represents an oxygen atom or a sulfur atom, and preferably an oxygen atom, and $L^{11}$ represents a linking group, preferably a substituted or unsubstituted alkylene group or a substituted or unsubstituted arylene group, and more preferably a substituted or unsubstituted alkylene group having from 1 to 10 carbon atoms or a substituted or unsubstituted phenylene group.

In the formulae (2) and (3), $R^{101}$, $R^{102}$, $R^{103}$ and $R^{104}$ each independently represent a substituent, preferably a substituted or unsubstituted alkyl group having from 1 to 6 carbon atoms, a substituted or unsubstituted alkoxy group having from 1 to 6 carbon atoms, or a halogen atom, more preferably an unsubstituted alkyl group having from 1 to 3 carbon atoms, an unsubstituted alkoxy group having from 1 to 3 carbon atoms, a fluorine atom or a chlorine atom, and further preferably an unsubstituted alkyl group having from 1 to 3 carbon atoms or an unsubstituted alkoxy group having from 1 to 3 carbon atoms.

The linking group represented by $L^1$ and $L^2$ may be bonded to any of $R^1$ to $R^7$ of the structure of the formula (1) constituting Q. Two or more of the linking groups may be boded to one group represented by Q to form a crosslinked structure or a network structure.

Specific examples of the structure of the repeating unit include structures represented by the following formulae (33) to (36).

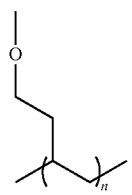

Formula (33)

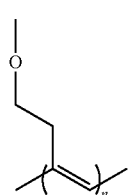

Formula (34)

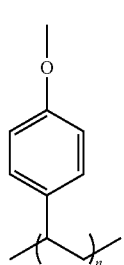

Formua (35)

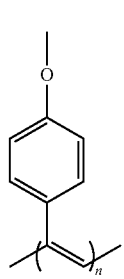

Formula (36)

The polymer having the repeating unit containing the structure represented by any of the formulae (33) to (36) may be synthesized in such a manner that a hydroxyl group is introduced to any of $R^1$ to $R^7$ of the formula (1), and the hydroxyl group as a linker is reacted with the following compound to introduce a polymerizable group thereto, followed by polymerizing the polymerizable group.

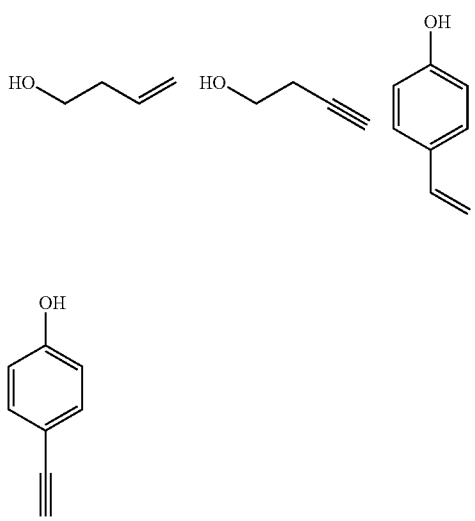

The polymer containing the structure represented by the formula (1) in the molecule may be a polymer containing only a repeating unit having the structure represented by the formula (1), or a polymer further containing a repeating unit having another structure. The repeating unit having the structure represented by the formula (1) contained in the polymer may be only one kind or two or more kinds. Examples of the repeating unit that does not have the structure represented by the formula (1) include a repeating unit derived from a monomer that is used for ordinary copolymerization. Examples of the repeating unit include a repeating unit derived from a monomer having an ethylenic unsaturated bond, such as ethylene and styrene.

Synthesis of Compound Represented by Formula (1)

The compounds represented by the formula (1) can be synthesized by known reactions. For example, they may be synthesized by the following reaction scheme:

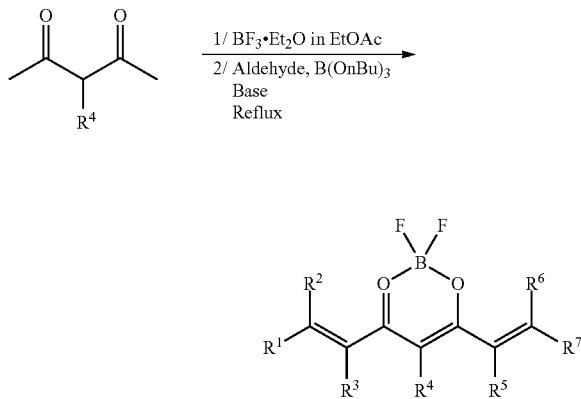

In the reaction scheme, $R^1$ to $R^7$ are as defined in the formula (1). When $R^2$, $R^3$, $R^5$ and $R^6$ are hydrogen atoms, then the aldehyde used in the second step is represented by $R^1$CHO or $R^7$CHO. A mixture of $R^1$CHO and $R^7$CHO can be used. The reaction conditions may be appropriately determined. For the details of the reactions, reference may be made to the synthesis examples described later.

For another example, the compounds represented by the formula (21) among the compounds of the formula (1) may be synthesized by the reactions described in G. Mann, L. Beyer and A. Arrieta, *Z. Chem.*, 1987, 27, 172-173 or in *J. Med. Chem.* 2006, 49, 6111-6119, as shown below:

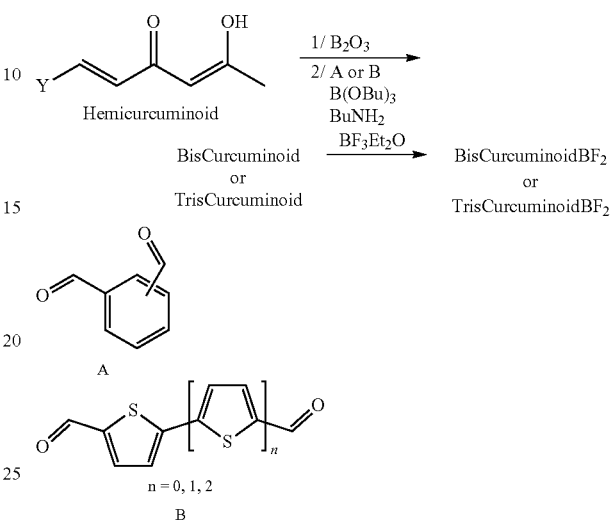

In the reaction scheme, Y is a group in Group A above.

Organic Electroluminescent Device

The compound represented by the formula (1) of the invention is useful as a light-emitting material of an organic electroluminescent device. Accordingly, the compound represented by the formula (1) of the invention may be effectively used as a light-emitting material in a light-emitting layer of an organic electroluminescent device. The compound represented by the formula (1) includes a delayed fluorescent material emitting delayed fluorescent light. Thus, the invention provides an invention relating to a delayed fluorescence emitter having the structure represented by the formula (1), an invention relating to the use of the compound represented by the formula (1) as a fluorescence emitter, and an invention relating to a method for emitting delayed fluorescent light with the compound represented by the formula (1). An organic electroluminescent device that uses the compound as a light-emitting material has features that the device emits delayed fluorescent light and has a high light emission efficiency. The principle of the features may be described as follows:

In an organic electroluminescent device, carriers are injected from an anode and a cathode to a light-emitting material to form an excited state for the light-emitting material, with which light is emitted. In the case of a carrier injection type organic electroluminescent device, in general, excitons that are excited to the excited singlet state are 25% of the total excitons generated, and the remaining 75% thereof are excited to the excited triplet state. Accordingly, the use of phosphorescence, which is light emission from the excited triplet state, provides a high energy utilization. However, the excited triplet state has a long lifetime and thus causes saturation of the excited state and deactivation of energy through mutual action with the excitons in the excited triplet state, and therefore the quantum yield of phosphorescence may be often not high. A delayed fluorescent emitter emits fluorescent light through the mechanism that the energy of excitons transits to the excited triplet state through intersystem crossing or the like, and then transits to the excited singlet state through reverse intersystem crossing due to triplet-triplet annihilation or absorption of thermal energy, thereby emitting fluorescent light. It is considered that among the materials, a thermal activation type delayed fluorescent material emitting light through absorption of thermal energy is particularly useful for an organic electroluminescent device. In the case where a delayed fluorescent emitter is used in an organic electroluminescent device, the excitons in the excited singlet state normally emit fluorescent light. On the other hand, the excitons in the excited triplet state emit fluorescent light through intersystem crossing to the excited singlet state by absorbing the heat generated by the device. At this time, the light emitted through reverse intersystem crossing from the excited triplet state to the excited singlet state has the same wavelength as fluorescent light since it is light emission from the excited singlet state, but has a longer lifetime (light emission lifetime) than the normal fluorescent light and phosphorescent light, and thus the light is observed as fluorescent light that is delayed from the normal fluorescent light and phosphorescent light. The light may be defined as delayed fluorescent light. The use of the thermal activation type exciton transition mechanism may raise the proportion of the compound in the excited singlet state, which is generally formed in a proportion only of 25%, to 25% or more through the absorption of the thermal energy after the carrier injection. A compound that emits strong fluorescent light and delayed fluorescent light at a low temperature of lower than 100° C. undergoes the intersystem crossing from the excited triplet state to the excited singlet state sufficiently with the heat of the device, thereby emitting delayed fluorescent light, and thus the use of the compound may drastically enhance the light emission efficiency.

The use of the compound represented by the formula (1) of the invention as a light-emitting material of a light-emitting layer may provide an excellent organic light-emitting device, such as an organic photoluminescent device (organic PL device) and an organic electroluminescent device (organic EL device). At this time, the compound represented by the formula (1) of the invention may have a function of assisting light emission of another light-emitting material contained in the light-emitting layer, i.e., as a so-called assist dopant. Specifically, the compound represented by the formula (1) of the invention contained in the light-emitting layer may have a lowest excited singlet energy level that is between the lowest excited singlet energy level of the host material contained in the light-emitting layer and the lowest excited singlet energy level of the another light-emitting material contained in the light-emitting layer.

The organic electroluminescent device has a structure containing at least an anode, a cathode and an organic layer formed between the anode and the cathode. The organic layer contains at least a light-emitting layer, and may be formed only of a light-emitting layer, or may have one or more organic layers in addition to the light-emitting layer. Examples of the organic layer include a hole transporting layer, a hole injection layer, an electron barrier layer, a hole barrier layer, an electron injection layer, an electron transporting layer and an exciton barrier layer. The hole transporting layer may be a hole injection and transporting layer having a hole injection function, and the electron transporting layer may be an electron injection and transporting layer having an electron injection function. A specific structural example of an organic electroluminescent device is shown in FIG. 1. In FIG. 1, the numeral 1 denotes a substrate, 2 denotes an anode, 3 denotes a hole injection layer, 4 denotes a hole transporting layer, 5 denotes a light-emitting layer, 6 denotes an electron transporting layer, and 7 denotes a cathode.

The members and the layers of the organic electroluminescent device will be described below.

Substrate

The organic electroluminescent device of the invention is preferably supported by a substrate. The substrate is not particularly limited and may be those that have been commonly used in an organic electroluminescent device, and examples thereof which may be used include those formed of glass, transparent plastics, quartz and silicon.

Anode

The anode of the organic electroluminescent device used is preferably formed of, as an electrode material, a metal, an alloy or an electroconductive compound each having a large work function (4 eV or more), or a mixture thereof. Specific examples of the electrode material include a metal, such as Au, and an electroconductive transparent material, such as CuI, indium tin oxide (ITO), $SnO_2$ and ZnO. A material that is amorphous and is capable of forming a transparent electroconductive film, such as IDIXO ($In_2O_3$—ZnO), may also be used. The anode may be formed in such a manner that the electrode material is formed into a thin film by such a method as vapor deposition or sputtering, and the film is patterned into a desired pattern by a photolithography method, or in the case where the pattern may not require high accuracy (for example, approximately 100 μm or more), the pattern may be formed with a mask having a desired shape on vapor deposition or sputtering of the electrode material. In alternative, in the case where a material capable of being applied as a coating, such as an organic electroconductive compound, is used, a wet film forming method, such as a printing method and a coating method, may be used. In the case where emitted light is to be taken out through the anode, the anode preferably has a transmittance of more than 10%, and the anode preferably has a sheet resistance of several hundred Ohm per square or less. The thickness thereof may be generally selected from a range of from 10 to 1,000 nm, and preferably from 10 to 200 nm, while depending on the material used.

Cathode

The cathode is preferably formed of, as an electrode material, a metal having a small work function (4 eV or less) (referred to as an electron injection metal), an alloy or an electroconductive compound each having a small work function (4 eV or less), or a mixture thereof. Specific examples of the electrode material include sodium, a sodium-potassium alloy, magnesium, lithium, a magnesium-cupper mixture, a magnesium-silver mixture, a magnesium-aluminum mixture, a magnesium-indium mixture, an aluminum-aluminum oxide ($Al_2O_3$) mixture, indium, a lithium-aluminum mixture, and a rare earth metal. Among these, a mixture of an electron injection metal and a second metal that is a stable metal having a larger work function than the electron injection metal, for example, a magnesium-silver mixture, a magnesium-aluminum mixture, a magnesium-indium mixture, an aluminum-aluminum oxide ($Al_2O_3$) mixture, a lithium-aluminum mixture, and aluminum, are preferred from the standpoint of the electron injection property and the durability against oxidation and the like. The cathode may be produced by forming the electrode material into a thin film by such a method as vapor deposition or sputtering. The cathode preferably has a sheet resistance of several hundred Ohm per square or less, and the thickness thereof may be generally selected from a range of from 10 nm to 5 μm, and preferably from 50 to 200 nm. For transmitting the emitted light, any one of the anode and the cathode of the organic electroluminescent device is preferably transparent or translucent, thereby enhancing the light emission luminance.

The cathode may be formed with the electroconductive transparent materials described for the anode, thereby forming a transparent or translucent cathode, and by applying the cathode, a device having an anode and a cathode, both of which have transmittance, may be produced.

Light-Emitting Layer

The light-emitting layer is a layer, in which holes and electrons injected from the anode and the cathode, respectively, are recombined to form excitons, and then the layer emits light. A light-emitting material may be solely used as the light-emitting layer, but the light-emitting layer preferably contains a light-emitting material and a host material. The light-emitting material used may be one kind or two or more kinds selected from the group of compounds represented by the formula (1) of the invention. In order that the organic electroluminescent device of the invention exhibit a high light emission efficiency, it is important that the singlet excitons and the triplet excitons generated in the light-emitting material are confined in the light-emitting material. Accordingly, a host material is preferably used in addition to the light-emitting material in the light-emitting layer. The host material used may be an organic compound that has excited singlet energy and excited triplet energy, at least one of which is higher than those of the light-emitting material of the invention. As a result, the singlet excitons and the triplet excitons generated in the light-emitting material of the invention are capable of being confined in the molecules of the light-emitting material of the invention, thereby eliciting the light emission efficiency thereof sufficiently. Even though the singlet excitons and the triplet excitons are not confined sufficiently, a high light emission efficiency may be obtained in some cases, and thus a host material that is capable of achieving a high light emission efficiency may be used in the invention without any particular limitation. In the organic light-emitting device and the organic electroluminescent device of the invention, the light emission occurs in the light-emitting material of the invention contained in the light-emitting layer. The emitted light contains both fluorescent light and delayed fluorescent light. However, a part of the emitted light may contain emitted light from the host material, or the emitted light may partially contain emitted light from the host material.

In the case where the host material is used, the amount of the compound of the invention as the light-emitting material contained in the light-emitting layer is preferably 0.1% by weight or more, and more preferably 1% by weight or more, and is preferably 50% by weight or less, more preferably 20% by weight or less, and further preferably 10% by weight or less.

The host material in the light-emitting layer is preferably an organic compound that has a hole transporting function and an electron transporting function, prevents the emitted light from being increased in wavelength, and has a high glass transition temperature.

Injection Layer

The injection layer is a layer that is provided between the electrode and the organic layer, for decreasing the driving voltage and enhancing the light emission luminance, and includes a hole injection layer and an electron injection layer, which may be provided between the anode and the light-emitting layer or the hole transporting layer and between the cathode and the light-emitting layer or the electron transporting layer. The injection layer may be provided depending on necessity.

Barrier Layer

The barrier layer is a layer that is capable of inhibiting charges (electrons or holes) and/or excitons present in the light-emitting layer from being diffused outside the light-emitting layer. The electron barrier layer may be disposed between the light-emitting layer and the hole transporting layer, and inhibits electrons from passing through the light-emitting layer toward the hole transporting layer. Similarly, the hole barrier layer may be disposed between the light-emitting layer and the electron transporting layer, and inhibits holes from passing through the light-emitting layer toward the electron transporting layer. The barrier layer may also be used for inhibiting excitons from being diffused outside the light-emitting layer. Thus, the electron barrier layer and the hole barrier layer each may also have a function as an exciton barrier layer. The term "the electron barrier layer" or "the exciton barrier layer" referred herein is intended to include a layer that has both the functions of an electron barrier layer and an exciton barrier layer by one layer.

Hole Barrier Layer

The hole barrier layer has the function of an electron transporting layer in a broad sense. The hole barrier layer has a function of inhibiting holes from reaching the electron transporting layer while transporting electrons, and thereby enhances the recombination probability of electrons and holes in the light-emitting layer. As the material for the hole barrier layer, the materials for the electron transporting layer described later may be used depending on necessity.

Electron Barrier Layer

The electron barrier layer has the function of transporting holes in a broad sense. The electron barrier layer has a function of inhibiting electrons from reaching the hole transporting layer while transporting holes, and thereby enhances the recombination probability of electrons and holes in the light-emitting layer.

Exciton Barrier Layer

The exciton barrier layer is a layer for inhibiting excitons generated through recombination of holes and electrons in the light-emitting layer from being diffused to the charge transporting layer, and the use of the layer inserted enables effective confinement of excitons in the light-emitting layer, and thereby enhances the light emission efficiency of the device. The exciton barrier layer may be inserted adjacent to the light-emitting layer on any of the side of the anode and the side of the cathode, and on both the sides. Specifically, in the case where the exciton barrier layer is present on the side of the anode, the layer may be inserted between the hole transporting layer and the light-emitting layer and adjacent to the light-emitting layer, and in the case where the layer is inserted on the side of the cathode, the layer may be inserted between the light-emitting layer and the cathode and adjacent to the light-emitting layer. Between the anode and the exciton barrier layer that is adjacent to the light-emitting layer on the side of the anode, a hole injection layer, an electron barrier layer and the like may be provided, and between the cathode and the exciton barrier layer that is adjacent to the light-emitting layer on the side of the cathode, an electron injection layer, an electron transporting layer, a hole barrier layer and the like may be provided. In the case where the barrier layer is provided, the material used for the barrier layer preferably has excited singlet energy and excited triplet energy, at least one of which is higher than the excited singlet energy and the excited triplet energy of the light-emitting layer, respectively.

Hole Transporting Layer

The hole transporting layer is formed of a hole transporting material having a function of transporting holes, and the hole transporting layer may be provided as a single layer or plural layers.

The hole transporting material has one of injection or transporting property of holes and barrier property of electrons, and may be any of an organic material and an inorganic material. Examples of known hole transporting materials that may be used herein include a triazole derivative, an oxadiazole derivative, an imidazole derivative, a carbazole derivative, an indolocarbazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a silazane derivative, an aniline copolymer and an electroconductive polymer oligomer, particularly a thiophene oligomer. Among these, a porphyrin compound, an aromatic tertiary amine compound and a styrylamine compound are preferably used, and an aromatic tertiary amine compound is more preferably used.

Electron Transporting Layer

The electron transporting layer is formed of a material having a function of transporting electrons, and the electron transporting layer may be provided as a single layer or plural layers.

The electron transporting material (which may also function as a hole barrier material in some cases) needs only to have a function of transporting electrons, which are injected from the cathode, to the light-emitting layer. Examples of the electron transporting layer that may be used herein include a nitro-substituted fluorene derivative, a diphenylquinone derivative, a thiopyran dioxide derivative, carbodiimide, a fluorenylidene methane derivative, anthraquinodimethane and anthrone derivatives, and an oxadiazole derivative. The electron transporting material used may be a thiadiazole derivative obtained by replacing the oxygen atom of the oxadiazole ring of the oxadiazole derivative by a sulfur atom, or a quinoxaline derivative having a quinoxaline ring, which is known as an electron attracting group. Furthermore, polymer materials having these materials introduced to the polymer chain or having these materials used as the main chain of the polymer may also be used.

In the production of the organic electroluminescent device, the compound represented by the formula (1) may be used not only in the light-emitting layer but also in the other layers than the light-emitting layer. In this case, the compound represented by the formula (1) used in the light-emitting layer and the compound represented by the formula (1) used in the other layers than the light-emitting layer may be the same as or different from each other. For example, the compound represented by the formula (1) may be used in the injection layer, the barrier layer, the hole barrier layer, the electron barrier layer, the exciton barrier layer, the hole transporting layer, the electron transporting layer and the like described above. The film forming method of the layers is not particularly limited, and the layers may be produced by any of a dry process and a wet process.

Specific examples of preferred materials that may be used in the organic electroluminescent device are shown below, but the materials that may be used in the invention are not construed as being limited to the example compounds. The compound that is shown as a material having a particular function may also be used as a material having another function. In the structural formulae of the example compounds, R and $R_2$ to $R_7$ each independently represent a hydrogen atom or a substituent, and n represents an integer of from 3 to 5.

Preferred examples of a compound that may also be used as the host material of the light-emitting layer are shown below.

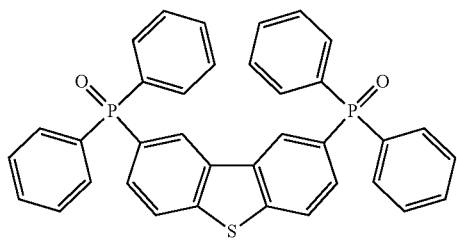
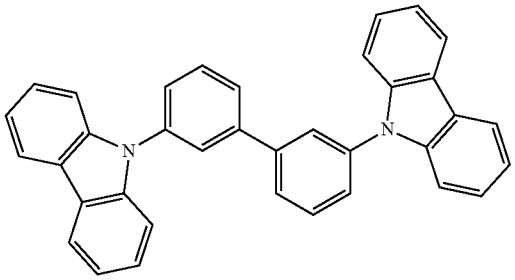
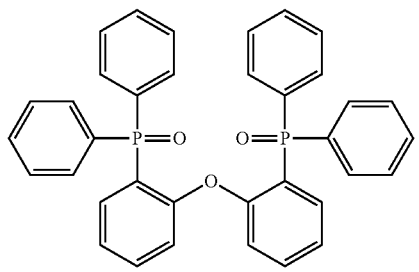

-continued
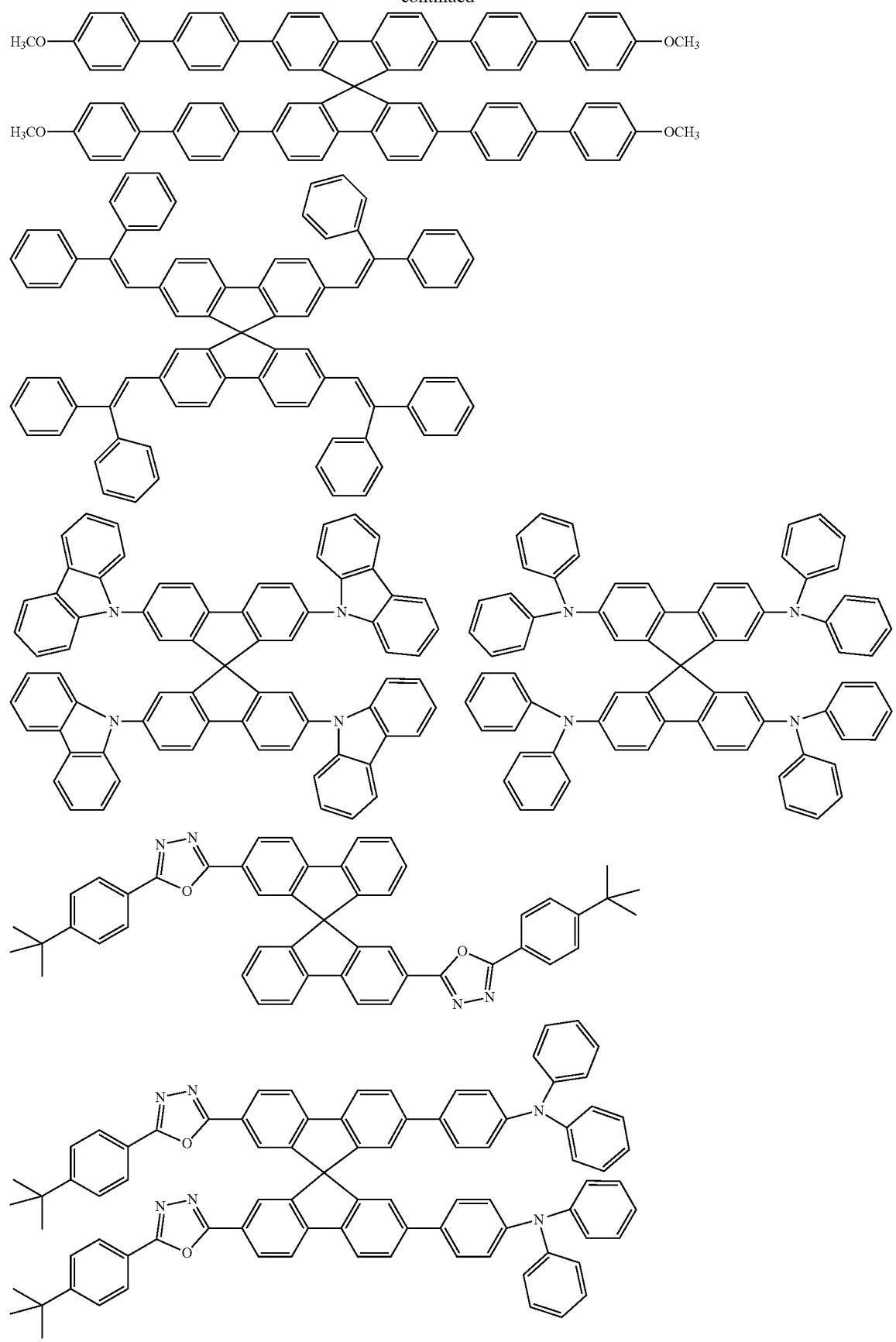

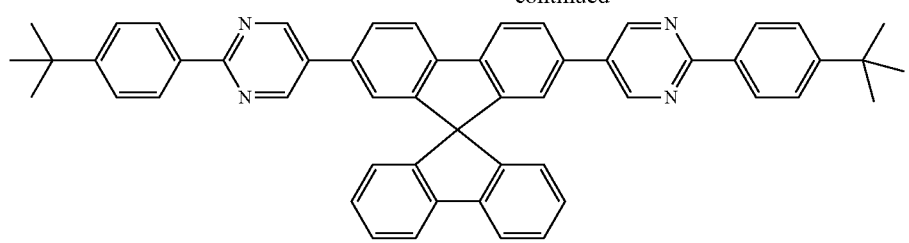
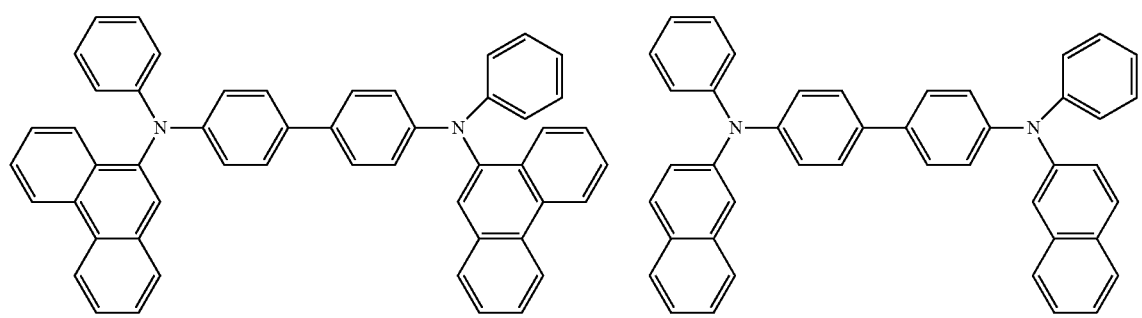
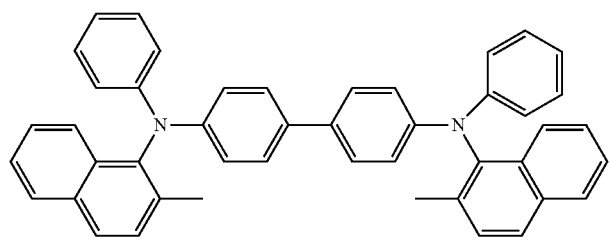
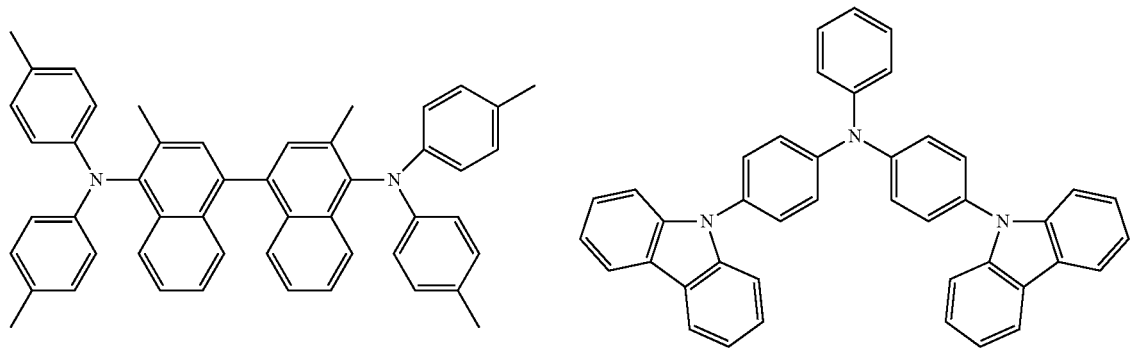

-continued
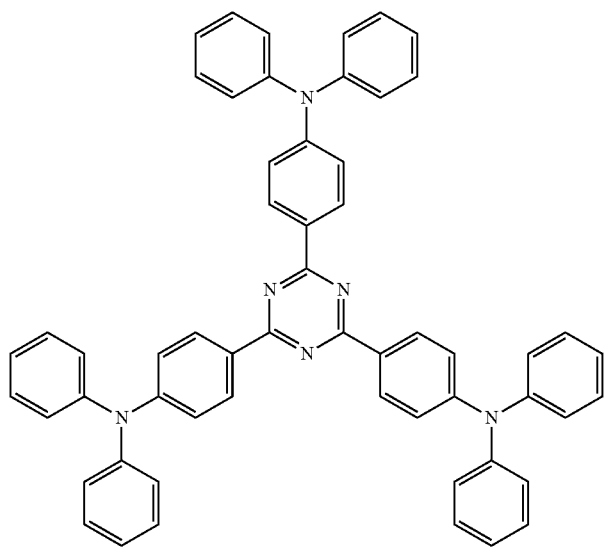
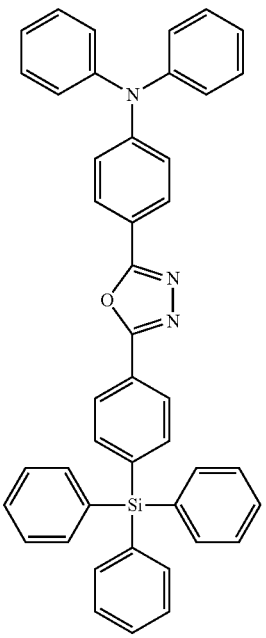
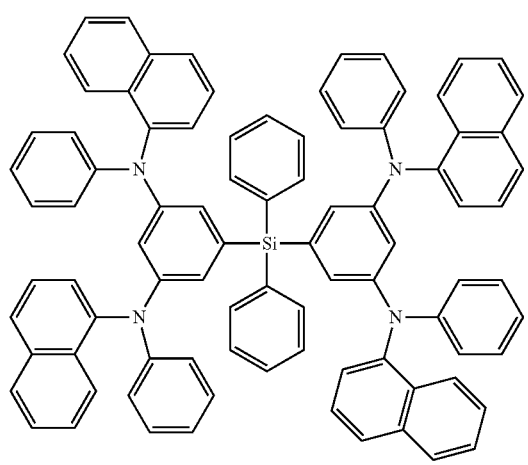
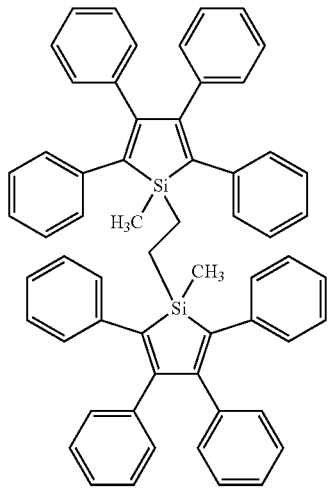
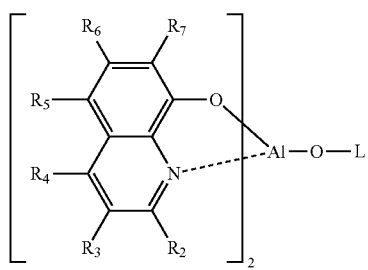
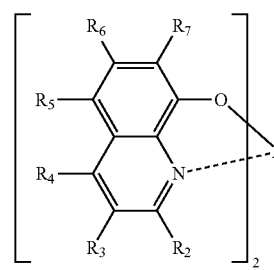
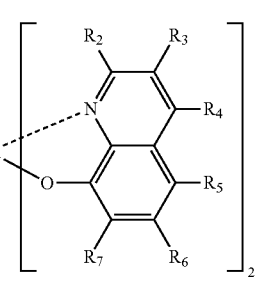
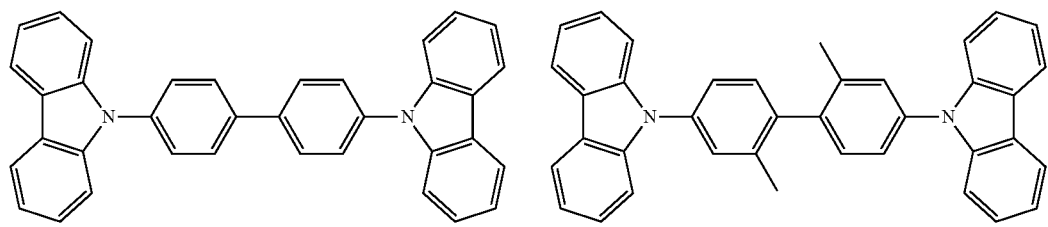

-continued
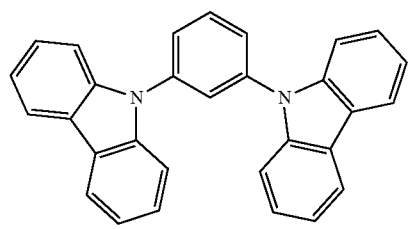
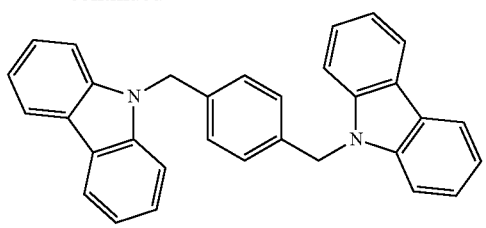
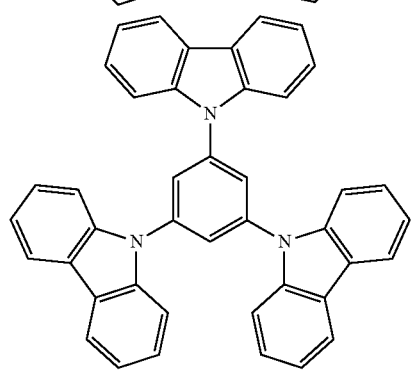
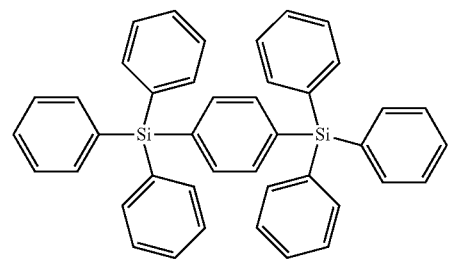
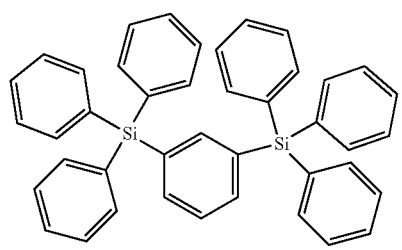
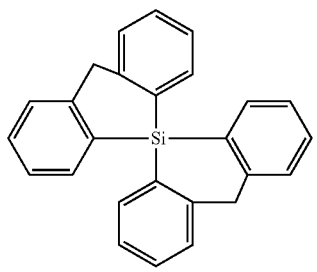
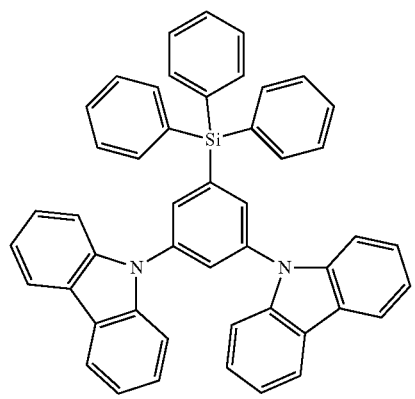
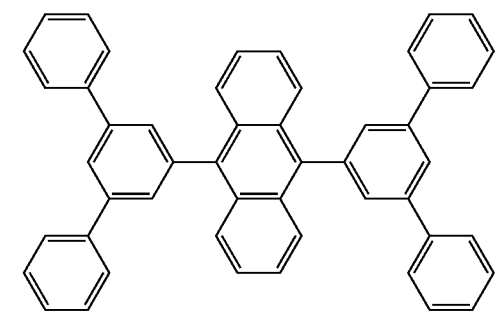
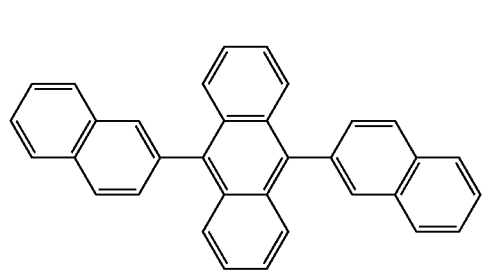
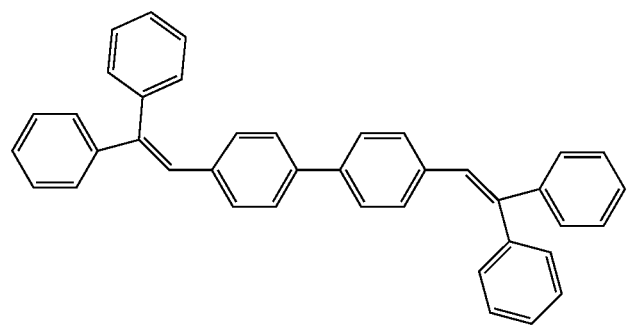

51
-continued
52
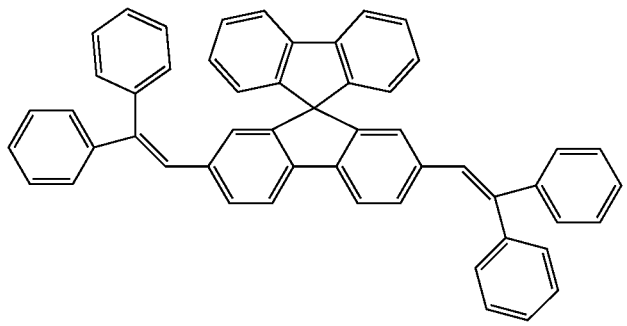
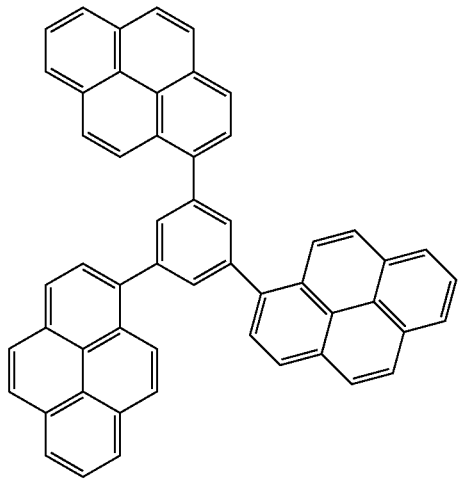
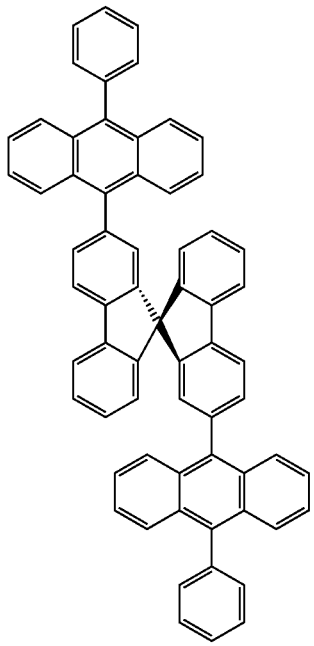
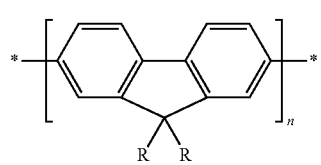
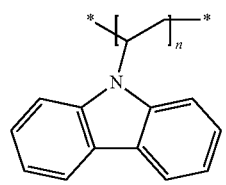
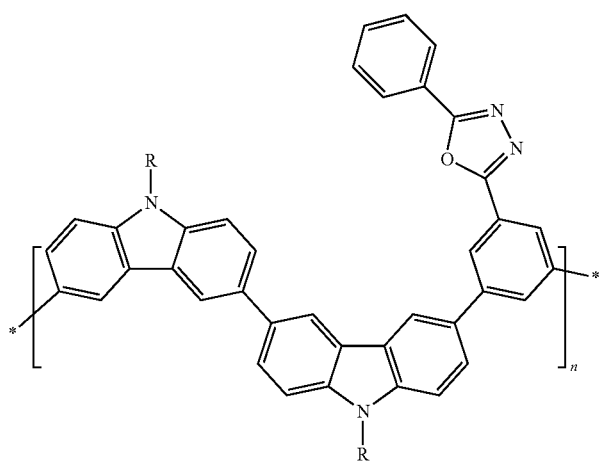
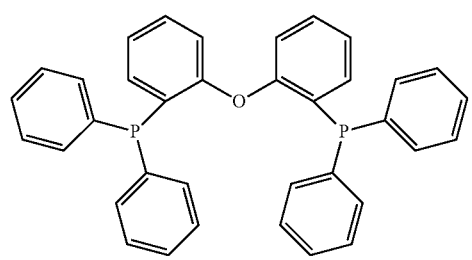

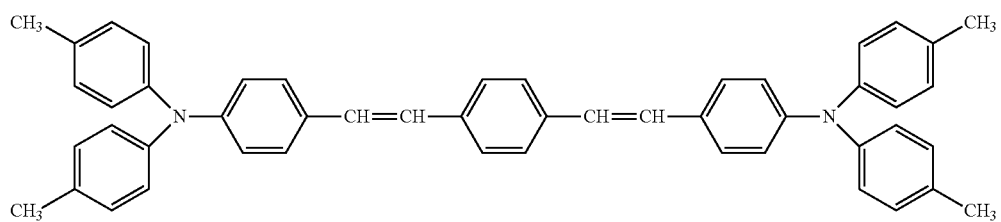
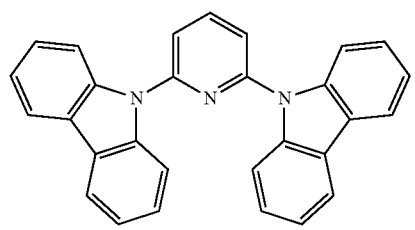
(30)
Preferred examples of a compound that may be used as the hole injection material are shown below.
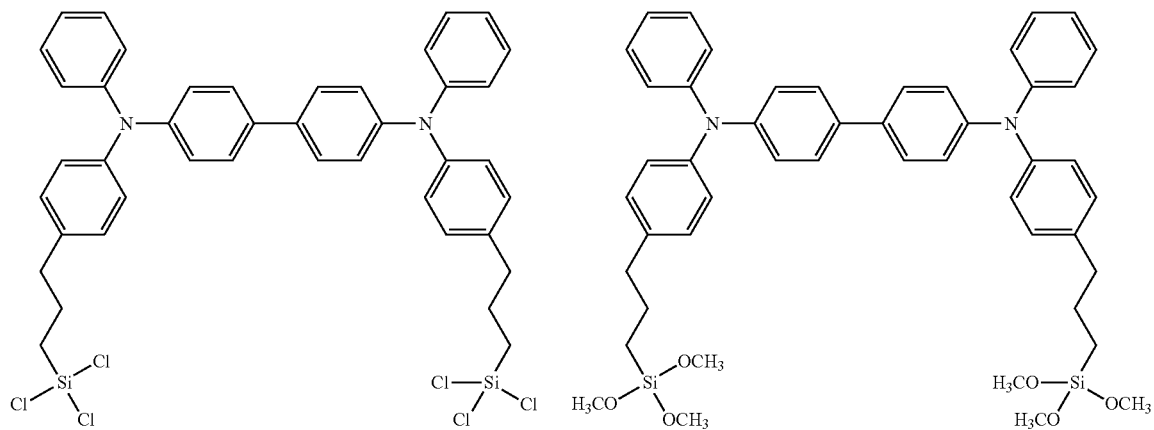
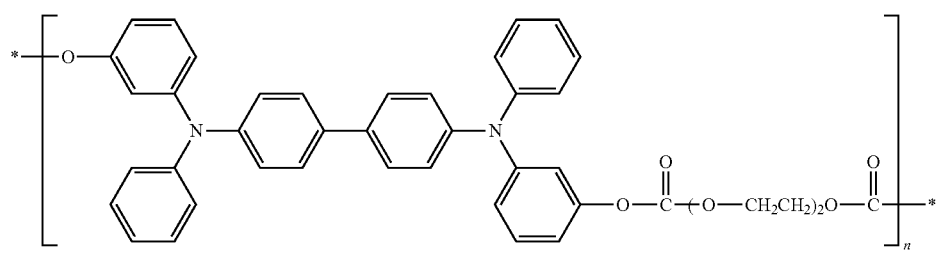

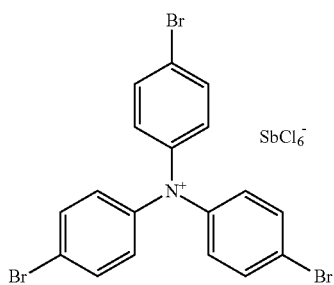
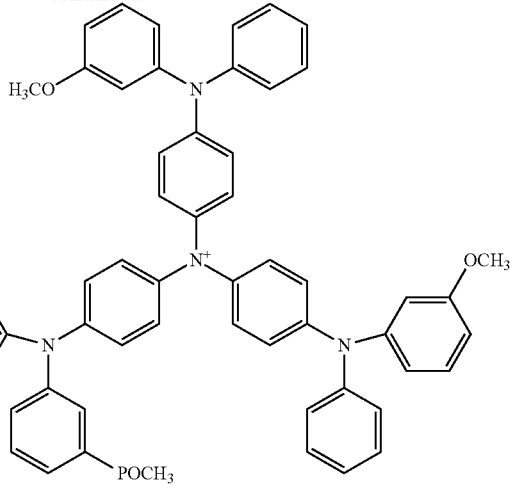
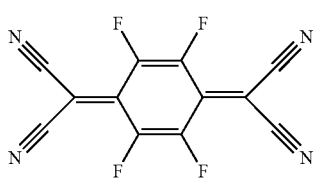
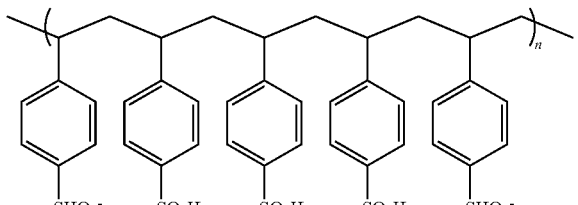
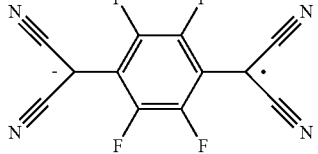
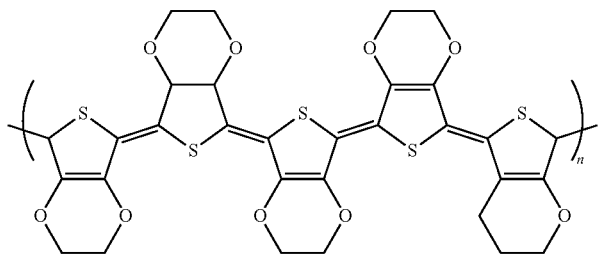
Preferred examples of a compound that may be used as the hole transporting material are shown below.
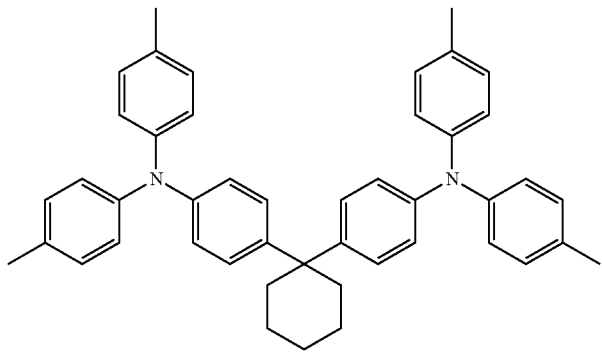
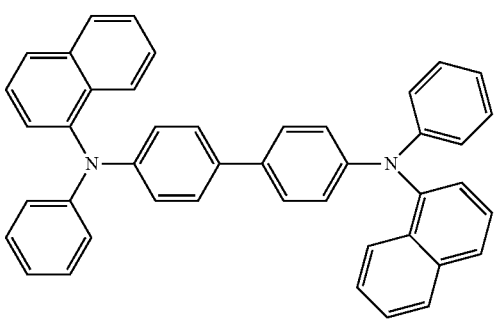

-continued
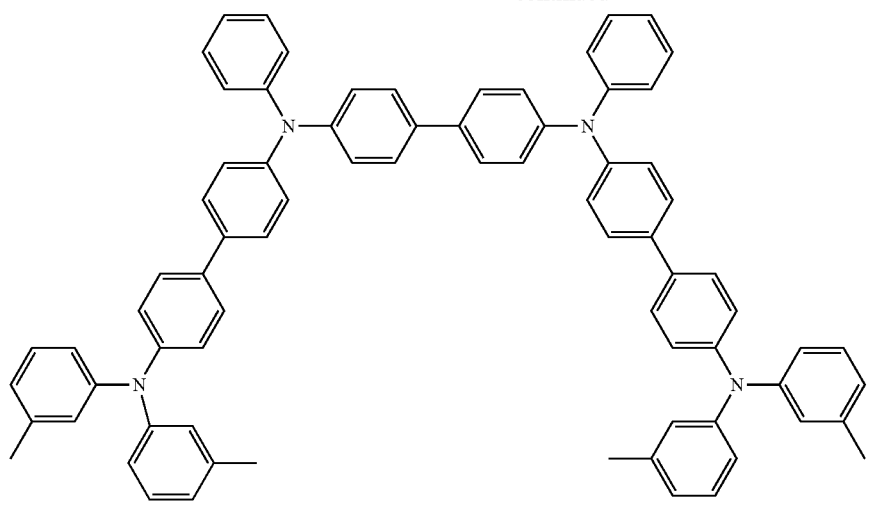
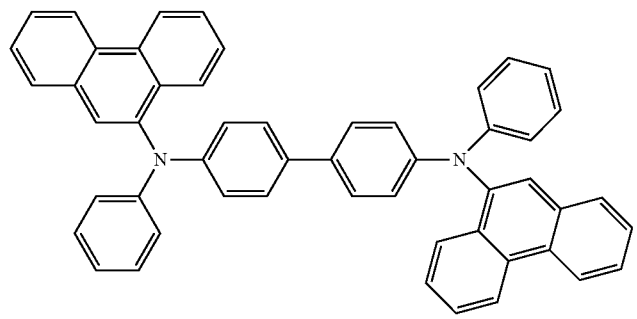
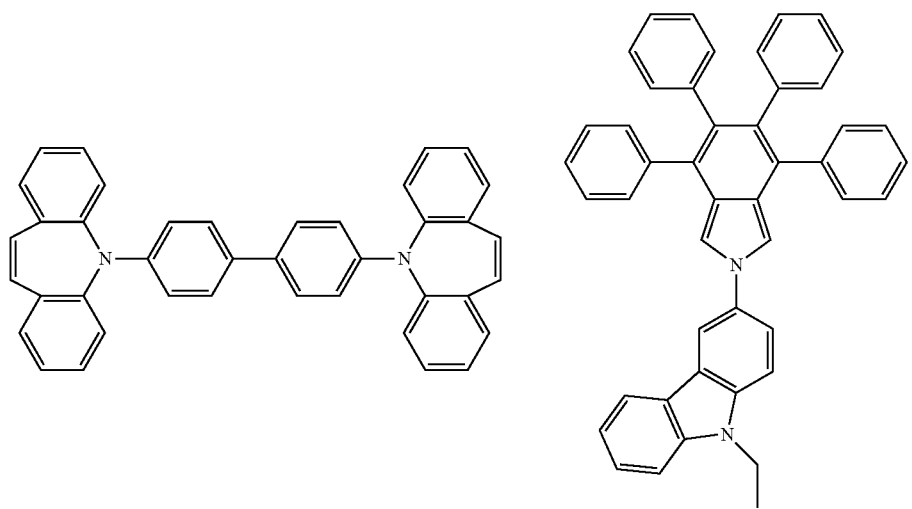

-continued
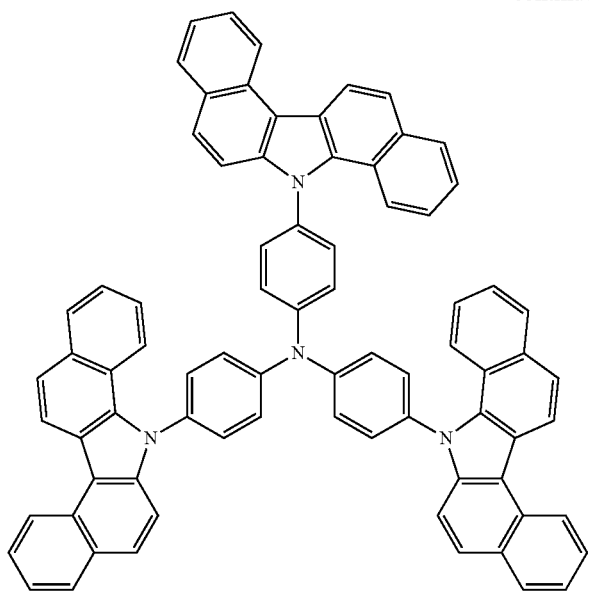
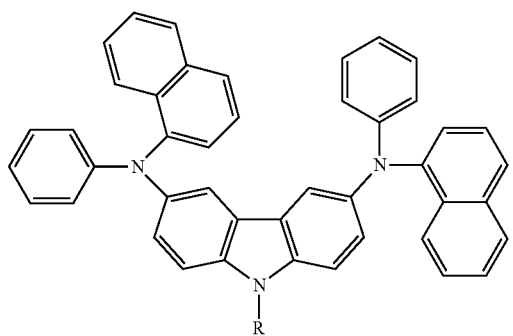
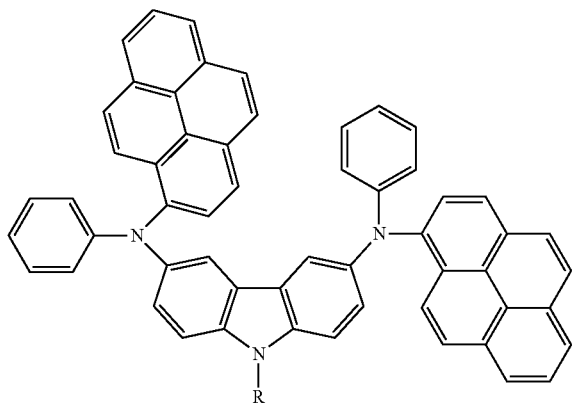
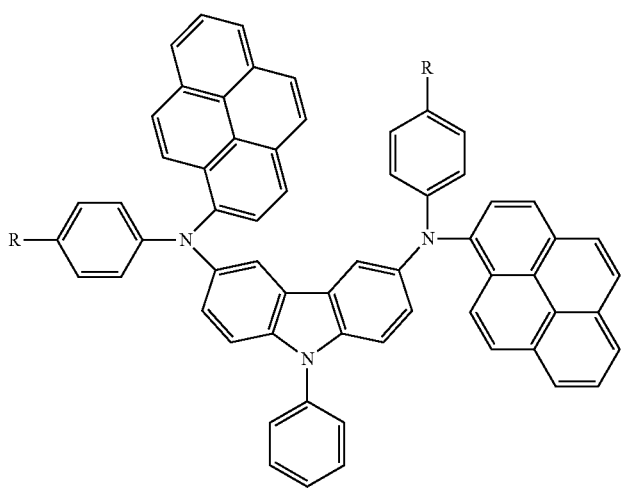

61
-continued
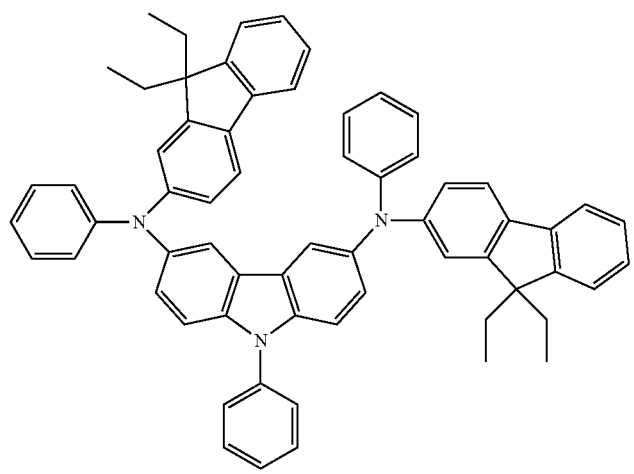
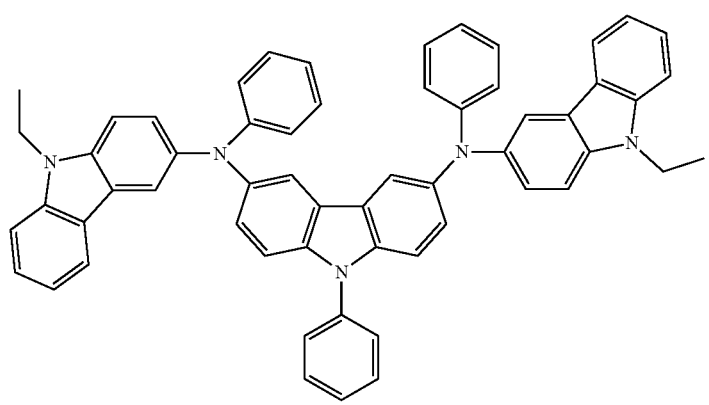
62
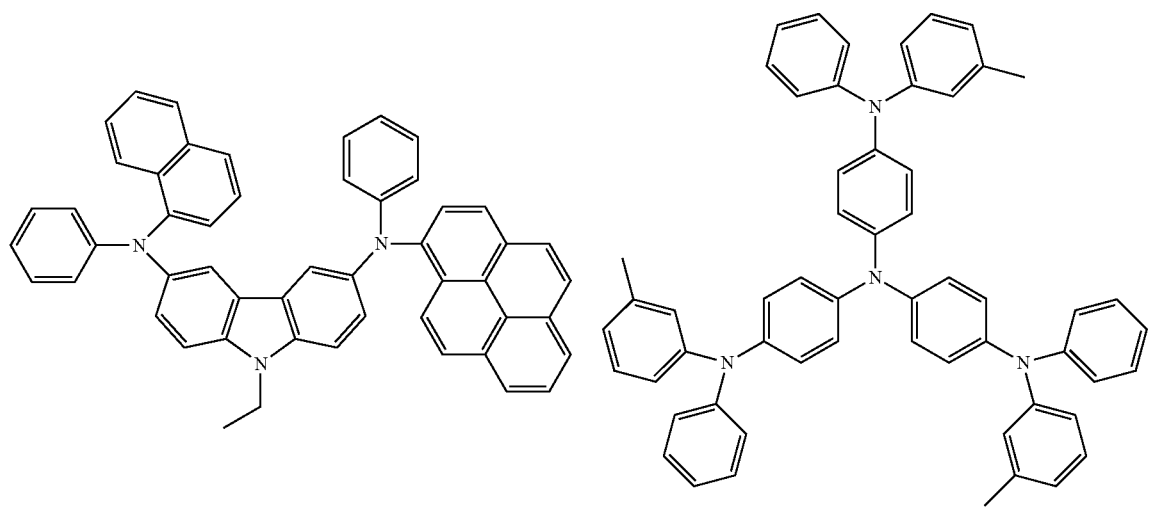

-continued
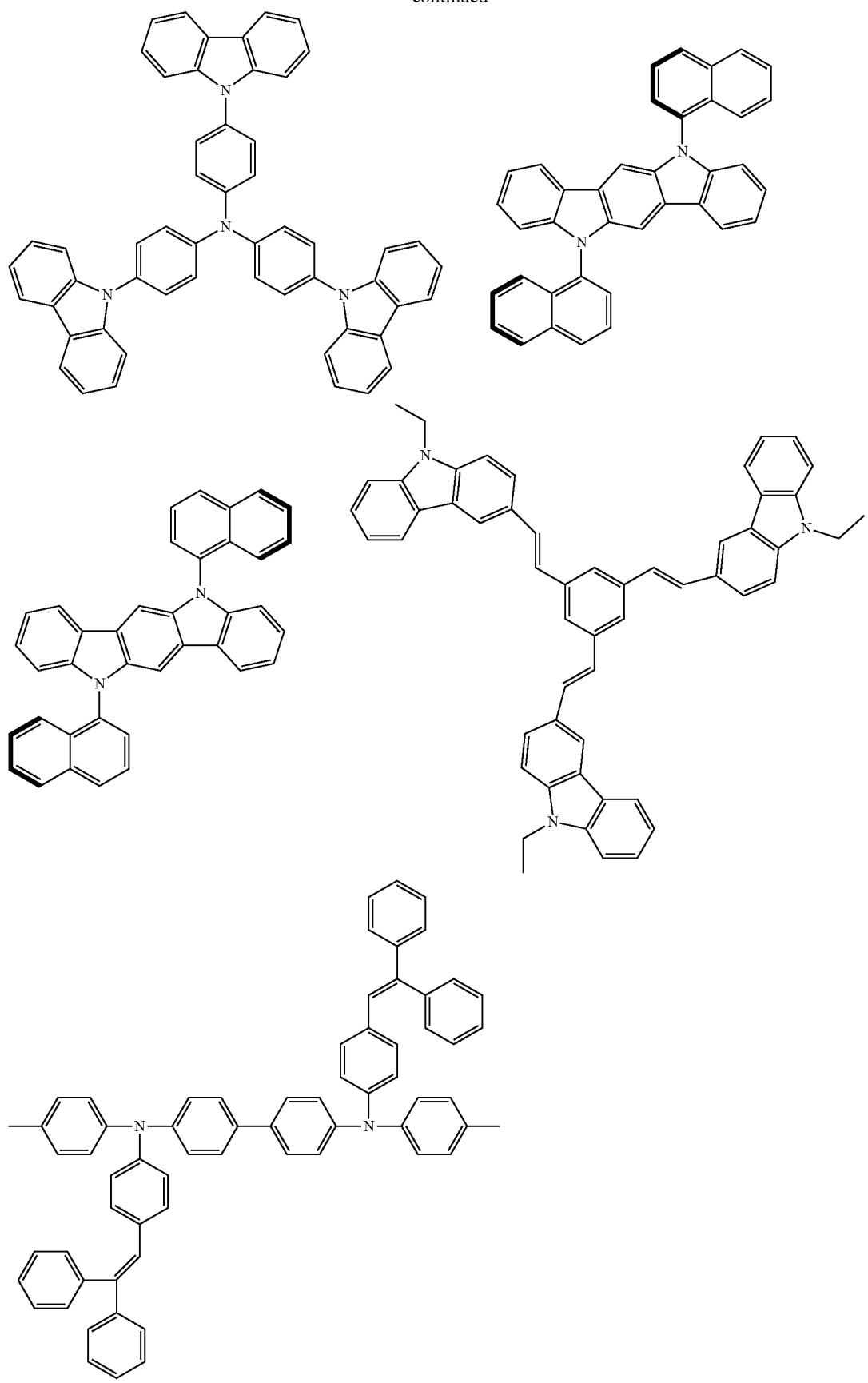

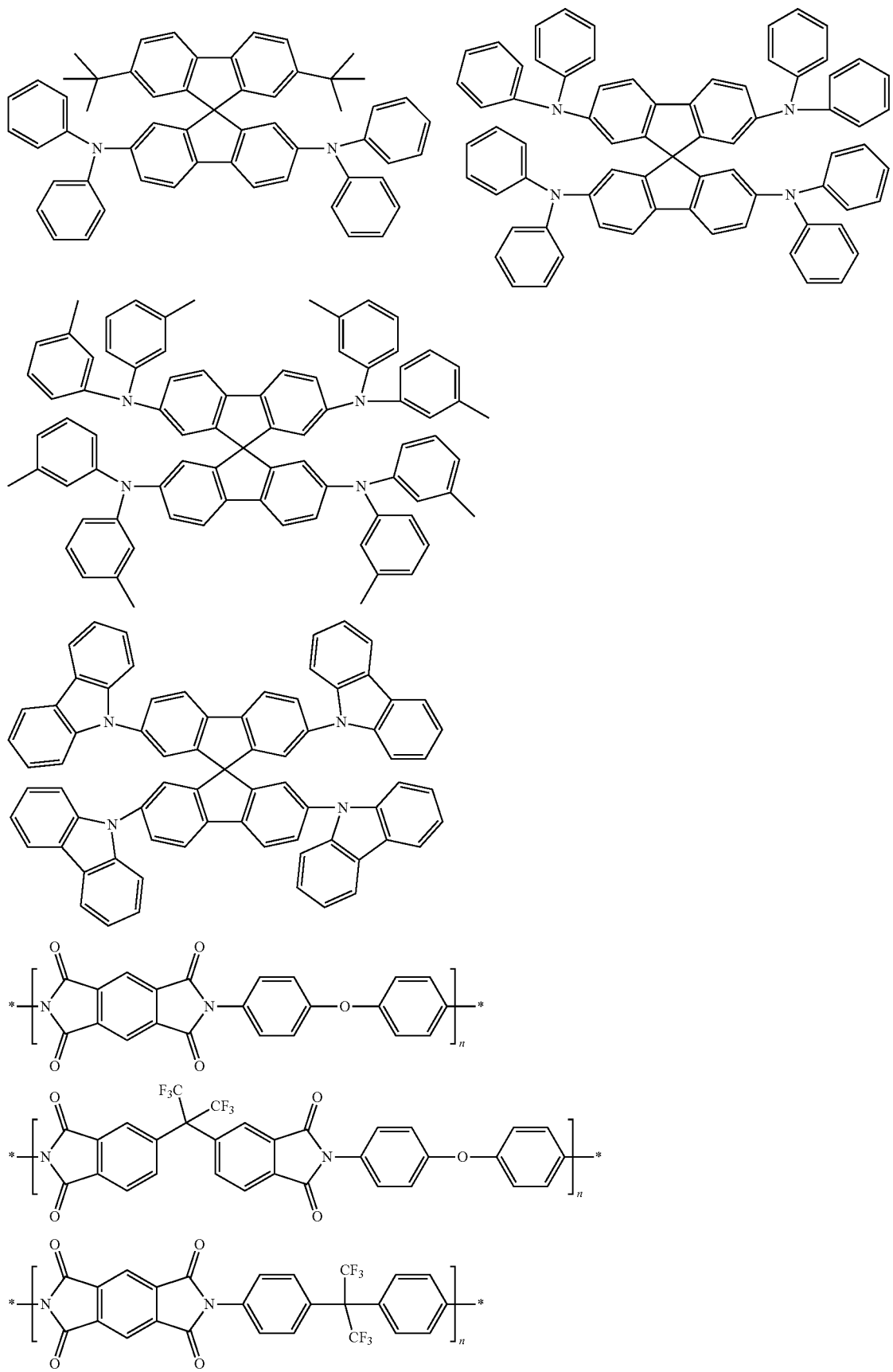

-continued
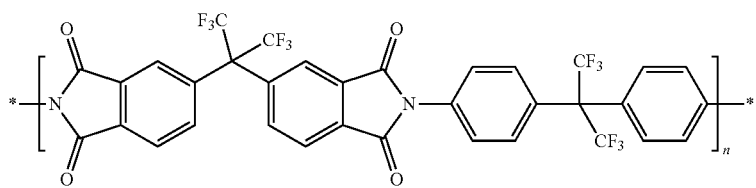
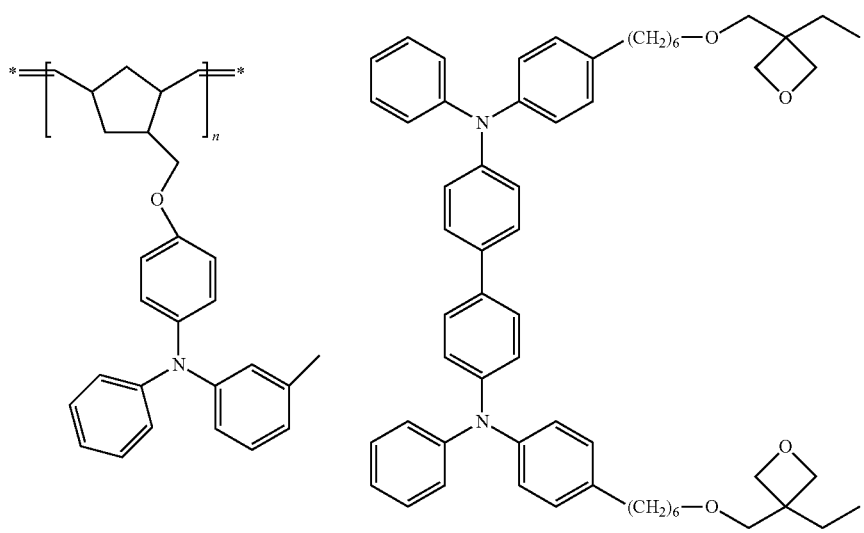
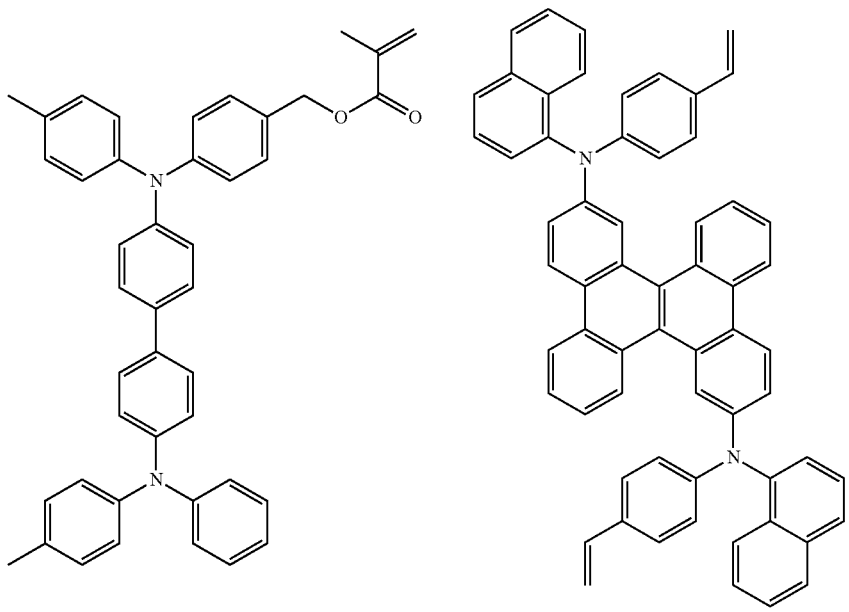

-continued
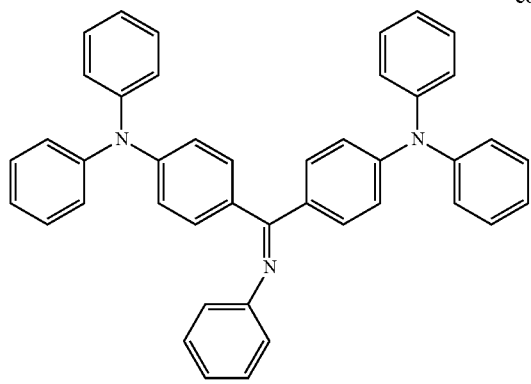
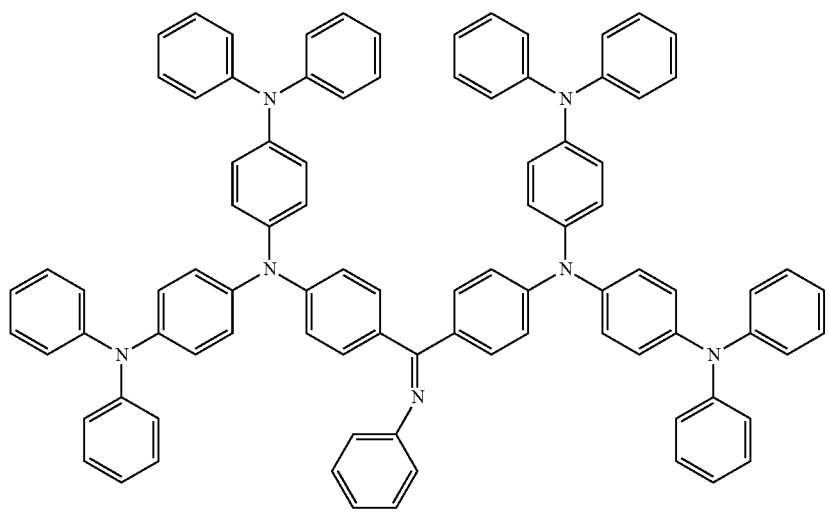
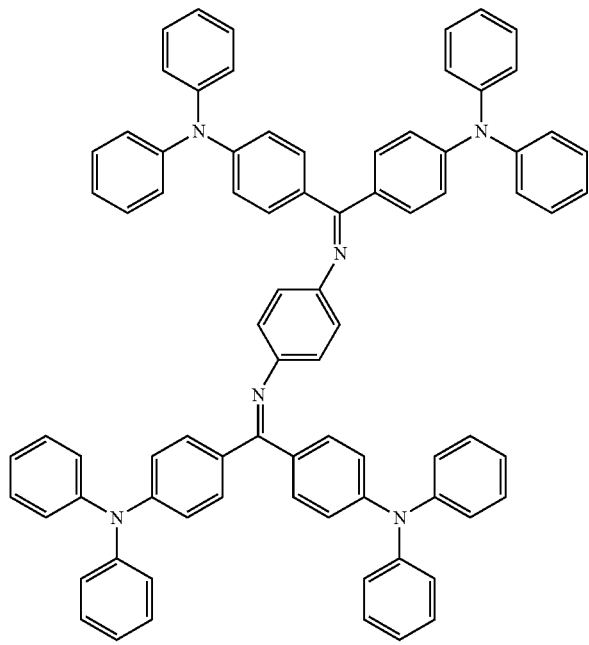

-continued
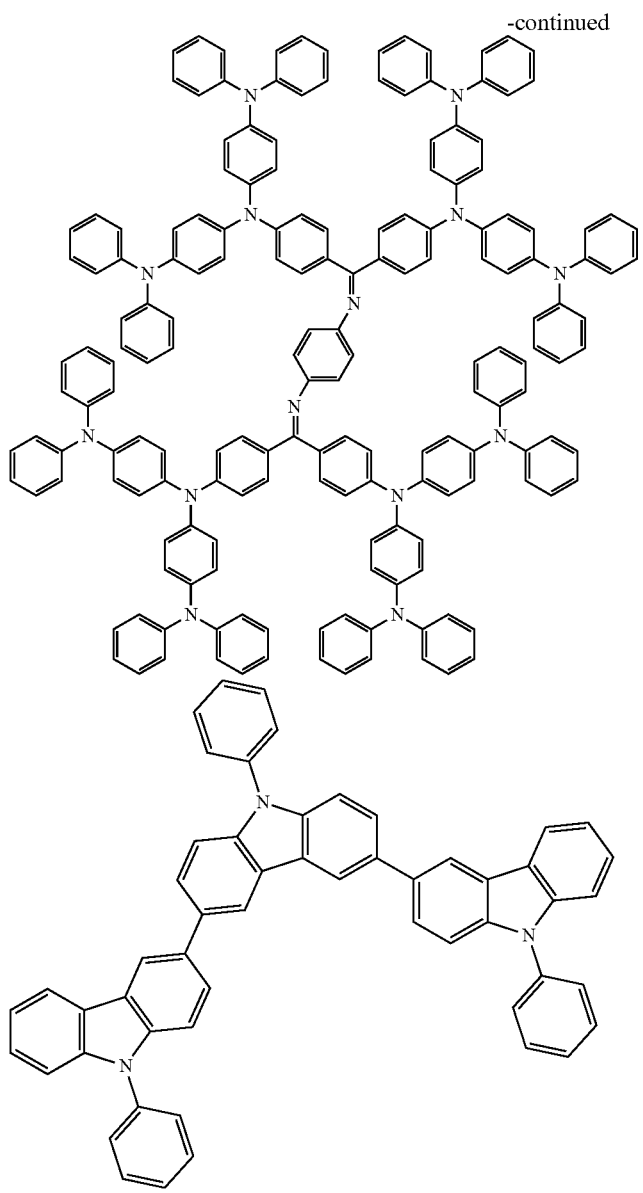
Preferred examples of a compound that may be used as the electron barrier material are shown below.
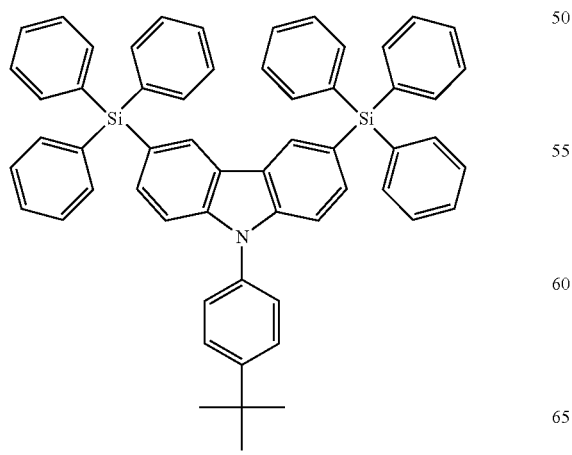

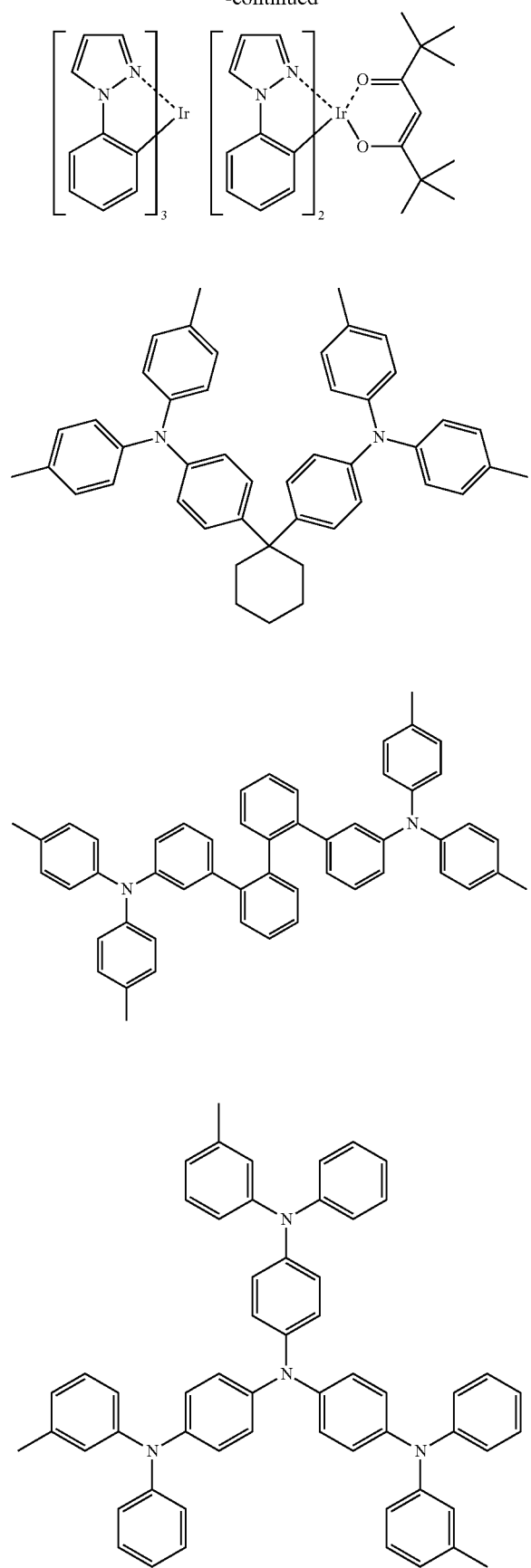
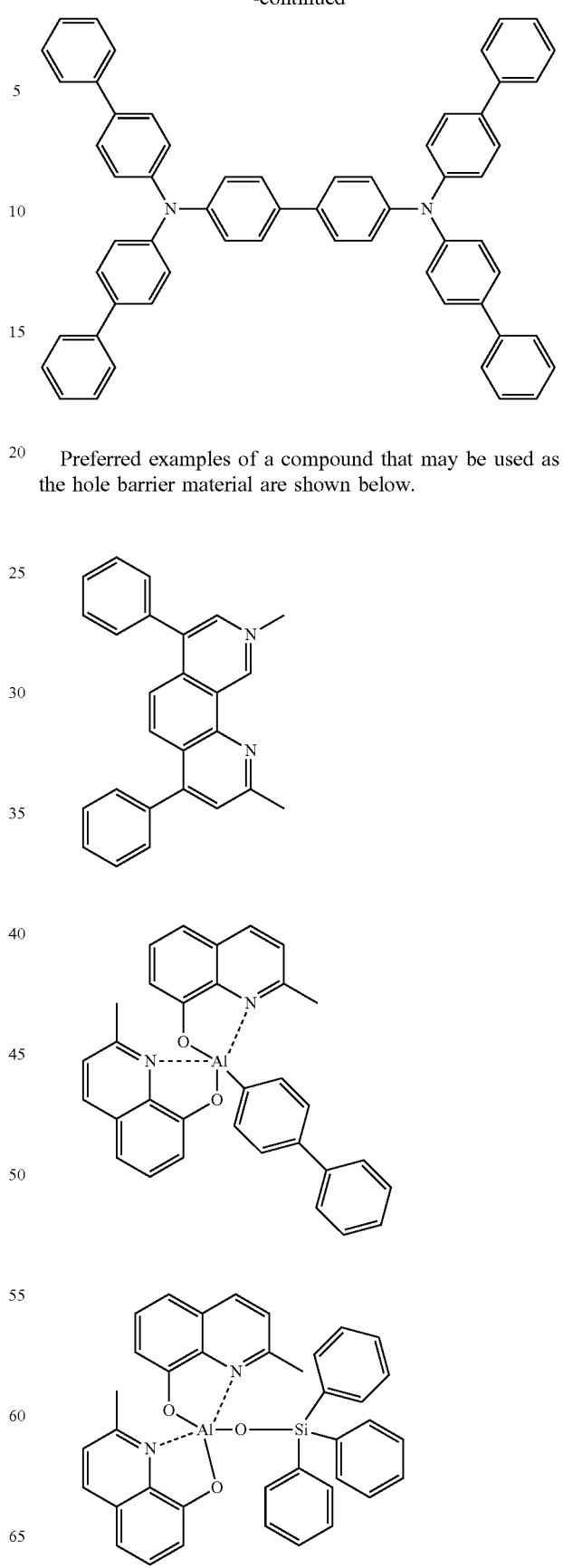
Preferred examples of a compound that may be used as the hole barrier material are shown below.

75
-continued
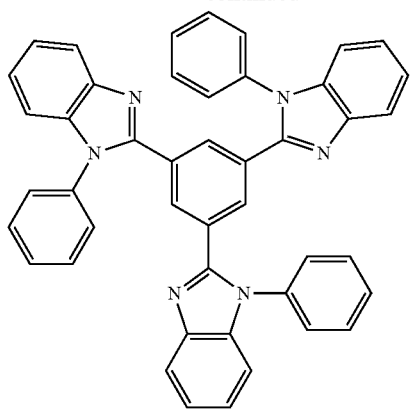
76
-continued
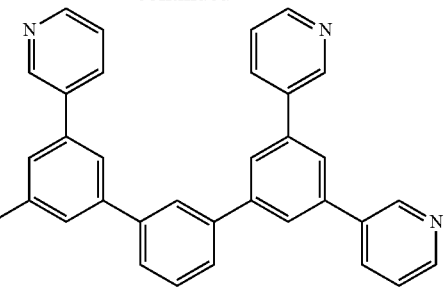
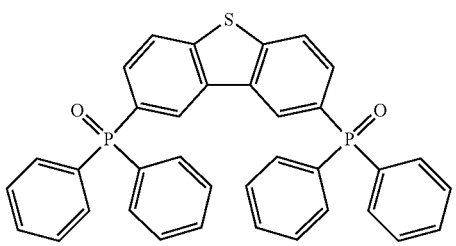
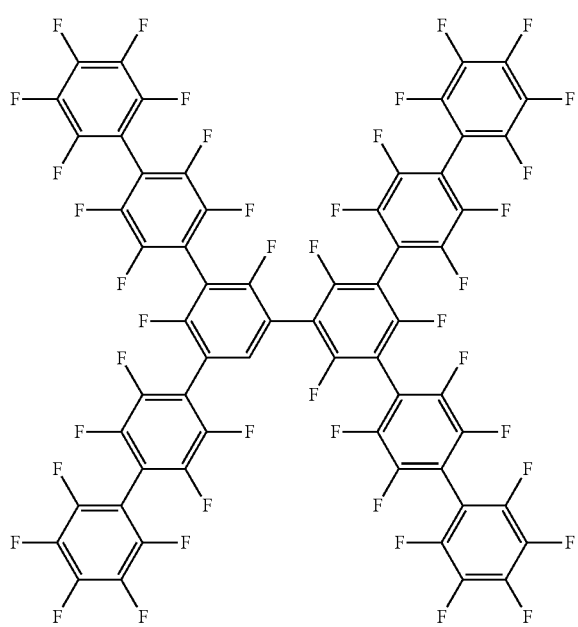
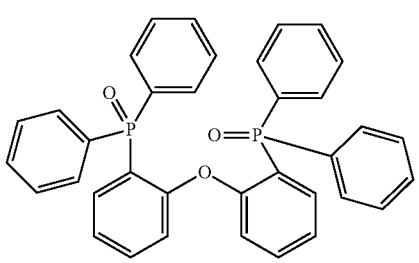
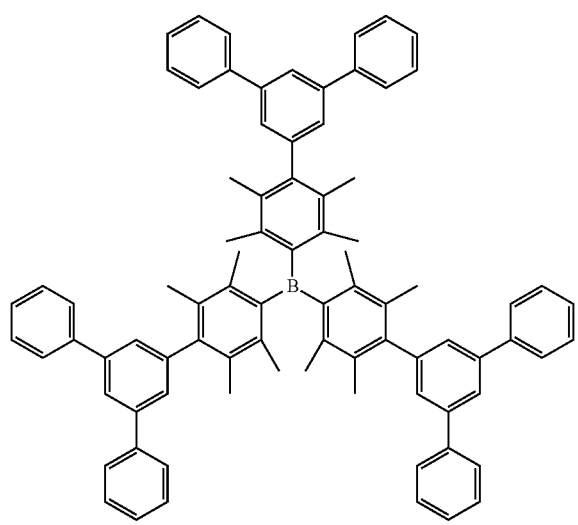
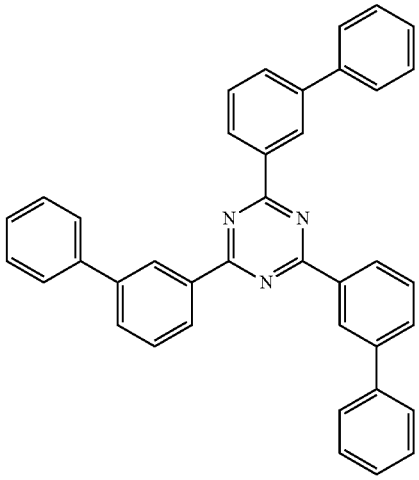
Preferred examples of a compound that may be used as the electron transporting material are shown below.

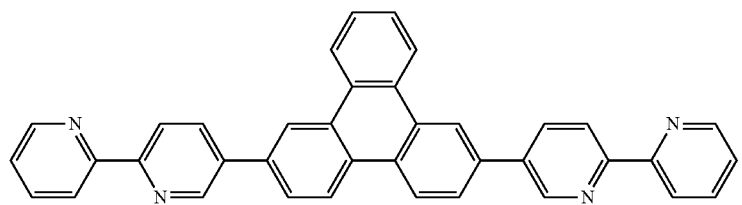
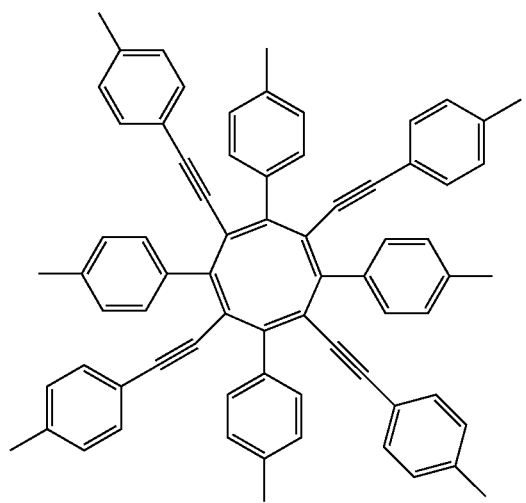
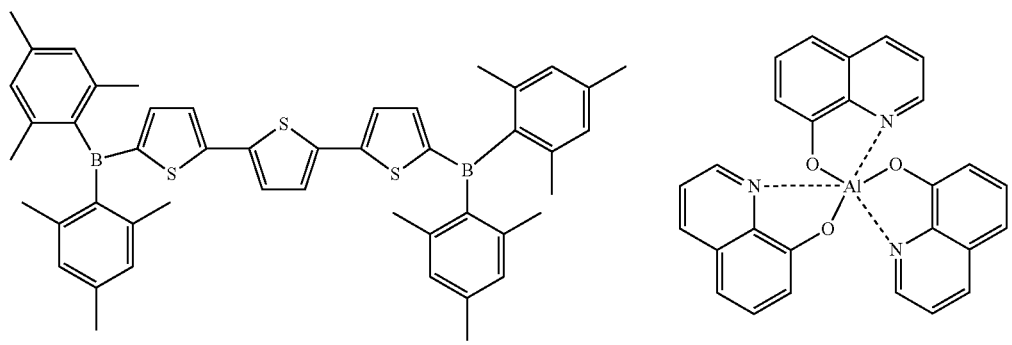
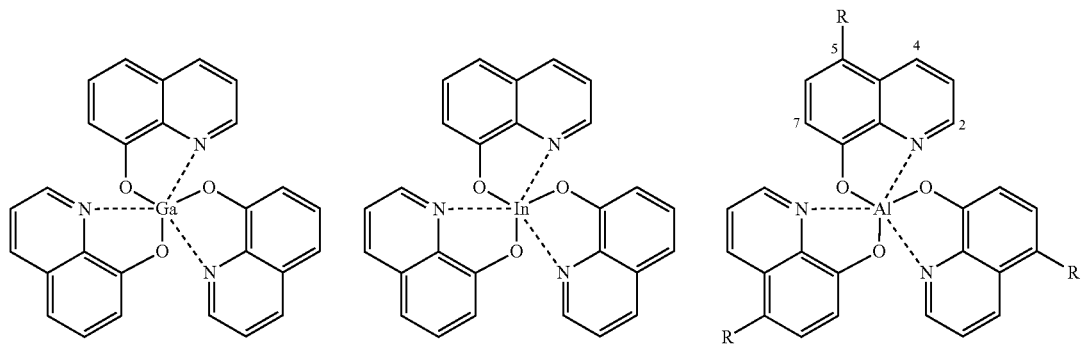

-continued
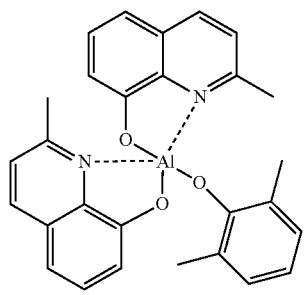
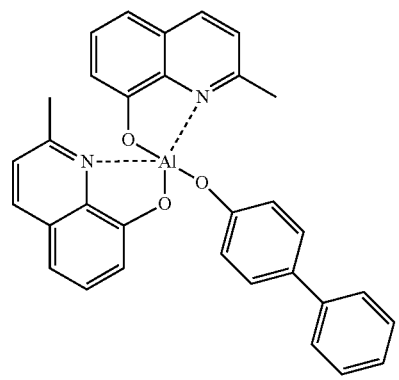
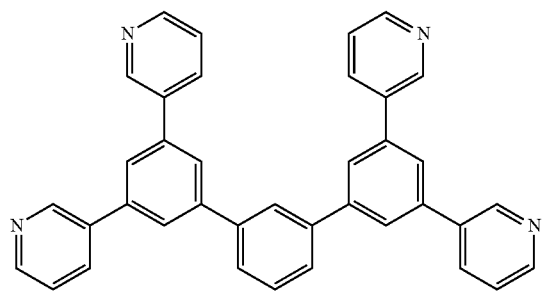
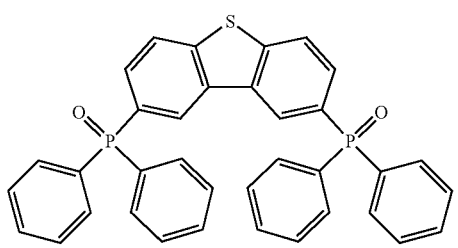
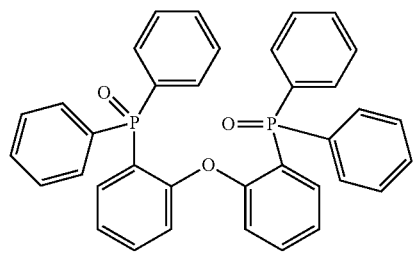
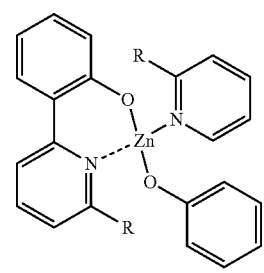
R = H
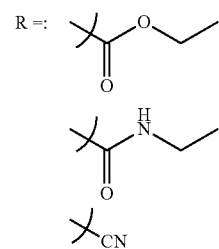
R =: 
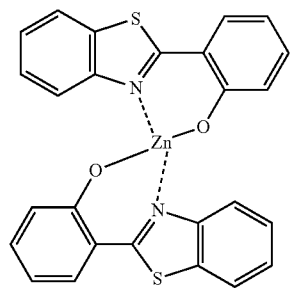
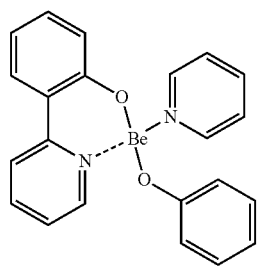
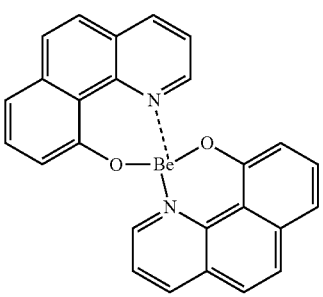
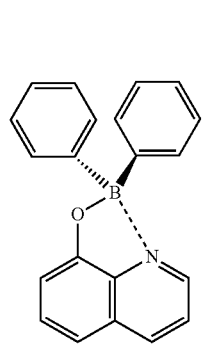
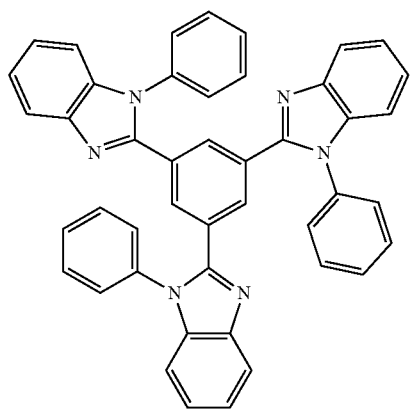

-continued
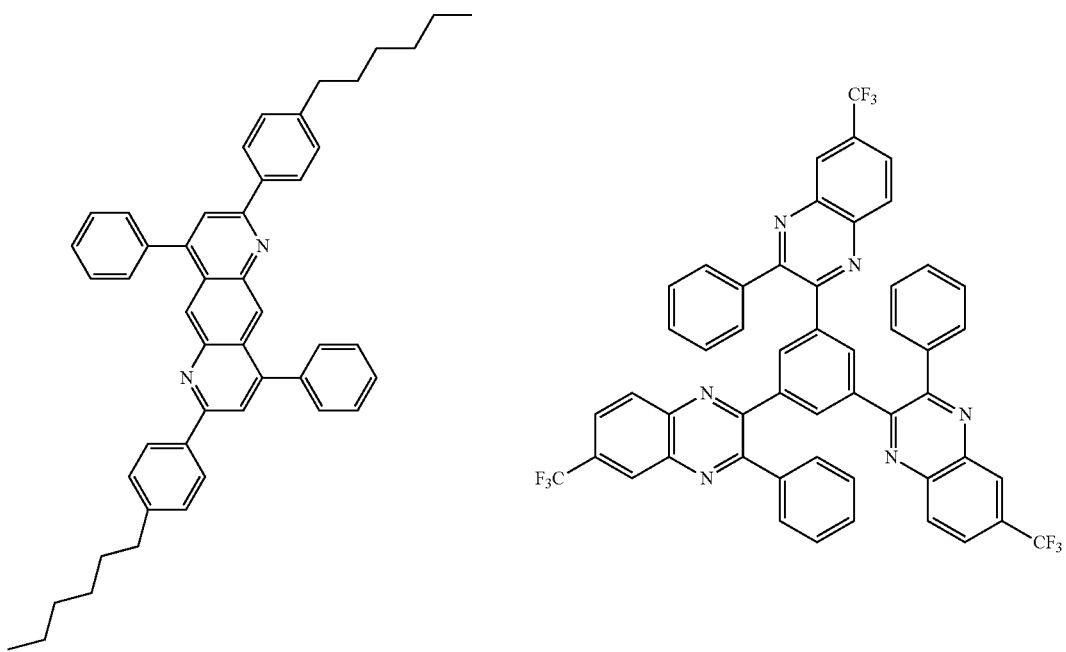
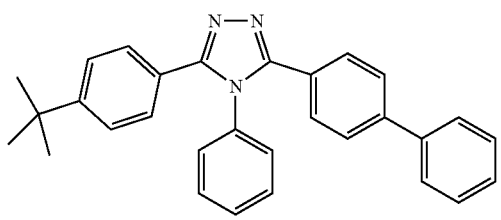
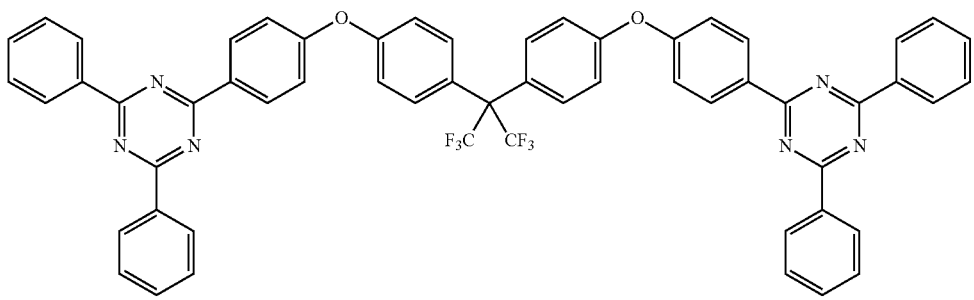
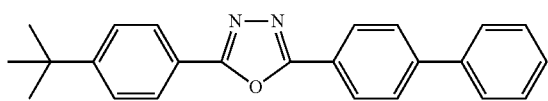
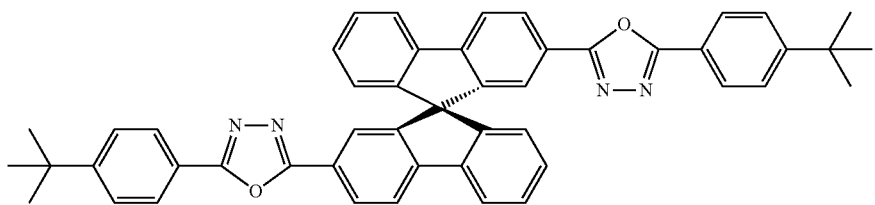

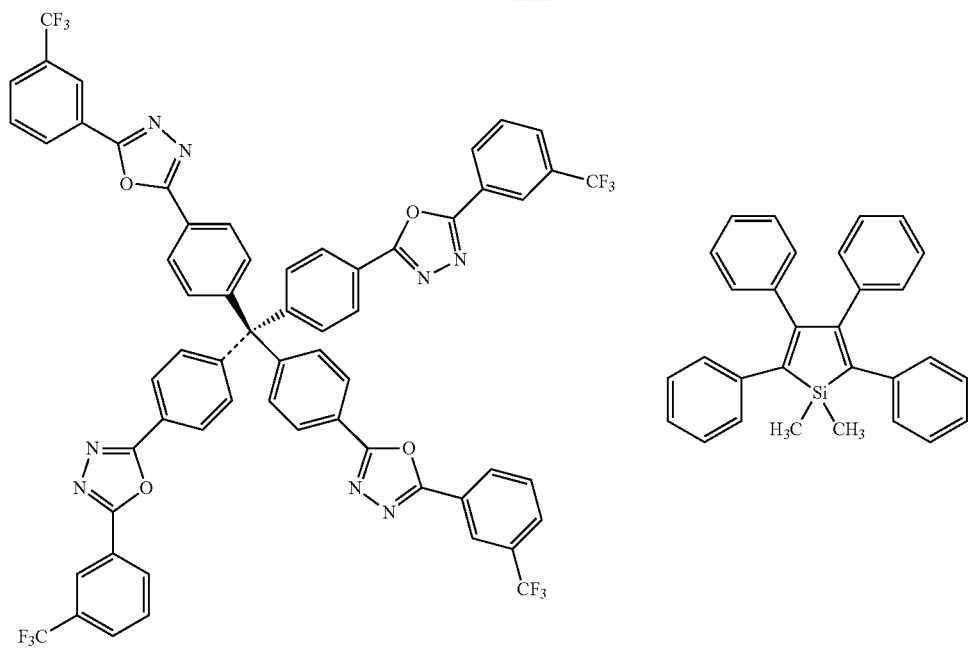
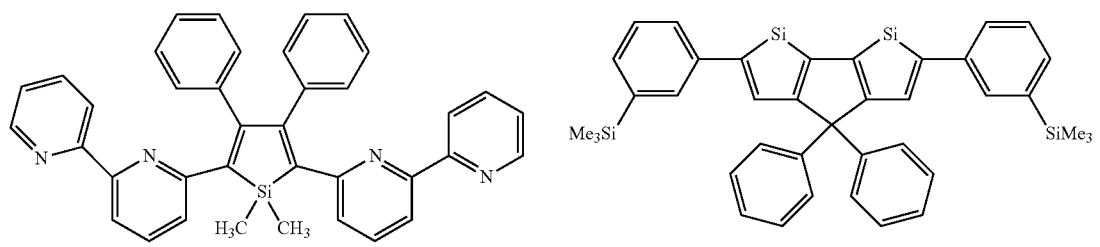
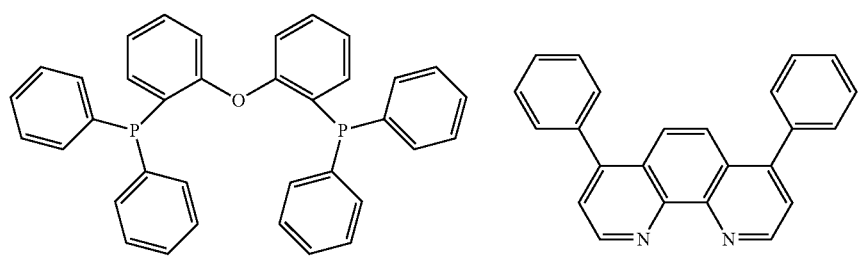

Preferred examples of a compound that may be used as the electron injection material are shown below.

LiF, CsF,

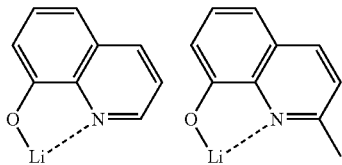

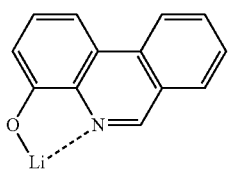

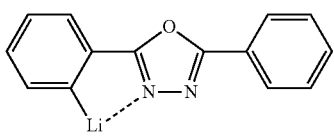

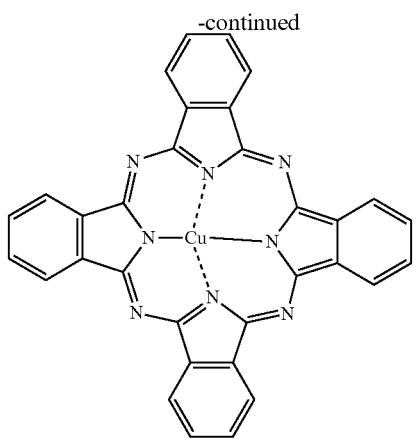

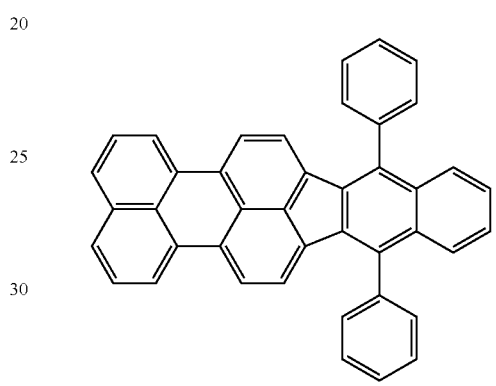

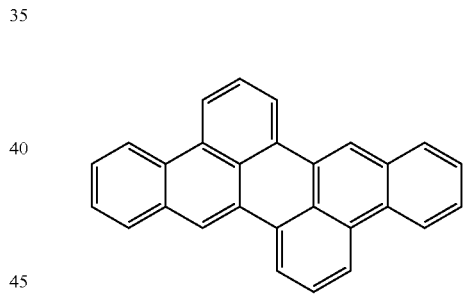

Preferred examples of a compound as a material that may be added are shown below. For example, the compound may be added as a stabilizing material.

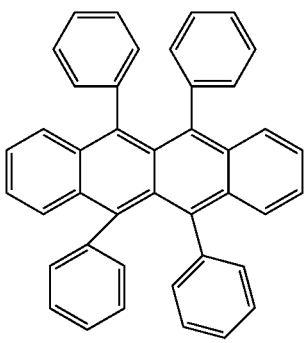

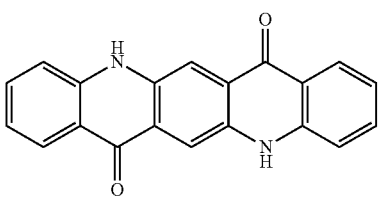

The organic electroluminescent device thus produced by the aforementioned method emits light on application of an electric field between the anode and the cathode of the device. In this case, when the light emission is caused by the excited singlet energy, light having a wavelength that corresponds to the energy level thereof may be confirmed as fluorescent light and delayed fluorescent light. When the light emission is caused by the excited triplet energy, light having a wavelength that corresponds to the energy level thereof may be confirmed as phosphorescent light. The normal fluorescent light has a shorter fluorescent light lifetime than the delayed fluorescent light, and thus the light emission lifetime may be distinguished between the fluorescent light and the delayed fluorescent light.

The phosphorescent light may substantially not observed with a normal organic compound, such as the compound in the invention, at room temperature since the excited triplet energy is converted to heat or the like due to the instability thereof, and is immediately deactivated with a short lifetime. The excited triplet energy of the normal organic compound may be measured by observing light emission under an extremely low temperature condition.

The organic electroluminescent device of the invention may be applied to any of a single device, a structure with plural devices disposed in an array, and a structure having anodes and cathodes disposed in an X-Y matrix. According to the invention, an organic light-emitting device that is largely improved in light emission efficiency of NIR region may be obtained by adding the compound represented by the formula (1) in the light-emitting layer. The organic light-emitting device, such as the organic electroluminescent device, of the invention may be applied to a further wide range of purposes. For example, an organic electroluminescent display apparatus may be produced with the organic electroluminescent device of the invention, and for the details thereof, reference may be made to S. Tokito, C. Adachi and H. Murata, "Yuki EL Display" (Organic EL Display) (Ohmsha, Ltd.). In particular, the organic electroluminescent device of the invention may be applied to bio-imaging, medical cameras, sensors, security cameras, night-vision displays and information-secured displays.

The compounds represented by the formula (1) exhibit a high fluorescence quantum yield and have improved NIR emitting properties. They can be used both in solution, in particular in organic solvents, and in solid-state.

The compounds represented by the formula (1) are useful in bioimaging, in particular for cells imaging; as sensors of volatile acid/base; in photodynamic therapy; in diagnosis of Alzheimer's disease; in theranostics; as optical sensors for anaerobic environment; in display and telecommunication technologies; in photovoltaics, particularly as electron donors; and emitters in an organic semiconductor laser. They can represent fluorescent reporters for human beta-amyloid peptide, produced in the nerve tissues and in the blood in the course of Alzheimer's disease and may thus be used in diagnosis of Alzheimer's disease.

The present invention also provides an organic semiconductor laser containing a compound represented by the formula (1). A compound of the formula (1) is useful as a material used in a light-emitting layer (light amplification layer) of the organic semiconductor laser. The light-emitting layer may contain two or more compounds of the formula (1) but preferably contains only one compound of the formula (1). The light-emitting layer may contain a host material. Preferable host material absorbs photo-excitation light for the organic semiconductor laser. Another preferable host material has sufficient spectral overlap between its fluorescence spectrum and the absorption spectrum of the compound of the formula (1) contained in the light-emitting layer so that an effective Förster-type energy transfer can take place from the host material to the compound of the formula (1). The concentration of the compound of the formula (1) in the light-emitting layer is preferably at least 0.1 wt %, more preferably at least 1 wt %, still more preferably at least 3 wt %, and preferably at most 50 wt %, more preferably at most 30 wt %, still more preferably at most 10 wt %.

The organic semiconductor laser of the present invention has an optical resonator structure. The optical resonator structure may be a one-dimensional resonator structure or a two-dimensional resonator structure. Examples of the latter include a circulator resonator structure, and a whispering gallery type optical resonator structure. A distributed feedback (DFB) structure and a distributed Bragg reflector (DBR) structure are also employable. For DFB, a mixed-order DFB grating structure is preferably employed. Namely, a mixed structure of DFB grating structures differing in point of the order relative to laser emission wavelength may be preferably employed. Specific examples thereof include an optical resonator structure composed of a second-order Bragg scattering region surrounded by the first-order Bragg scattering region and a mixed structure where a second-order Bragg scattering region and a first-order scattering region are formed alternately. For details of preferred optical resonator structures, specific examples to be given hereinunder may be referred to. As the optical resonator structure, the organic semiconductor laser may be further provided with an external optical resonator structure. For example, the optical resonator structure may be formed preferably on an glass substrate. The material to constitute the optical resonator structure includes an insulating material such as $SiO_2$, etc. For example, a grating structure is formed, the depth of the grating is preferably 75 nm or less, and is more preferably selected from a range of 10 to 75 nm. The depth may be, for example, 40 nm or more, or may be less than 40 nm. The light-emitting layer (light amplification layer) containing a compound of the formula (1) can be directly formed on the optical resonator structure.

The organic semiconductor laser is preferably encapsulated by a sapphire or other materials to lower the lasing threshold and optimize the heat dissipation under intense optical pumping. An interlayer may be formed between the sapphire lid and the light-emitting layer. For example, amorphous fluorinated polymer such as CYTOP (trademark) is preferably used in the interlayer.

Other advantages and features of the present invention may be better understood with respect to the following examples given for illustrative purposes and the accompanying figures.

EXAMPLES

The invention will be described more specifically with reference to synthesis examples and working examples below. The materials, processes, procedures and the like shown below may be appropriately modified unless they deviate from the substance of the invention. Accordingly, the scope of the invention is not construed as being limited to the specific examples shown below.

The light emission characteristics were evaluated by using a high-performance UV/Vis/NIR spectrophotometer (Lambda 950, produced by PerkinElmer, Co., Ltd.), a fluorescence spectrophotometer (FluoroMax-4, produced by Horiba, Ltd.), an absolute PL quantum yield measurement system (C11347, produced by Hamamatsu Photonics K.K.), a source meter (2400 Series, produced by Keithley Instruments Inc.), a semiconductor parameter analyzer (E5273A, produced by Agilent Technologies, Inc.), an optical power (Synthesis Example 1) Synthesis of Compound 1

(Synthesis Example 2) Synthesis of Compound 2

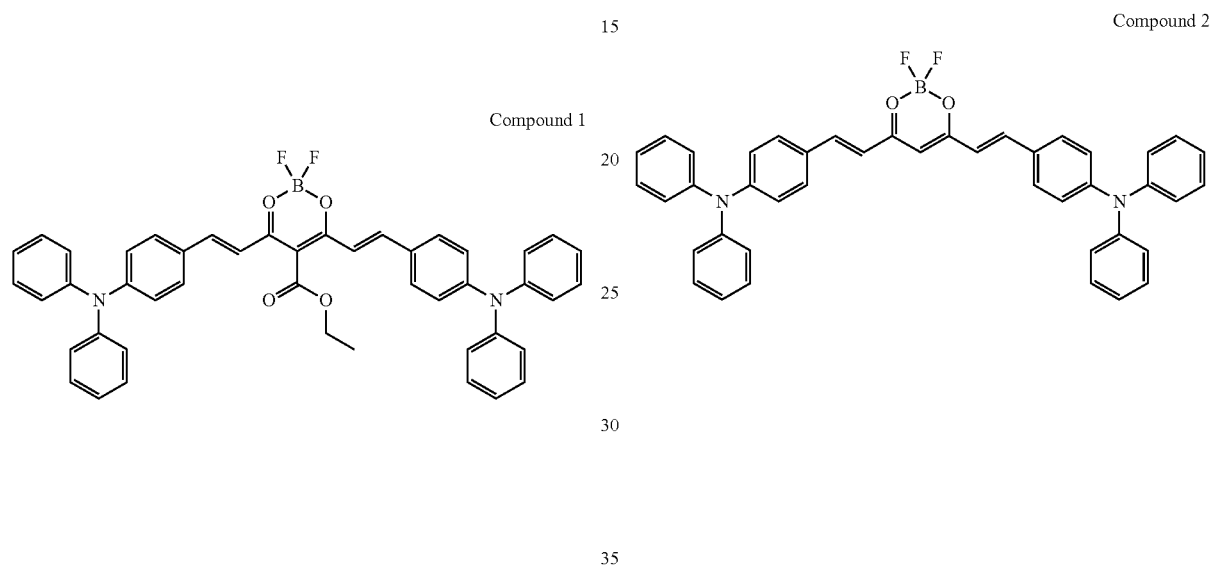

In a 50 mL flask, the mixture of Ethyl diacetoacetate (228 µL, 1.463 mmol, 1 eq) and BF$_3$Et$_2$O (199 µL, 1.609 mmol, 1.1 eq) in 3 mL ethyl acetate was heated for 30 min at 50-60° C. in air. Dissolved 4-(N,N-Diphenylamino)-benzaldehyde (1 g, 3.658 mmol, 2.5 eq) and B(n-OBu)$_3$ (0.987 mL, 3.658 mmol, 2.5 eq) into 12 mL ethyl acetate, then the solution was injected into the first mixture. Kept the reaction at 50-60° C. for another 30 min. First portion of BuNH$_2$ (58 µL, 0.585 mmol, 0.4 eq) was added dropwise into the reaction. After 6 h heating, second portion of BuNH$_2$ (29 µL, 0.293 mmol, 0.2 eq) was added, and the reaction was kept heating at 50-60° C. overnight. All the solvents were evaporated. The crude product could be obtained by flash column chromatography (silica, CH$_2$Cl$_2$) mixed with few ligand and aldehyde. The further purification was done by many times' precipitation in CH$_2$Cl$_2$/petroleum ether, giving dark green powder (730 mg, 68% yield).

$^1$H NMR (400 MHz, CDCl$_3$, ppm): δ 8.10 (d, $^3$J=15.1 Hz, 2H), 7.45 (d, $^3$J=8.8 Hz, 4H), 7.34 (m, 8H), 7.17 (m, 14H), 6.97 (d, $^3$J=8.7 Hz, 4H), 4.40 (m, 2H), 1.42 (t, $^3$J=7.4 Hz, 3H).

$^{13}$C NMR (400 MHz, CDCl$_3$, ppm): δ 178.4, 165.7, 151.7, 149.0, 146.1, 131.3, 129.7, 126.8, 126.1, 125.0, 120.2, 115.5, 108.5, 61.7, 14.5.

HRMS (ESI+) [M+Na]$^+$ calcd for C$_{46}$H$_{37}$N$_2$O$_4$BF$_2$Na$^+$ m/z=753.2712, found m/z=753.2716.

In a 50 mL flask, the mixture of 2,4-pentanedione (150 µL, 1.463 mmol, 1 eq) and BF$_3$Et$_2$O (199 µL, 1.609 mmol, 1.1 eq) in 3 mL ethyl acetate was heated for 30 min at 50-60° C. in air. Dissolved 4-(N,N-Diphenylamino)-benzaldehyde (1 g, 3.658 mmol, 2.5 eq) and B(n-OBu)$_3$ (0.987 mL, 3.658 mmol, 2.5 eq) into 12 mL ethyl acetate, then the solution was injected into the first mixture. Kept the reaction at 50-60° C. for another 30 min. First portion of BuNH$_2$ (58 µL, 0.585 mmol, 0.4 eq) was added dropwise into the reaction. After 6 h heating, second portion of BuNH$_2$ (29 µL, 0.293 mmol, 0.2 eq) was added, and the reaction was kept heating at 50-60° C. overnight. All the solvents were evaporated. The crude product could be obtained by flash column chromatography (silica, CH$_2$Cl$_2$) mixed with few ligand and aldehyde. The further purification was done by many times' precipitation in CH$_2$Cl$_2$/petroleum ether, giving dark green powder (700 mg, 72% yield).

$^1$H NMR (400 MHz, CDCl$_3$, ppm): δ 7.95 (d, $^3$J=15.4 Hz, 2H), 7.43 (d, $^3$J=8.8 Hz, 4H), 7.33 (m, 8H), 7.15 (m, 12H), 6.98 (d, $^3$J=8.8 Hz, 4H), 6.51 (d, $^3$J=15.4 Hz, 2H), 5.96 (s, 1H).

$^{13}$C NMR (400 MHz, CDCl$_3$, ppm): δ 178.6, 151.3, 146.4, 146.2, 130.7, 129.6, 126.7, 126.0, 124.8, 120.5, 117.3, 101.7.

HRMS (ESI+) [M+H]$^+$ calcd for C$_{43}$H$_{34}$N$_2$O$_2$BF$_2$$^+$ m/z=659.2681, found m/z=659.2683.

(Synthesis Example 3) Synthesis of Compound 3

Compound 3

![Compound 3 structure]

(Synthesis Example 4) Synthesis of Compound 4

Compound 4

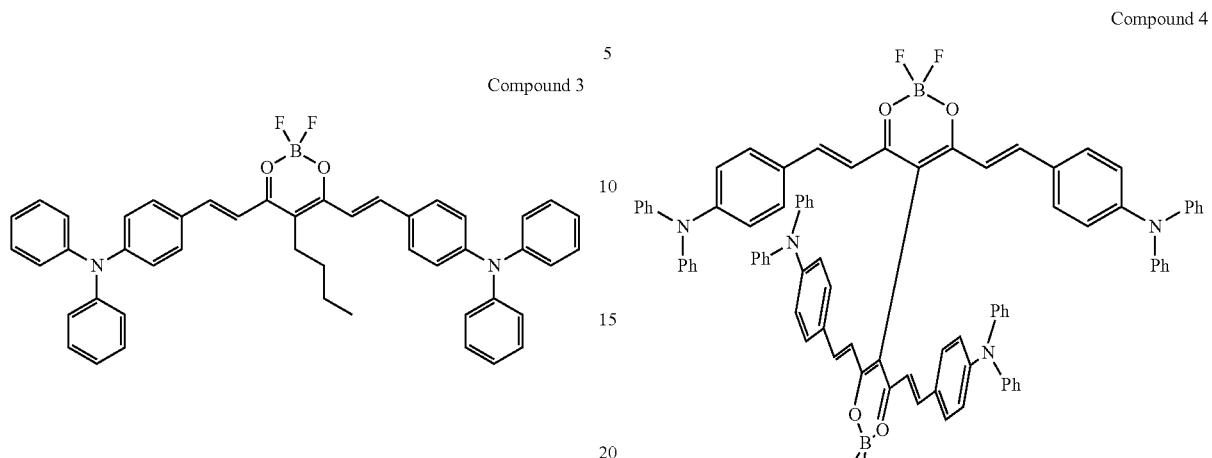

In a 50 mL flask, the mixture of 3-n-Butyl-2,4-pentanedione (246 μL, 1.463 mmol, 1 eq) and $BF_3Et_2O$ (199 μL, 1.609 mmol, 1.1 eq) in 3 mL ethyl acetate was heated for 30 min at 60-70° C. in air. Dissolved 4-(N,N-Diphenylamino)-benzaldehyde (1 g, 3.658 mmol, 2.5 eq) and $B(n-OBu)_3$ (0.987 mL, 3.658 mmol, 2.5 eq) into 15 mL ethyl acetate, then the solution was injected into the first mixture. Kept the reaction at 60-70° C. for another 30 min. First portion of $BuNH_2$ (58 μL, 0.585 mmol, 0.4 eq) was added dropwise into the reaction. After 6 h heating, second portion of $BuNH_2$ (29 μL, 0.293 mmol, 0.2 eq) was added, and the reaction was kept heating at 60-70° C. overnight. All the solvents were evaporated. The crude product could be obtained by flash column chromatography (silica, $CH_2Cl_2$) mixed with few ligand and aldehyde. The further purification was done by many times' precipitation in $CH_2Cl_2$/petroleum ether, giving dark green powder (770 mg, 73% yield).

$^1$H NMR (400 MHz, $CDCl_3$, ppm): δ 8.04 (d, $^3J$=15.1 Hz, 2H), 7.45 (d, $^3J$=8.8 Hz, 4H), 7.33 (m, 8H), 7.15 (m, 12H), 7.00 (d, $^3J$=8.7 Hz, 4H), 6.87 (d, $^3J$=15.1 Hz, 2H), 2.54 (t, $^3J$=7.7 Hz, 2H), 1.53 (m, 2H), 1.44 (m, 2H), 0.98 (t, $^3J$=7.2 Hz, 3H). $^{13}$C NMR (400 MHz, $CDCl_3$, ppm): δ 177.0, 151.1, 147.1, 146.3, 130.6, 129.6, 127.2, 126.0, 124.8, 120.6, 114.4, 111.7, 33.5, 25.2, 22.5, 13.9.

HRMS (ESI+) $[M+Na]^+$ calcd for $C_{47}H_{41}N_2O_2BF_2Na^+$ m/z=737.3127, found m/z=737.3126.

In a 100 mL flask, the mixture of 1,1,2,2-tetraacetylethane (500 mg, 2.523 mmol, 1 eq) and $BF_3Et_2O$ (666 μL, 5.297 mmol, 2.1 eq) in 3 mL ethyl acetate was heated for 30 min at 50-60° C. in air. Dissolved 4-(N,N-Diphenylamino)-benzaldehyde (2.90 g, 10.597 mmol, 4.2 eq) and $B(n-OBu)_3$ (2.439 g, 10.597 mmol, 4.2 eq) into 40 mL ethyl acetate, then the solution was injected into the first mixture. Kept the reaction at 50-60° C. for another 30 min. First portion of morpholine (176 μL, 2.018 mmol, 0.8 eq) was added dropwise into the reaction. After 6 h heating, second portion of morpholine (176 μL, 2.018 mmol, 0.8 eq) was added, and the reaction was kept heating at 50-60° C. overnight. All the solvents were evaporated. The crude product could be obtained by flash column chromatography (silica, $CH_2Cl_2$). Further purification was done by many times' precipitation in $CH_2Cl_2$/petroleum ether, giving dark green powder (712 mg, 22% yield).

$^1$H NMR (400 MHz, $CD_2Cl_2$, ppm): δ 8.02 (d, $^3J$=15.2 Hz, 1H), 7.41 (d, $^3J$=9.2 Hz, 2H), 7.32 (m, 4H), 7.14 (m, 6H), 6.69 (d, $^3J$=9.2 Hz, 2H), 6.58 (d, $^3J$=15.2 Hz, 1H); $^{13}$C NMR (400 MHz, $CDCl_3$, ppm): Not soluble enough.

HRMS (ESI+) $[M-H]^-$ calcd for $C_{86}H_{64}N_4O_4B_2F_4CH_3COO^-$ m/z=1373.5214, found m/z=1373.5201.

(Synthesis Example 5) Synthesis of Compound 5

Compound 5

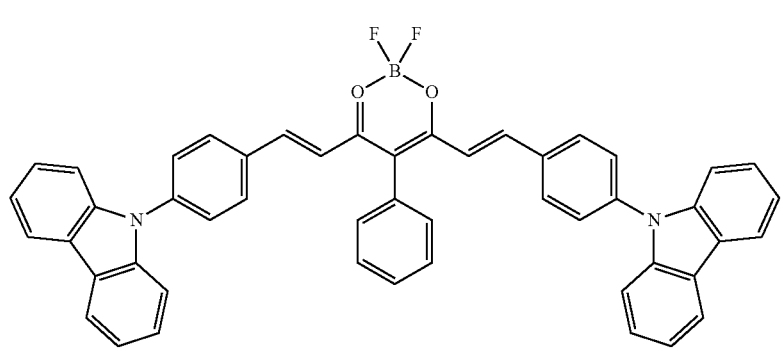

(Synthesis Example 6) Synthesis of Compound 6

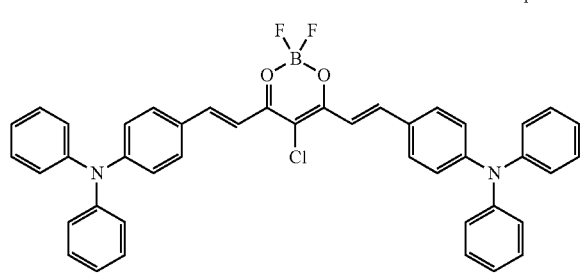

Compound 6

In a 50 mL flask, the mixture of 3-chloro-2,4-pentanedione (197 mg, 1.463 mmol, 1 eq) and $BF_3Et_2O$ (199 µL, 1.609 mmol, 1.1 eq) in 3 mL ethyl acetate was heated for 30 min at 60-70° C. in air. Dissolved 4-(N,N-Diphenylamino)-benzaldehyde (1 g, 3.658 mmol, 2.5 eq) and $B(n-OBu)_3$ (0.987 mL, 3.658 mmol, 2.5 eq) into 15 mL ethyl acetate, then the solution was injected into the first mixture. Kept the reaction at 60-70° C. for another 30 min. First portion of $BuNH_2$ (58 µL, 0.585 mmol, 0.4 eq) was added dropwise into the reaction. After 6 h heating, second portion of $BuNH_2$ (29 µL, 0.293 mmol, 0.2 eq) was added, and the reaction was kept heating at 60-70° C. overnight. All the solvents were evaporated. The crude product could be obtained by flash column chromatography (silica, $CH_2Cl_2$) mixed with few ligand and aldehyde. The further purification was done by many times' precipitation in $CH_2Cl_2$/petroleum ether, giving dark green powder (345 mg, 34% yield).

$^1H$ NMR (400 MHz, $CD_2Cl_2$, ppm): δ 8.01 (d, $^3J$=15.2 Hz, 2H), 7.53 (d, $^3J$=8.8 Hz, 4H), 7.33 (m, 4H), 7.16 (m, 14H), 6.94 (d, $^3J$=9.2 Hz, 4H).

$^{13}C$ NMR (400 MHz, $CD_2Cl_2$, ppm): Not soluble enough.

HRMS (ESI+) $[M+H]^+$ calcd for $C_{43}H_{33}N_2O_2BClF_2^+$ m/z=693.2294, found m/z=693.2296.

(Synthesis Example 7) Synthesis of Compound 7

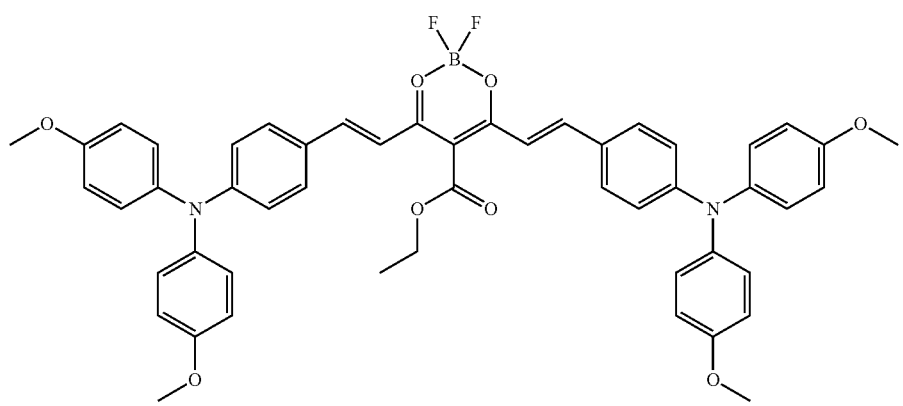

Compound 7

In a 50 mL flask, the mixture of Ethyl diacetoacetate (228 µL, 1.463 mmol, 1 eq) and $BF_3Et_2O$ (199 µL, 1.609 mmol, 1.1 eq) in 3 mL ethyl acetate was heated for 30 min at 50-60° C. in air. Dissolved 4-[Bis(4-methoxyphenyl)amino]benzaldehyde (1 g, 3.000 mmol, 2.05 eq) and $B(n-OBu)_3$ (0.987 mL, 3.658 mmol, 2.5 eq) into 12 mL ethyl acetate, then the solution was injected into the first mixture. Kept the reaction at 50-60° C. for another 30 min. First portion of morpholine (51 µL, 0.585 mmol, 0.4 eq) was added dropwise into the reaction. After 6 h heating, second portion of morpholine (51 µL, 0.585 mmol, 0.4 eq) was added, and the reaction was kept heating at 50-60° C. overnight. All the solvents were evaporated. The crude product could be obtained by flash column chromatography (silica, $CH_2Cl_2$). Further purification was done by many times' precipitation in $CH_2Cl_2$/petroleum ether, giving dark green powder (318 mg, 26% yield).

$^1H$ NMR (400 MHz, $CD_2Cl_2$, ppm): δ 8.04 (d, $^3J$=15.2 Hz, 2H), 7.44 (d, $^3J$=8.9 Hz, 4H), 7.13 (d, $^3J$=8.9 Hz, 8H), 7.07 (d, $^3J$=14.8 Hz, 2H), 6.90 (d, $^3J$=9.1 Hz, 8H), 6.80 (d, $^3J$=9.1 Hz, 4H), 4.40 (q, $^3J$=7.0 Hz, 2H), 3.80 (s, 12H), 1.40 (t, $^3J$=7.1 Hz, 2H).

$^{13}C$ NMR (400 MHz, $CDCl_3$, ppm): Not soluble enough.

HRMS (ESI+) $[M+Na]^+$ calcd for $C_{50}H_{45}N_2O_8BF_2Na^+$ m/z=873.3135, found m/z=873.3136.

(Synthesis Example 8) Synthesis of Compound 8

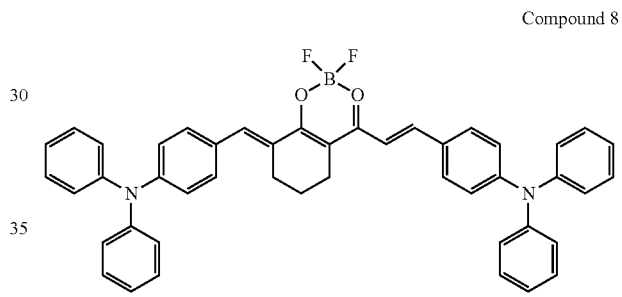

Compound 8

In a 50 mL flask, the mixture of 2-acetylcyclohexanone (193 µL, 1.463 mmol, 1 eq) and $BF_3Et_2O$ (199 µL, 1.609 mmol, 1.1 eq) in 3 mL ethyl acetate was heated for 30 min at 50-60° C. in air. Dissolved 4-(N,N-Diphenylamino)-benzaldehyde (1 g, 3.658 mmol, 2.5 eq) and $B(n-OBu)_3$ (0.987 mL, 3.658 mmol, 2.5 eq) into 12 mL ethyl acetate, then the solution was injected into the first mixture. Kept the reaction at 50-60° C. for another 30 min. Morpholine (101 µL, 1.170 mmol, 0.8 eq) was added dropwise into the reaction. The reaction was kept heating at 50-60° C. overnight. All the solvents were evaporated. The crude product could be obtained by flash column chromatography (silica, CH$_2$Cl$_2$) mixed with few ligand and aldehyde. The further purification was done by many times' precipitation in CH$_2$Cl$_2$/petroleum ether, giving dark green powder (860 mg, 84% yield).

$^1$H NMR (400 MHz, CDCl$_3$, ppm): δ 8.05 (d, J=15.2 Hz, 1H), 8.02 (s, 1H), 7.47 (d, J=8.8 Hz, 2H), 7.39-7.29 (m, 10H), 7.18-7.10 (m, 12H), 7.01 (d, J=8.8 Hz, 2H), 6.99 (d, J=8.8 Hz, 2H), 6.84 (d, J=15.2 Hz, 1H), 2.81 (t, J=5.3 Hz, 2H), 2.65 (t, J=6.0 Hz, 2H), 1.86-1.84 (m, 2H).

$^{13}$C NMR (100 MHz, CDCl$_3$, ppm): δ 151.4, 149.3, 147.6, 146.6, 146.2, 140.0, 132.7, 130.9, 129.6, 129.5, 128.4, 128.2, 126.0, 125.7, 124.9, 124.4, 120.7, 120.5, 113.7, 27.1, 23.4, 22.1.

HRMS (ESI+) [M+H]$^+$ calcd for C$_{46}$H$_{38}$N$_2$O$_2$BF$_2^+$ m/z=699.2994, found m/z=699.2995.

(Synthesis Example 9) Synthesis of Compound 9

In a 50 mL flask, the mixture of 2,4-pentanedione 36 μL, 0.347 mmol, 1 eq) and BF$_3$.Et$_2$O (47 μL, 0.382 mmol, 1.1 eq) in 1 mL ethyl acetate was heated for 30 min at 60-70° C. in air. Dissolved 7-(diphenylamino)-9,9-dihexyl-9H-fluorene-2-carbaldehyde (460 mg, 0.868 mmol, 2.5 eq) and B(n-OBu)$_3$ (0.234 mL, 0.868 mmol, 2.5 eq) into 3 mL ethyl acetate, then the solution was injected into the first mixture. Kept the reaction at 60-70° C. for another 30 min. morpholine (48 μL, 0.555 mmol, 1.6 eq) was added dropwise into the reaction and the reaction was kept heating at 60-70° C. overnight. All the solvents were evaporated. The crude product could be obtained by flash column chromatography (silica, CH$_2$Cl$_2$) mixed with few ligand and aldehyde. The second column chromatography (silica, cyclohexane:ethyl acetate=100:1) was done to obtain product. Then precipitation in methanol was done to give dark purple powder (40 mg, 10% yield).

$^1$H NMR (400 MHz, CDCl$_3$, ppm): δ 8.15 (d, J=15.4 Hz, 2H), 7.65-7.52 (m, 8H), 7.29-7.25 (m, 8H), 7.14-7.02 (m, 16H), 6.75 (d, J=15.5 Hz, 2H), 6.12 (s, 1H), 1.95-1.81 (m, 8H), 1.16-1.07 (m, 24H), 0.80 (t, J=7.1 Hz, 12H), 0.66 (broad, 8H).

$^{13}$C NMR (100 MHz, CDCl$_3$, ppm): δ 179.3, 153.3, 151.5, 148.6, 148.0, 147.7, 145.4, 134.5, 132.1, 129.3, 128.9, 124.3, 123.5, 123.1, 122.9, 121.3, 119.6, 119.0, 118.3, 55.1, 40.1, 31.5, 29.6, 23.8, 22.5, 14.0.

HRMS (ESI+) [M+H]$^+$ calcd for C$_{81}$H$_{90}$N$_2$O$_2$BF$_2^+$ m/z=1171.7063, found m/z=1171.7064.

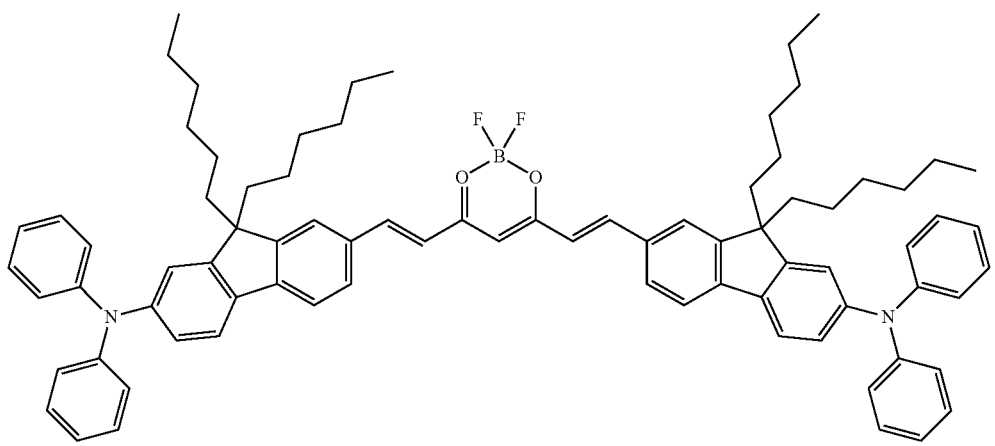

Compound 9

(Synthesis Example 10) Synthesis of Compound 10

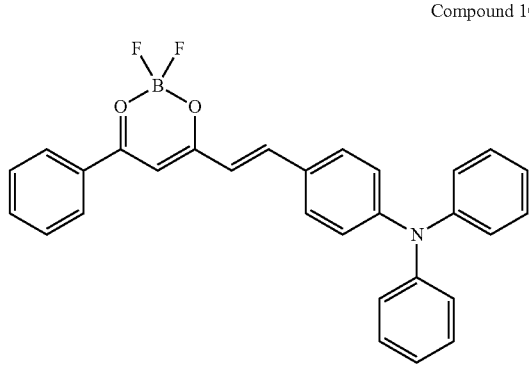

Compound 10

In a 50 mL flask, the mixture of benzoylacetone (475 mg, 2.926 mmol, 1 eq) and $BF_3 \cdot Et_2O$ (398 μL, 3.219 mmol, 1.1 eq) in 3 mL ethyl acetate was heated for 30 min at 50-60° C. in air. Dissolved 4-(N,N-diphenylamino)-benzaldehyde (1 g, 2.658 mmol, 1.25 eq) and $B(n\text{-}OBu)_3$ (0.987 mL, 3.658 mmol, 1.25 eq) into 12 mL ethyl acetate, then the solution was injected into the first mixture. The reaction was stirred at 50-60° C. for another 30 min. First portion of $BuNH_2$ (58 μL, 0.585 mmol, 0.4 eq) was added dropwise into the reaction. After 6 h heating, second portion of $BuNH_2$ (29 μL, 0.293 mmol, 0.2 eq) was added, and the reaction was kept heating at 50-60° C. overnight. All the solvents were evaporated. The crude product could be obtained by flash column chromatography (silica, $CH_2Cl_2$) mixed with few ligand and aldehyde. The further purification was done by precipitating three times from $CH_2Cl_2$/petroleum ether, giving dark red powder (997 mg, 73% yield).

Light Emission

Example 1

Solutions

Compound 1 was dissolved in the following solvents to prepare solutions (concentration: $10^{-5}$ mol/L):

Cyclohexane (CycloH)

Butyl ether ($Bu_2O$)

Ethyl ether ($Et_2O$)

Ethyl acetate (AcOEt)

Dichloromethane (DCM)

Acetone (Acetone)

Acrylonitrile (ACN)

The solutions were irradiated with light under nitrogen bubbling at room temperature, and thus light emission was observed. FIGS. 2 and 3 show normalized electronic absorption and fluorescence emission spectra of the solutions of Compound 1, respectively. The absorption wavelengths $\lambda_{abs}$ (nm), the light emission wavelengths $\lambda_{em}$ (nm), the Stokes shifts $\Delta v_{ST}$ (cm$^{-1}$) and the quantum yields $\Phi_f$ are shown in Table 1.

TABLE 1

Compound 1

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 571 | 597 | 763 | 0.425 |
| Bu$_2$O | 581 | 638 | 1538 | 0.514 |
| Et$_2$O | 584 | 660 | 1972 | 0.426 |
| AcOEt | 590 | 705 | 2765 | 0.035 |
| DCM | 614 | 766 | 3232 | 0.021 |
| Acetone | 604 | 765 | 3484 | 0.011 |
| ACN | 610 | 795 | 3815 | 0.001 |

In the same manner, the solutions of Compounds 2 to 7 and 10 were prepared and light emission was observed. The absorption wavelengths $\lambda_{abs}$ (nm), the light emission wavelengths $\lambda_{em}$ (nm), the Stokes shifts $\Delta v_{ST}$ (cm$^{-1}$) and the quantum yields $\Phi_f$ of the solutions of Compounds 2 to 7 and 10 are shown in Tables 2 to 8, respectively. In the tables, THF denotes tetrahydrofuran; AcOBu denotes butyl acetate; DCE denotes 1,2-dichloroethane; and BuCN denotes 1-cyanobutane.

TABLE 2

Compound 2

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 560 | 583 | 704 | 0.494 |
| CCl$_4$ | 565 | 601 | 1060 | 0.34 |
| Bu$_2$O | 564 | 614 | 1444 | 0.592 |
| Et$_2$O | 562 | 635 | 2046 | 0.546 |
| AcOEt | 568 | 677 | 2835 | 0.138 |
| DCM | 595 | 735 | 3201 | 0.07 |
| Acetone | 580 | 730 | 3543 | 0.0035 |
| ACN | 583 | 770 | 4166 | 0.0007 |

TABLE 3

Compound 3

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 566 | 591 | 747 | 0.485 |
| Bu$_2$O | 574 | 619 | 1267 | 0.516 |
| Et$_2$O | 574 | 636 | 1698 | 0.52 |
| AcOEt | 578 | 675 | 2486 | 0.166 |
| DCM | 602 | 732 | 2950 | 0.11 |
| Acetone | 589 | 728 | 3242 | 0.004 |
| ACN | 592 | 768 | 3871 | 0.001 |

TABLE 4

Compound 4

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 616 | 649 | 825 | 0.41 |
| CCl$_4$ | 630 | 670 | 948 | 0.397 |
| Bu$_2$O | 624 | 683 | 1384 | 0.364 |
| Et$_2$O | 624 | 706 | 1861 | 0.222 |
| Chloroform | 657 | 759 | 2045 | 0.172 |
| AcOEt | 627 | 762 | 2826 | 0.01 |
| THF | 633 | 767 | 2760 | 0.011 |
| DCM | 654 | 788 | 2600 | 0.013 |

TABLE 5

Compound 5

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 514 | 540 | 964 | 0.455 |
| Bu$_2$O | 511 | 585 | 2475 | 0.520 |
| Et$_2$O | 506 | 607 | 3288 | 0.441 |
| Chloroform | 524 | 652 | 3747 | 0.362 |
| AcOBu | 507 | 642 | 4148 | 0.117 |
| AcOEt | 504 | 668 | 4871 | 0.035 |
| DCM | 516 | 709 | 5275 | 0.026 |
| DCE | 519 | 716 | 5301 | 0.011 |
| BuCN | 508 | 758 | 6492 | 0.0008 |
| Acetone | 507 | 763 | 6618 | 0.0007 |
| ACN | 507 | 805 | 7302 | 0.0002 |

TABLE 6

Compound 6

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 601 | 626 | 664 | 0.441 |
| CCl$_4$ | 612 | 650 | 955 | 0.26 |
| Bu$_2$O | 611 | 664 | 1306 | 0.513 |
| Et$_2$O | 613 | 685 | 1715 | 0.32 |
| AcOEt | 623 | 723 | 2220 | 0.03 |
| DCM | 667 | 785 | 2254 | 0.02 |
| Acetone | 634 | 777 | 2903 | 0.001 |
| ACN | 636 | 800 | 3223 | 0.0005 |

TABLE 7

Compound 7

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 590 | 652 | 1612 | 0.422 |
| CCl$_4$ | 602 | 681 | 1927 | 0.365 |
| Bu$_2$O | 600 | 703 | 24412 | 0.054 |
| Et$_2$O | 602 | 715 | 2625 | 0.004 |
| Chloroform | 633 | 800 | 3298 | n.d. |
| AcOEt | 609 | 757 | 3210 | n.d. |
| THF | 617 | 774 | 3288 | n.d. |
| DCM | 635 | 805 | 3326 | n.d. |

TABLE 8

Compound 10

| Solvent | $\lambda_{abs}$ (nm) | $\lambda_{em}$ (nm) | $\Delta v_{ST}$ (cm$^{-1}$) | $\Phi_f$ |
|---|---|---|---|---|
| CycloH | 514 | 542 | 988 | 0.296 |
| CCl$_4$ | 533 | 691 | 4290 | 0.165 |
| Bu$_2$O | 513 | 598 | 2771 | 0.409 |
| Et$_2$O | 511 | 630 | 3696 | 0.353 |
| AcOEt | 515 | 685 | 4819 | 0.033 |
| DCM | 535 | 736 | 5105 | 0.028 |
| Acetone | 520 | 742 | 5754 | 0.001 |
| ACN | 524 | 787 | 6377 | 0.0003 |

The solvent induced bathochromic shifts of the absorption band were observed in Compounds 1 to 7. This shift reveals that the ground state dipole moment is very high (calculated to be 7D by DFT). In the meantime, the solvent induced emission red-shifts were also observed in Compounds 1 to 7. Such positive solvatochromic shift indicates that the local excited state $S_1$ is more polar than its ground state $S_0$ counterpart and that the $S_1$ excited state possesses a strong charge transfer character. This behavior is related to the strong electron-withdrawing effect of the central boron difluoride. These data evidence the strong charge transfer character of the compounds of the formula (1).

Example 2

Thin Films

Solutions of Compound 1 and 4,4'-bis(N-carbazolyl)-1,10-biphenyl (CBP) in various ratios were spin-coated on a precleaned fused silica substrate to form thin films of 100 nm thick. The concentration of Compound 1 in the thin films varied from 2% to 100% by weight. The thin films were irradiated with light at room temperature, and thus light emission was observed. FIGS. 4 and 5 show normalized electronic absorption and fluorescence emission spectra of the thin films of Compound 1, respectively. The absorption wavelengths $\lambda_{abs}$ (nm), the light emission wavelengths $\lambda_{em}$ (nm) and photoluminescence quantum yield (PLQY) are shown in Table 9.

TABLE 9

Compound 1

| Concentration | $\lambda_{abs}$ (nm) | $\lambda_{em}$ (nm) | PLQY |
|---|---|---|---|
| 2 wt. % | 614 | 727 | 0.516 |
| 4 wt. % | 617 | 731 | 0.593 |
| 6 wt. % | 620 | 745 | 0.645 |
| 7 wt. % | 622 | 745 | 0.576 |
| 8 wt. % | 623 | 745 | 0.548 |
| 10 wt. % | 623 | 747 | 0.403 |
| 15 wt. % | 622 | 749 | 0.258 |
| 20 wt. % | 622 | 750 | 0.223 |
| 40 wt. % | 622 | 761 | 0.126 |
| 60 wt. % | 620 | 771 | 0.073 |
| 100 wt. % (Neat) | 613 | 783 | 0.032 |

In the same manner, the thin film of Compound 10 was prepared and light emission was observed. The absorption wavelengths $\lambda_{abs}$ (nm), the light emission wavelengths $\lambda_{em}$ (nm) and photoluminescence quantum yield (PLQY) are shown in Table 10.

TABLE 10

Compound 10

| Concentration | $\lambda_{abs}$ (nm) | $\lambda_{em}$ (nm) | PLQY |
|---|---|---|---|
| 2 wt. % | 543 | 626 | 0.760 |
| 15 wt. % | 540 | 686 | 0.295 |
| 40 wt. % | 539 | 712 | 0.145 |
| 60 wt. % | 534 | 716 | 0.095 |

In the same manner, the thin films of Compounds 2 to 7 were prepared and light emission was observed. FIG. 6(a)-(e) show transient photoluminescence spectra of thin films of Compounds 1 to 5, respectively. The thin films of FIGS. 6(a), (b), (c) and (e) contain Compounds 1, 2, 3 and 5 in 6% by weight and the thin film of FIG. 6(d) contains Compound 4 as shown in the drawing.

The fin films of Compounds 1 to 7 show almost no shift of the absorption of the $S_0$-$S_1$ transition. However, the emission is red-shifted as the doping concentration of Compounds 1 to 7 in the CBP matrix is increased. This bathochromic shift can be related to the red-shift of the emission in solvents of different polarities of Example 1 with the polarity of the CBP blends being due to the increased concentration of the dye.

Example 3

Organic Electroluminescent Devices

An anode of indium tin oxide (ITO) having a thickness of 100 nm was formed on a glass substrate. A poly(3,4-ethylenedioxythiophene):poly(styrenesulfonate) (PEDOT:PSS) solution was spin-coated on ITO to form a layer of 45 nm thick. Subsequently, a solution of Compound 1 and CBP was spin-coated thereon to form a layer of 30 nm thick, which was designated as a light-emitting layer. At this time, the concentration of Compound 1 varied from 2% to 100% by weight. Thin films were laminated on the light-emitting layer by a vacuum vapor deposition method at $4\times10^{-4}$ Pa. Bis{2-[di(phenyl)phosphino]-phenyl}ether oxide (DPEPO) was then formed to a thickness of 10 nm, and 2,2',2"-(1,3,5-benzinetriyl)-tris(1-phenyl-1-H-benzimidazole) (TPBi) was formed to a thickness of 55 nm thereon. Lithium fluoride (LiF) was further vacuum vapor-deposited to a thickness of 1 nm, and then aluminum (Al) was vapor-deposited to a thickness of 100 nm to form a cathode. In the produced organic electroluminescent devices, PEDOT:PSS acts as hole injection layer while DPEPO and TPBi act as hole blocking and electron transport layers, respectively.

In the same manner, Compounds 2 to 8 and 10 were used instead of Compound 1 to produce organic electroluminescent devices of Compounds 2 to 8 and 10, respectively. The light-emitting layer containing Compound 10 was formed in 80 nm thick.

The ionization potential and the optical bandgap of Compounds 1 to 3 were measured by photoelectron spectroscopy in air. The HOMO and LUMO level of Compounds 1 to 3 were about 5.6 and 3.8 eV, respectively.

The electroluminescence (EL) spectra of these organic electroluminescent devices were measured at 100 mA/cm². They were almost identical to the PL spectra of the corresponding thin films. For example, the light emission spectra of the organic electroluminescent devices containing Compound 1 are shown in FIG. 7. Noticeably, the EL spectra are red-shifting when the doping concentration is increased, which is fully consistent with the behavior of the PL spectra. FIG. 8 shows the voltage-electric current density characteristics and FIG. 9 shows the electric current density-external quantum efficiency characteristics of the organic electroluminescent devices containing Compound 1. The device data of the organic electroluminescent devices containing Compounds 1 to 8 are summarized in Tables 11 to 19, respectively (Turn on: 1 $Wsr^{-1}$ $m^{-2}$).

TABLE 11

Compound 1

| Concentration | $EQE_{MAX.}$ | $\lambda_{MAX}$ (nm) | Turn-on (V) |
|---|---|---|---|
| 2 wt. % | 8.45 | 723 | 8.1 |
| 4 wt. % | 8.74 | 727 | 8.0 |
| 6 wt. % | 9.74 | 739 | 7.4 |
| 7 wt. % | 8.15 | 739 | 8.2 |
| 8 wt. % | 5.57 | 741 | 7.4 |
| 10 wt. % | 3.33 | 743 | 7.3 |
| 15 wt. % | 2.04 | 746 | 6.8 |
| 20 wt. % | 1.49 | 752 | 6.8 |
| 40 wt. % | 0.74 | 758 | 6.1 |
| 60 wt. % | 0.38 | 782 | 6.0 |
| 100 wt. % | 0.28 | 782 | 5.5 |

TABLE 12

Compound 2

| Concentration | $EQE_{MAX.}$ | $\lambda_{MAX}$ (nm) | Turn-on (V) |
|---|---|---|---|
| 1 wt. % | 3.45 | 673 | 8.1 |
| 2 wt. % | 3.50 | 684 | 8.2 |
| 4 wt. % | 4.0 | 696 | 8.5 |
| 6 wt. % | 3.63 | 705 | 8.2 |
| 8 wt. % | 2.89 | 710 | 7.8 |

TABLE 13

Compound 3

| Concentration | $EQE_{MAX.}$ | $\lambda_{MAX}$ (nm) | Turn-on (V) |
|---|---|---|---|
| 1 wt. % | 2.80 | 684 | 9.3 |
| 2 wt. % | 2.76 | 687 | 11.3 |
| 4 wt. % | 3.71 | 697 | 10.3 |
| 6 wt. % | 3.42 | 703 | 11.6 |
| 8 wt. % | 2.90 | 708 | 9.6 |

TABLE 14

Compound 4

| Concentration | $EQE_{MAX.}$ | $\lambda_{MAX}$ (nm) | Turn-on (V) |
|---|---|---|---|
| 1 wt. % | 4.42 | 754 | 8.6 |
| 2 wt. % | 5.10 | 758 | 8.0 |
| 3 wt. % | 4.75 | 761 | 8.4 |
| 4 wt. % | 4.73 | 763 | 8.5 |
| 6 wt. % | 3.47 | 767 | 8.6 |
| 7 wt. % | 3.31 | 771 | 8.4 |
| 8 wt. % | 3.09 | 773 | 8.2 |
| 15 wt. % | 1.36 | 781 | 5.5 |
| 20 wt. % | 0.51 | 785 | 5.3 |
| 25 wt. % | 0.40 | 788 | 5.4 |
| 30 wt. % | 0.36 | 791 | 5.5 |
| 40 wt. % | 0.30 | 796 | 5.5 |

TABLE 15

Compound 5

| Concentration | $EQE_{MAX.}$ | $\lambda_{MAX x}$ (nm) | Turn-on (V) |
|---|---|---|---|
| 2 wt. % | 2.82 | 633 | 6.2 |
| 4 wt. % | 3.60 | 639 | 6.6 |
| 6 wt. % | 3.52 | 646 | 6.9 |
| 8 wt. % | 1.93 | 651 | 5.9 |
| 10 wt. % | 1.22 | 653 | 5.6 |
| 20 wt. % | 0.22 | 657 | 6.0 |
| 40 wt. % | 0.04 | 662 | 6.0 |

TABLE 16

Compound 6

| Concentration | $EQE_{MAX.}$ (±0.5%) | $\lambda_{MAX}$ (nm) | Turn-on (V) |
|---|---|---|---|
| 1 wt. % | 3.55 | 731 | 8.0 |
| 2 wt. % | 3.89 | 737 | 8.5 |
| 4 wt. % | 3.65 | 744 | 8.6 |
| 6 wt. % | 4.14 | 751 | 8.4 |
| 8 wt. % | 3.46 | 754 | 7.7 |

TABLE 17

Compound 7

| Concentration | $EQE_{MAX.}$ (±0.5%) | $\lambda_{MAX}$ (nm) | Turn-on (V) |
|---|---|---|---|
| 4 wt. % | 3.51 | 765 | 6.3 |
| 8 wt. % | 1.33 | 791 | 6.1 |

TABLE 18

Compound 8

| Concentration | MAX. EQE | $\lambda_{MAX}$ (nm) | Turn-on (V) |
|---|---|---|---|
| 1 wt. % | 2.51% | 680 | 8.0 |
| 2 wt. % | 2.25% | 691 | 8.5 |
| 4 wt. % | 2.27% | 703 | 8.0 |
| 6 wt. % | 1.74% | 706 | 8.7 |

TABLE 19

Compound 10

| Concentration | $EQE_{MAX}$ | $\lambda_{MAX}$ (nm) |
|---|---|---|
| 2 wt. % | 2.1 | 643 |
| 15 wt. % | 1.8 | 697 |
| 40 wt. % | 0.7 | 725 |
| 60 wt. % | 0.4 | 750 |

The most efficient device fabricated in this example exhibit a maximum external quantum efficiency of nearly 10% with maximum emission in NIR region without use of any light outcoupling enhancement structure, which is well above the theoretical upper limit for conventional fluorescent organic electroluminescent devices. Such a great achievement is mainly due to the high PLQY of this blend and its TADF activity.

Example 4

ASE Laser

The thin films of Compounds 2 and 6 and 10 produced in Example 2 were used to evaluate their potential for organic lasers. The thin films were photo-excited by a pulsed nitrogen laser at 337 nm, where the CBP host strongly absorbs light. The pulse duration of the pump laser is about 800 ps and its repetition rate is 8 Hz. The pump intensity is controlled using a set of neutral density filters. The pump beam is focused into a 0.5 cm×0.08 cm stripe. An optical fiber connected to a charge-coupled device spectrometer was used to measure the emission spectra from the edge of the organic layers. The experimental configuration is schematically represented in FIG. 10.

FIG. 11 shows the emission spectra of the CBP: Compound 2 (94:6 wt. %) and CBP: Compound 2 (90:10 wt. %) blend films above ASE threshold. Similarly to what was observed for the PL and EL spectra, these results show the possibility to tune the ASE wavelength by changing the doping concentration in the CBP host. FIG. 12 displays the emission spectra of the 6 wt. % CBP blend measured at various pump intensity below and above the threshold. At low excitation intensities, the PL spectra were broad and independent of the pump intensity. At high excitation intensities, ASE occurred and a spectral narrowing of the emission band was observed. Amplification occurred at about 750 nm in this representative blend film. Above the ASE threshold, the full-width-at-half-maximum (FWHM) dropped in this sample down to 17 nm. This ASE effect is due to spontaneously emitted photons, which are waveguided in the film and amplified by stimulated emission. FIG. 13 shows the output light intensity emitted from the edge of the blend film, integrated over all wavelengths, as a function of the excitation intensity. The abrupt change in slope efficiency is directly associated to the ASE threshold.

In the case of CBP: Compound 2 (94:6 wt. %) blend film, the ASE threshold was determined to be around 12 $\mu J/cm^2$. Although such a value is higher than the lowest ASE thresholds typically reported in blue-emitting thin films (which are around 0.3-0.4 $\mu J/cm^2$) [see Li Zhao, Munetomo Inoue, Kou Yoshida, Atula S. D. Sandanayaka, Ju-Hyung Kim, Jean-Charles Ribierre and Chihaya Adachi, *IEEE J. Sel. Topics Quantum Electron.*, 2016, 22, 1; and Atula S. D. Sandanayaka, Kou Yoshida, Munetomo Inoue, Chuanjiang Qin, Kenichi Goushi, Jean-Charles Ribierre, Toshinori Matsushima and Chihaya Adachi, *Adv. Opt. Mater.*, 2016, 4, 834-839], this measured ASE threshold together with the broad PL spectra in the NIR region of this sample show great promise for the future realization of efficient and tunable NIR solid-state lasers.

The ASE properties were also examined in the thin films of CBP/Compound 6 blends with different dye doping concentrations varying from 4 to 40 wt. %. As shown in Table 20, these thin films showed ASE activity with a peak wavelength red-shifting from 804 to 860 nm as the dye concentration was increased. As expected from the PL spectra of the different blends, this result demonstrates that Compound 6 can be used in organic solid-state lasers operating at longer wavelengths than those based on Compound 2. The ASE thresholds are then measured as a function of the doping concentration. As summarized in Table 20, the concentration dependence of the ASE threshold follows the same trend as that of the PLQY value with a gradual increase from 14.8 to 91 $\mu J/cm^2$ as the doping concentration increases from 4 to 40 wt. %.

In the same manner, the ASE properties were also examined in the thin films of CBP/Compound 10 blends with different dye doping concentrations varying from 2 to 60 wt. %. As shown in Table 21, these thin films showed ASE activity with a peak wavelength red-shifting from 643 to 750 nm as the dye concentration was increased. The ASE threshold gradually increases from 143 to 22 $\mu J/cm^2$ as the doping concentration increases from 2 to 60 wt. %.

Overall, these results demonstrate for the first time that the compounds of the formula (1) are extremely promising candidates for high performance organic semiconductor lasers operating in the NIR region of the electromagnetic spectrum. These findings also show that lasing in TADF materials is possible.

TABLE 20

Compound 6

| | $E_{th}$ ($\mu J/cm^2$) | FWHM (nm) | $\lambda_{em}$ (nm) |
|---|---|---|---|
| 4 wt. % | 14.84 | 13.03 | 804 |
| 6 wt. % | 16.73 | 10.97 | 812 |
| 8 wt. % | 22.68 | 10.16 | 825 |
| 20 wt. % | 41.85 | 10.82 | 840 |
| 40 wt. % | 91.38 | 11.03 | 860 |

TABLE 21

Compound 10

| | $E_{th}$ ($\mu J/cm^2$) | FWHM (nm) | $\lambda_{em}$ (nm) |
|---|---|---|---|
| 2 wt. % | 643 | 13 | 225 |
| 15 wt. % | 697 | 19 | 215 |
| 40 wt. % | 725 | 21 | 189 |
| 60 wt. % | 750 | 22 | 192 |

Example 5

Distributed Feedback Laser (DFB Laser)

(1) Fabrication of DFB Laser

Glass substrates were cleaned by ultrasonication using neutral detergent, pure water, acetone, and isopropanol followed by UV-ozone treatment. A 100-nm-thick layer of $SiO_2$, which would become the DFB grating, was sputtered at 100° C. onto glass substrates. The argon pressure during the sputtering was 0.66 Pa. The RF power was set at 100 W. Substrates were cleaned by ultrasonication using isopropanol followed by UV-ozone treatment. The $SiO_2$ surfaces were treated with hexamethyldisilazane (HMDS) by spin coating at 4,000 rpm for 15 s and annealed at 120° C. for 120 s. A resist layer with a thickness of around 70 nm was spin-coated on the substrates at 4,000 rpm for 30 s from a ZEP520A-7 solution (ZEON Co.) and baked at 180° C. for 240 s.

Electron beam lithography was performed to draw grating patterns on the resist layer using a JBX-5500SC system (JEOL) with an optimized dose of 0.1 nC cm$^{-2}$. After the electron beam irradiation, the patterns were developed in a developer solution (ZED-N50, ZEON Co.) at room temperature. The patterned resist layer was used as an etching mask while the substrate was plasma etched with $CHF_3$ using an EIS-200ERT etching system (ELIONIX). To completely remove the resist layer from the substrate, the substrate was plasma-etched with $O_2$ using a FA-1EA etching system (SAMCO). The etching conditions were optimized to completely remove the $SiO_2$ from the grooves in the DFB until the $SiO_2$ surfaces were exposed. The gratings formed on the $SiO_2$ surfaces were observed with SEM (SU8000, Hitachi). EDX (at 6.0 kV, SU8000, Hitachi) analysis was performed to confirm complete removal of $SiO_2$ from ditches in the DFB. Cross section SEM was measured by Kobelco using a cold-field-emission SEM (SU8200, Hitachi High-Technologies). The gratings composed of second-order Bragg scattering regions surrounded by first-order scattering regions were thus prepared onto $SiO_2$ over 5×5 mm$^2$ area (FIG. 14). Grating periods ($\Lambda$) of the first- and second-order regions were 230 nm and 460 nm, respectively, which were chosen based on the Bragg condition:

$$m\lambda_{Bragg} = 2n_{Eff}\Lambda_m$$

where m is the order of diffraction, $\lambda_{Bragg}$ is the Bragg wavelength, and $n_{eff}$ is the effective refractive index of the gain medium.

The DFB substrates were cleaned by conventional ultrasonication. A chloroform solution of Compound 1 and 4,4'-bis(N-carbazolyl)-1,10-biphenyl (CBP) (weight ratio, 6:94) was spin-coated on top of the DFB substrates to form a light-emitting layer. A 2 μm thick CYTOP polymer layer was directly formed on top the structure by spin-coating and then covered by a sapphire lid with a thermal conductivity of 25 W m$^{-1}$ K$^{-1}$ at 300 K to fabricate a mixed-order DFB laser with the structure glass/$SiO_2$/6 wt % Compound 1:CBP/CYTOP/sapphire lid.

(2) Performances of DFB Laser

The performances of the fabricated DFB laser were first examined using for the optical pumping a nitrogen-gas laser emitting 800 ps pulses at a repetition rate of 20 Hz. The excitation wavelength was 337 nm, which means that most of the excitation light is absorbed by the CBP host. The substantial spectral overlap between the fluorescence spectrum of CBP and the absorption spectrum of the NIR emitter indicates that an effective Förster-type energy transfer takes place in the light-emitting layer from the CBP host to the laser dye. This is well-supported by the extremely weak emission from CBP in the steady-state photoluminescence spectrum. The emission spectra measured normal to the surface of the organic DFB laser for different excitation intensities are shown in FIG. 15. The spectra at low excitation intensities display a Bragg dip at the wavelength corresponding to the optical stopband of the mixed-order DFB grating. As the excitation intensity is gradually increased above 1 μJ/cm$^2$, a narrow emission peak is observed at the wavelength of 751 nm, with an intensity increasing faster than the spontaneous emission background. Noticeably, this narrow DFB laser emission with a full-width-at-half-maximum (FWHM) around 1 nm takes place at the long-wavelength edge of the Bragg dip. The output intensity is plotted as a function of the excitation intensity in FIG. 16. The observation of a clear change of slope is a signature of a lasing threshold, which is found to be around 1.28 μJ/cm$^2$ (366 W/cm$^2$). This lasing threshold value is lower than that of the ASE threshold shown in Table 22. It should be emphasized that this is the first demonstration of NIR lasing from an organic semiconductor laser and the threshold value is significantly lower than those previously reported in NIR organic solid-state lasers based on insulating polymeric host doped with commercially available laser dyes. It should also be emphasized that the upconversion rates via reverse intersystem crossing for the NIR TADF dye used in the present invention are in the order of tenth and hundredth of ps. This implies that the 800 ps photo-excitation pulses used to optically pump the DFB laser are too short to obtain a contribution of the triplets for lasing action. In other words, the use of longer excitation pulses (with a time width at least comparable to the inverse of the reverse intersystem crossing rate) is necessary to achieve an upconversion from triplet to singlet via reverse intersystem crossing in the organic semiconductor DFB laser.

TABLE 22

| Type | λ (nm) | E th (μJ/cm$^2$) | FWHM (nm) |
|---|---|---|---|
| ASE | 750 | 7.00 (2000 W/cm$^2$) | 10.0 |
| Mixed order DFB | 751 | 1.28 (366 W/cm$^2$) | 1.40 |

The performances of the DFB Laser fabricated in (1) above were then investigated for different long pulse durations varying from 10 μs to 500 seconds. For this purpose, the device was optically-pumped by a CW laser diode emitting at 355 nm with a maximum power of 20 mW. Streak camera images of the emission in the direction normal to the substrate were recorded for a high excitation intensity of 1.3 kW/cm$^2$ and 6 different pulse durations. The corresponding emission spectra are displayed in FIG. 17. These data demonstrate that the DFB laser works properly above threshold, without any strong changes observed in terms of emission wavelength and with an outstanding stability, for excitation pulse duration at least as long as 350 s.

Figure 18B:
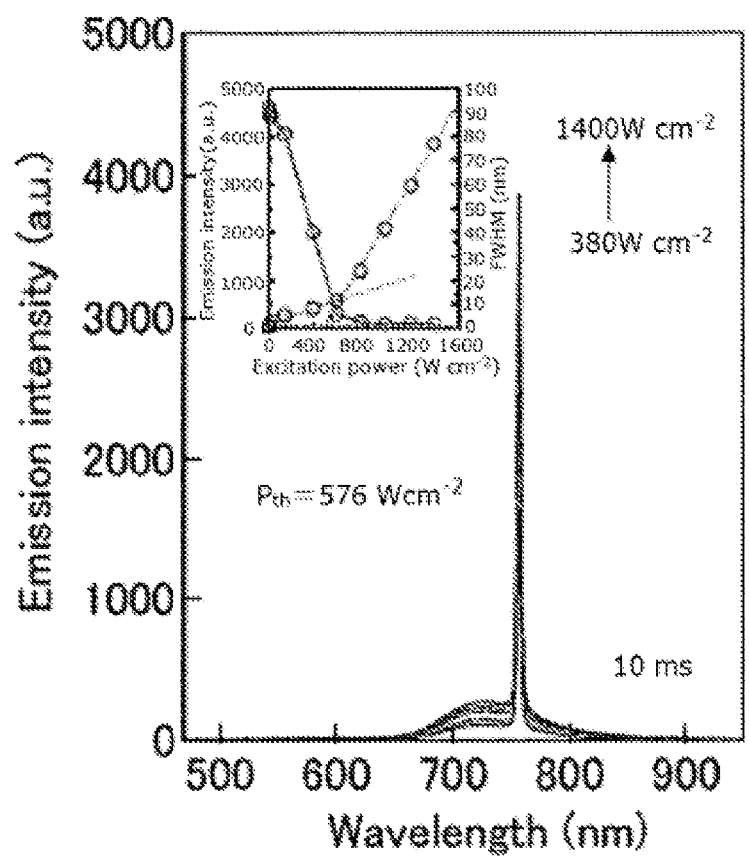
Figure 18C:
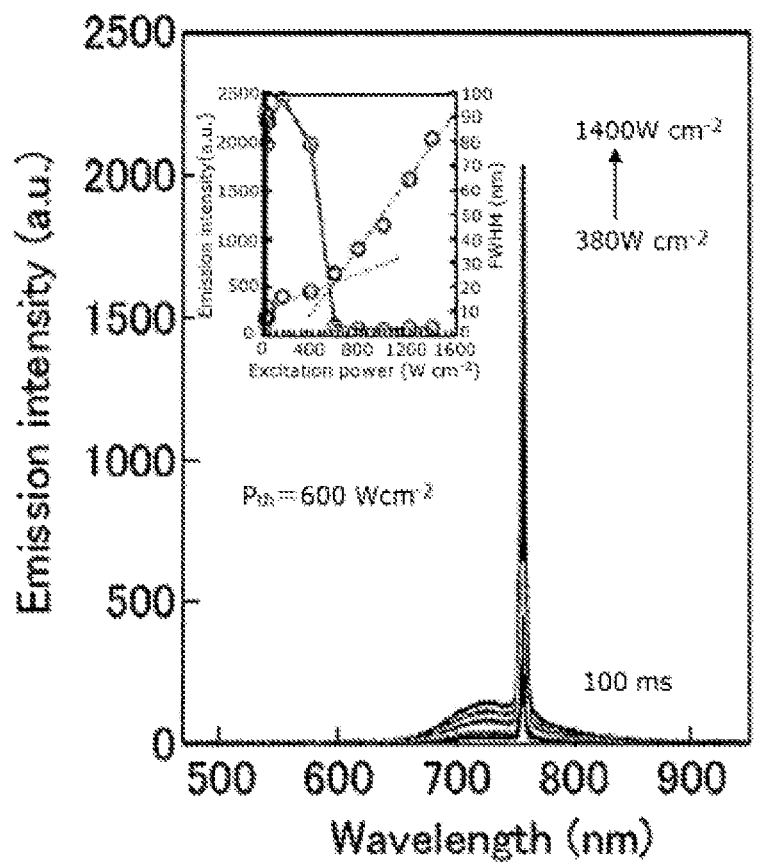
Figure 18D:
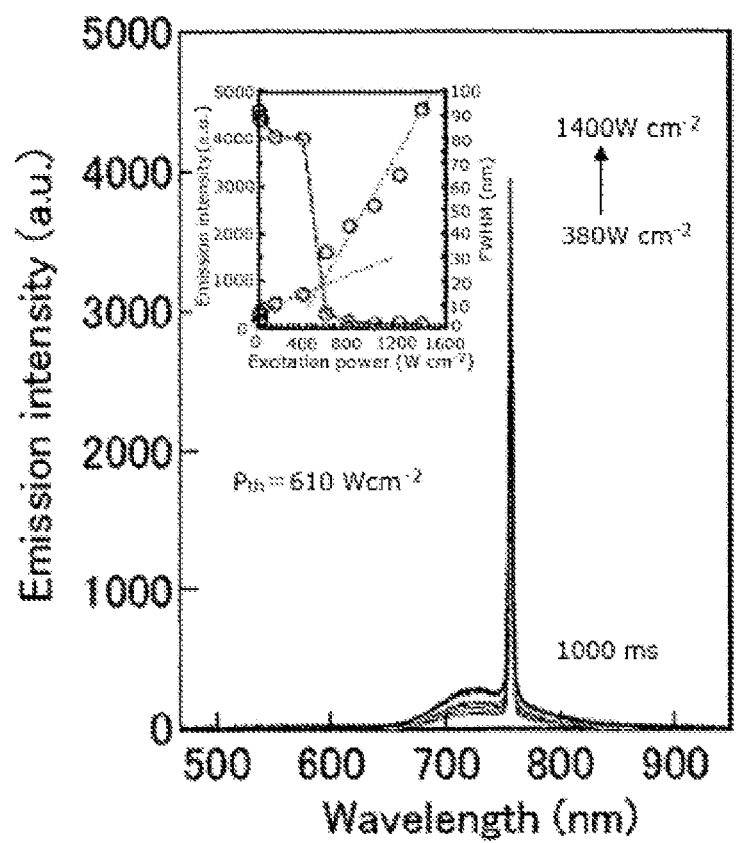
Figure 19A:
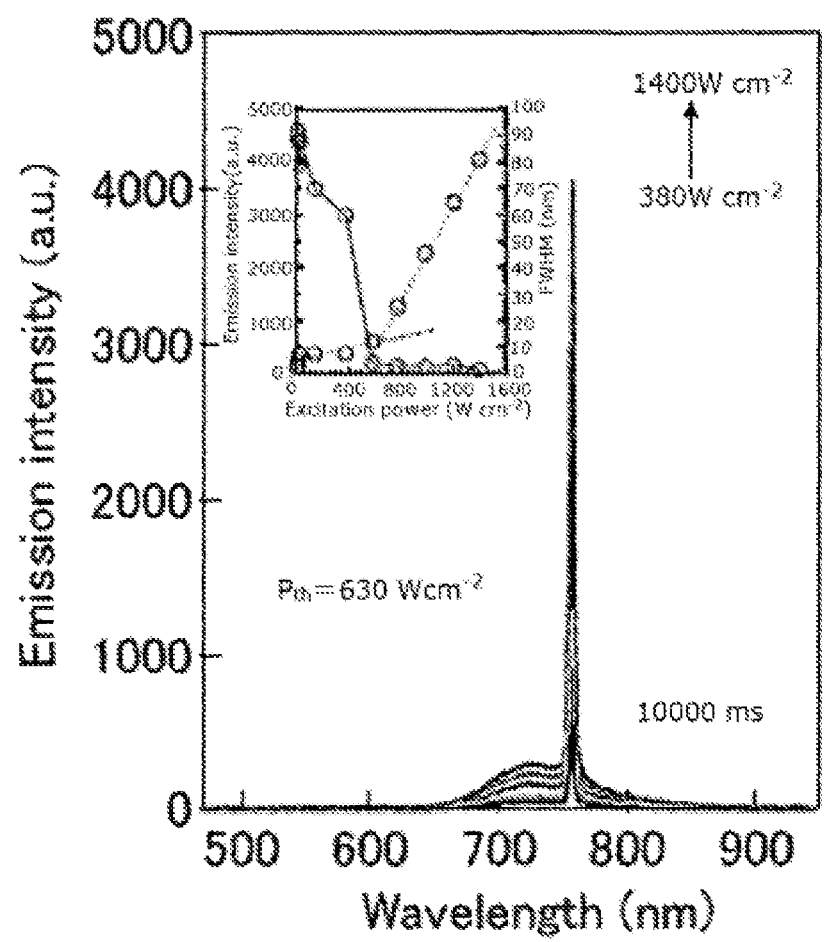
FIGS. 19A-19C are emission spectra of the DFB laser of Example 5 for each different pulse duration, 10000 ms (FIG. 19A), 100000 ms (FIG. 19B), 350000 ms (FIG. 19C), and 400000 ms (FIG. 19D).
Figure 19B:
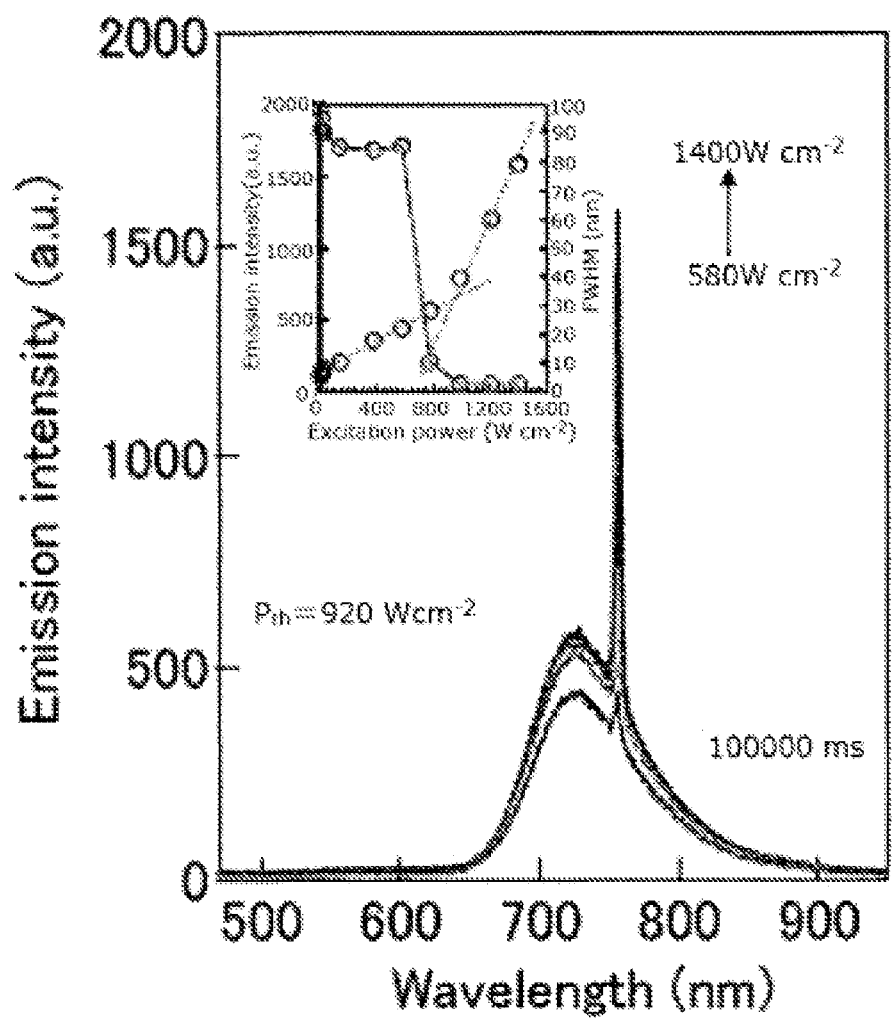
Figure 19C:
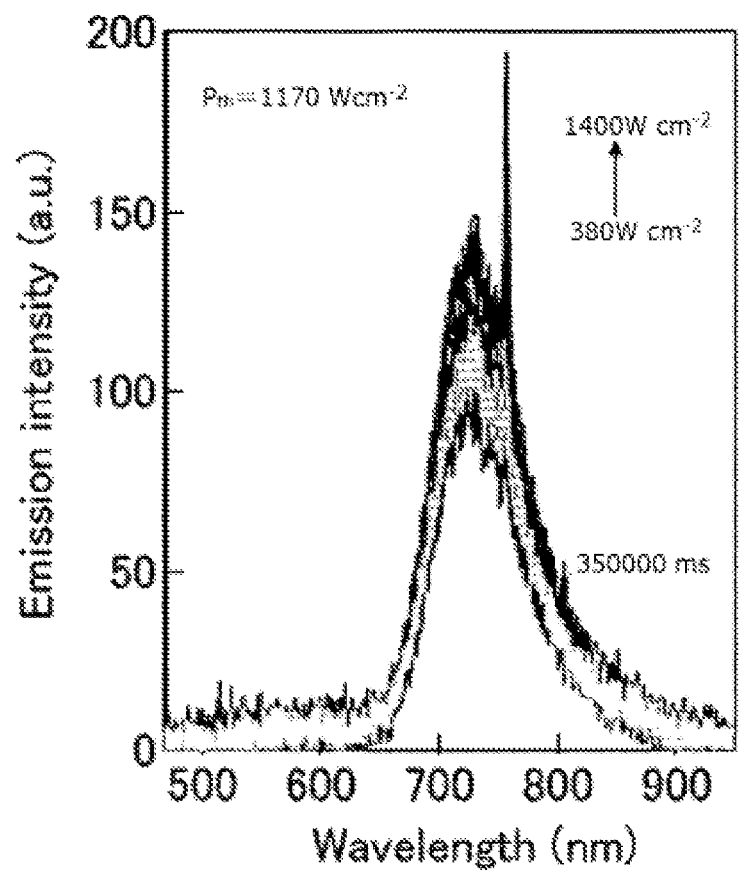
Figure 19D:
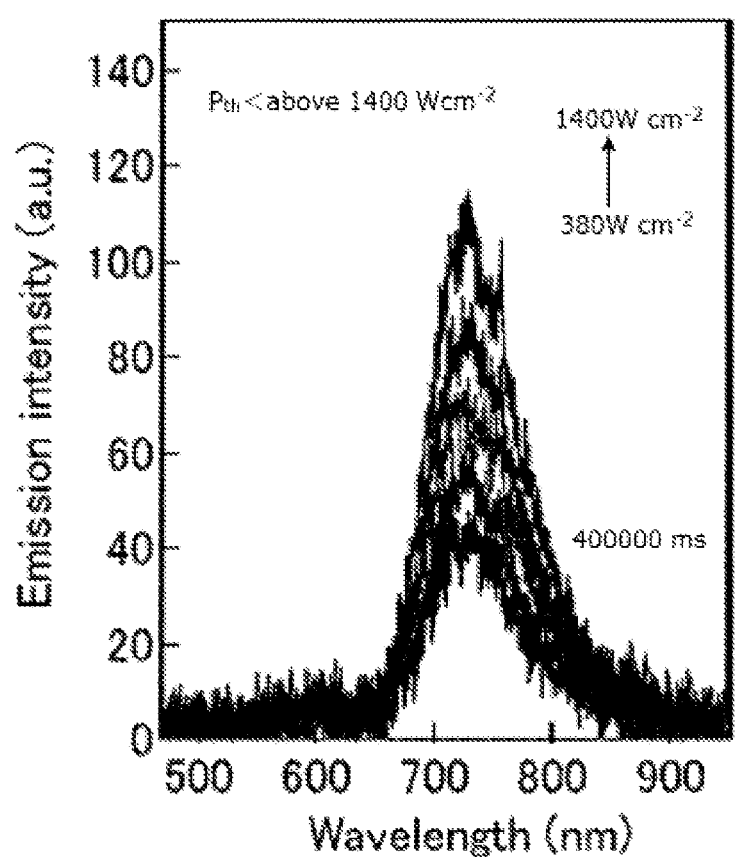

To gain further insights into the lasing properties, the emission spectra and the output intensity of the DFB laser were measured as a function of the excitation intensity for different pulse durations. As shown in FIG. 18 and FIG. 19, lasing is clearly observed above a threshold, which can be determined as a function of the excitation pulse duration from the abrupt changes in the slope efficiency of the laser output intensity. The lasing threshold does not significantly change for excitation pulse width as long as 10 s. As the pulse duration is further increased up to 100 s, the emission spectrum of the DFB laser is not strongly modified but the lasing threshold gradually increases. For longer pulse durations, the determination of the threshold from the output intensity versus excitation intensity becomes inaccurate, presumably due to a degradation of the devices. Nevertheless, lasing peak can still be observed for a pulse duration of 500 s when the excitation intensity is higher than 1.4 kW/cm². In that case, the emission spectrum of the laser is however dominated by the spontaneous emission.

To characterize further the stability of the DFB laser, the device was optically pumped using successive 100 μs excitation pulses at an excitation intensity of 500 W/cm² and monitored the temporal evolution of the laser output intensity and spectra during 12 hours. No significant changes in the laser emission spectrum were noticed after some hours upon intense optical pumping above threshold. In addition, the time duration associated with a reduction of 50% from the initial value of the output intensity is found to be around 300 minutes. These data provide additional strong evidence of the outstanding stability of the DFB laser of the present invention under long pulse operation.

The results demonstrate that the fabricated DFB laser operates well under optical pumping with longer pulses with an unprecedented stability. Such a performance reaches a level allowing the present inventors to claim the realization of the first CW organic semiconductor laser. An important requirement to achieve CW lasing in organic thin films is the use of an organic emitter with high photoluminescence quantum yield, high optical gain and showing no triplet losses at the lasing wavelength. The TADF curcuminoid derivatives of the present invention fulfill these requirements. The architecture of the DFB resonator structure and the organic laser encapsulation by a sapphire lid are preferable to lower the lasing threshold as much as possible and to optimize the heat dissipation under intense optical pumping, respectively. Prior to the present invention, the longest CW lasing duration in an organic semiconductor laser was reported to be 30 ms. These devices used a dye with a PLQY around 100% in doped film, high laser gain, no triplet losses, and the same encapsulation structure as that used in the present invention.

The invention claimed is:

1. An organic electroluminescent device containing an anode, a cathode and an organic layer formed between the anode and the cathode, wherein the organic layer contains a light-emitting layer containing a compound represented by the following formula (1):

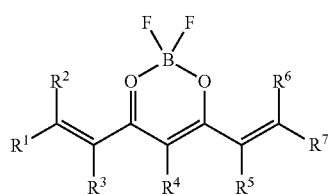

Formula (1)

wherein $R^1$ to $R^6$ each independently represent a hydrogen atom or a substituent; $R^1$ and $R^2$, $R^2$ and $R^3$, $R^3$ and $R^4$, $R^4$ and $R^5$, $R^5$ and $R^6$, and $R^6$ and $R^7$ may be taken together to form a ring; and $R^7$ represents a group represented by the following formula (2) or formula (3):

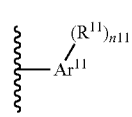

Formula (2)

wherein $Ar^{11}$ represents an aryl group or an aryl-substituted aryl group; $R^{11}$ represents a substituent other than an aryl group; n11 represents an integer of from 1 to the number of substitutable positions in $Ar^{11}$; when n11 is 2 or more, then each $R^{11}$ may be the same or different; and at least one $R^{11}$ is an electron-donating group;

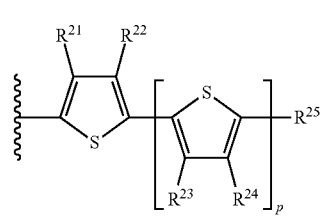

Formula (3)

wherein $R^{21}$ to $R^{25}$ each independently represent a hydrogen atom or a substituent; and p is an integer of from 0 to 2; and wherein the organic electroluminescent device exhibits a maximum emission wavelength at a range of from 700 to 1500 nm.

2. The organic electroluminescent device according to claim 1, wherein the compound is represented by the following formula (11):

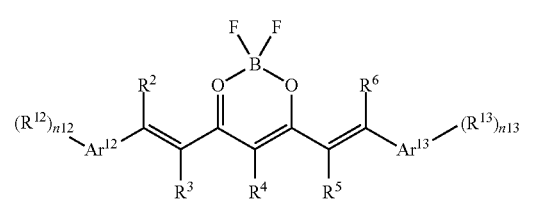

Formula (11)

wherein $Ar^{12}$ and $Ar^{13}$ each independently represent an aryl group or an aryl-substituted aryl group; $R^2$ to $R^6$ each independently represent a hydrogen atom or a substituent; $R^{12}$ and $R^{13}$ each independently represent a substituent; $R^3$ and $R^4$, and $R^4$ and $R^5$ may be taken together to form a ring; $R^2$ may be bonded to $Ar^{12}$ to form a ring and $R^6$ may be bonded to $Ar^{13}$ to form a ring; n12 represents an integer of from 1 to the number of substitutable positions in $Ar^{12}$; when n12 is 2 or more, then each $R^{12}$ may be the same or different; at least one $R^{12}$ is an electron-donating group; n13 represents an integer of from 1 to the number of substitutable positions in $Ar^{13}$; when n13 is 2 or more, then each $R^{13}$ may be the same or different; and at least one $R^{13}$ is an electron-donating group.

3. The organic electroluminescent device according to claim 2, wherein at least one $R^{12}$ and at least one $R^{13}$ are each independently a substituted or unsubstituted diarylamino group.

4. The organic electroluminescent device according to claim 2, wherein $Ar^{12}$ and $Ar^{13}$ each independently have a benzene structure, a naphthalene structure, an anthrathene structure or a fluorene structure.

5. The organic electroluminescent device according to claim 1, wherein the compound is represented by the following formula (12):

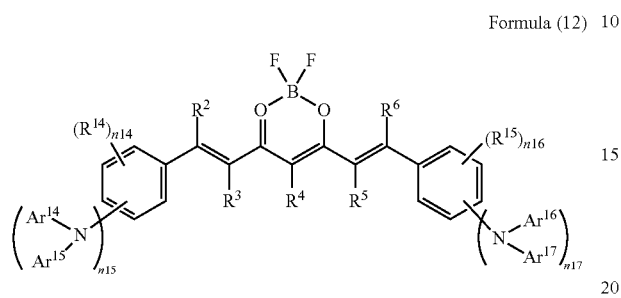

Formula (12)

wherein $Ar^{14}$ to $Ar^{17}$ each independently represent a substituted or unsubstituted aryl group; $R^2$ to $R^6$ each independently represent a hydrogen atom or a substituent; $R^{14}$ and $R^{15}$ each independently represent a substituent other than a substituted or unsubstituted diarylamino group; $R^{14}$ and $R^2$, $R^3$ and $R^4$, $R^4$ and $R^5$, and $R^6$ and $R^{15}$ may be taken together to form a ring; n14 and n16 each independently represent an integer of 0 or more; n15 and n17 each independently represent an integer of 1 or more; n14+n15 is an integer of from 1 to 5 and n16+n17 is an integer of from 1 to 5; when n14 is 2 or more, then each R' may be the same or different; when n15 is 2 or more, then each $Ar^{14}$ may be the same or different and each $Ar^{15}$ may be the same or different; when n16 is 2 or more, then each $R^{15}$ may be the same or different; when n17 is 2 or more, then each $Ar^{16}$ may be the same or different and each $Ar^{17}$ may be the same or different.

6. The organic electroluminescent device according to claim 1, wherein $R^4$ is a hydrogen atom, a substituted or unsubstituted alkyl group, a substituted or unsubstituted aryl group, a substituted or unsubstituted heteroaryl group, a substituted or unsubstituted alkoxycarbonyl group, a substituted or unsubstituted aryloxycarbonyl group, a halogen atom, or a group containing a boron difluoride diketonate ring.

7. The organic electroluminescent device according to claim 1, wherein $R^3$ and $R^4$, or $R^4$ and $R^5$ are taken together to form a ring.

8. The organic electroluminescent device according to claim 1, wherein the compound is represented by the following formula (21):

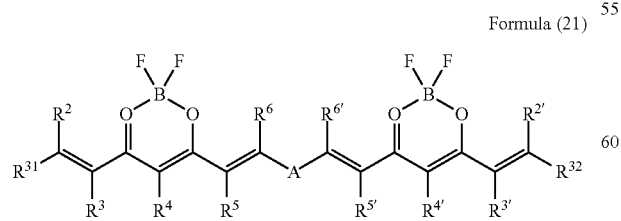

Formula (21)

wherein $R^2$ to $R^6$ and $R^{2'}$ to $R^{6'}$ each independently represent a hydrogen atom or a substituent; $R^{31}$ and $R^{32}$ each independently represent one of the Group A below; $R^{31}$ and $R^2$, $R^3$ and $R^4$, $R^4$ and $R^5$, $R^{32}$ and $R^{2'}$, $R^{3'}$ and $R^{4'}$, and $R^{4'}$ and $R^{5'}$ may be taken together to form a ring; $R^6$ may be bonded to A to form a ring and $R^7$ may be bonded to A to form a ring; A represents a linking group represented by the following formula (22) or (24):

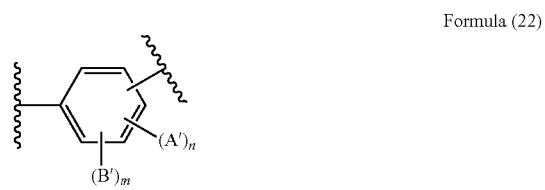

Formula (22)

wherein n is an integer of from 0 to 4; m is 0 or 1; A' represents an alkoxy group having 1 to 12 carbon atoms; and B' represents a group represented by the following formula (23):

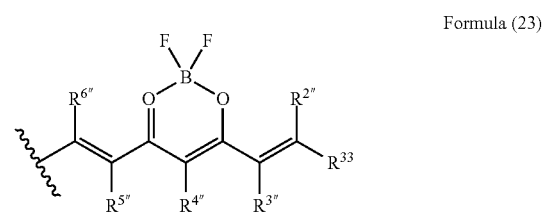

Formula (23)

wherein $R^{2''}$ to $R^{6''}$ each independently represent a hydrogen atom or a substituent; and $R^{33}$ represents one of the Group A below;

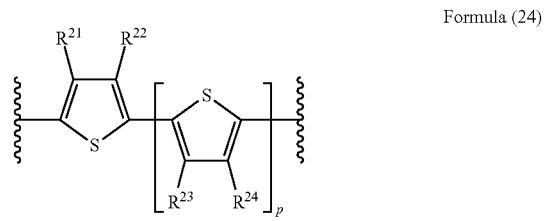

Formula (24)

wherein $R^{21}$ to $R^{24}$ each independently represent a hydrogen atom or a substituent; and p is an integer of from 0 to 2;

Group A

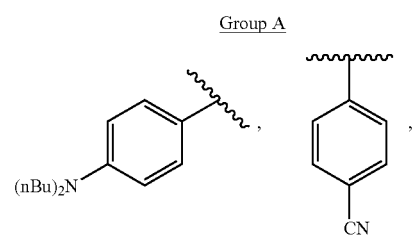

-continued
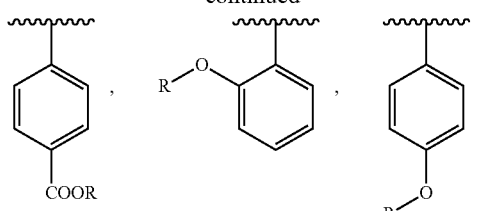
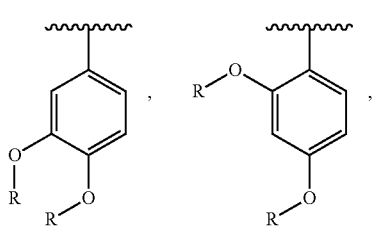
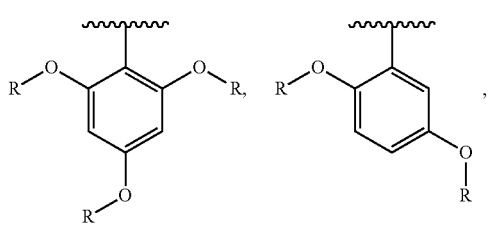
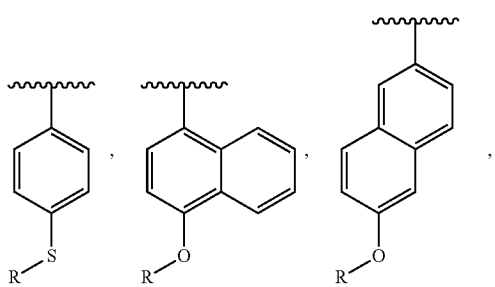
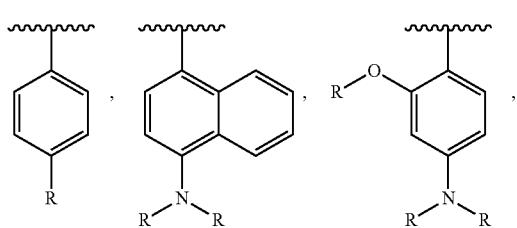
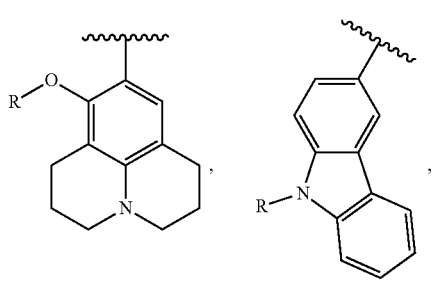
-continued
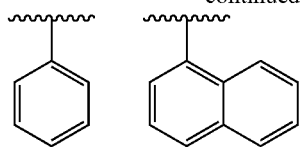
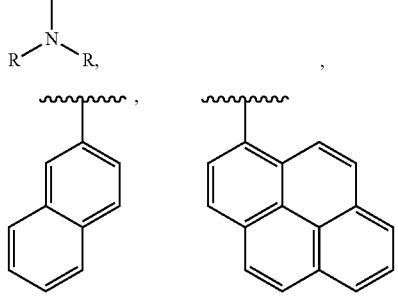
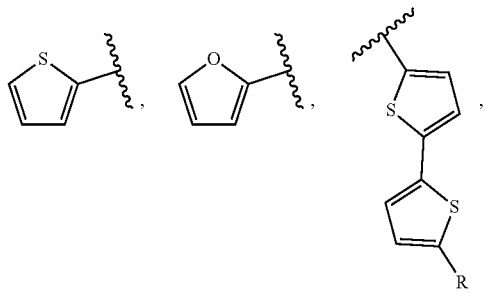
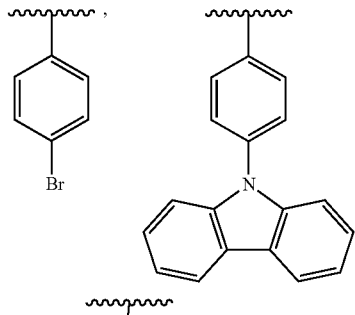
or
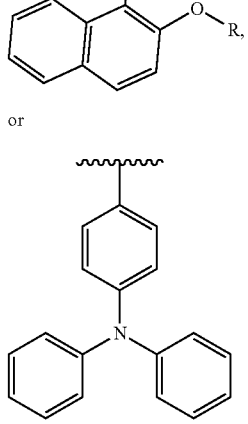
wherein each R independently represents a hydrogen atom, a substituted or unsubstituted alkyl group having 1 to 12 carbon atoms, a substituted or unsubstituted aryl group having 6 to 10 carbon atoms, or a substituted or unsubstituted heteroaryl group; and nBu represents a normal butyl group.

9. An organic electroluminescent device containing an anode, a cathode and an organic layer formed between the anode and the cathode, wherein the organic layer contains a light-emitting layer containing a compound represented by the following formula (1):

Formula (1)

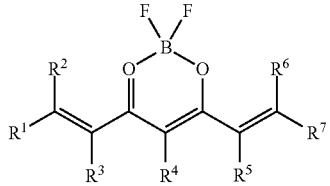

wherein $R^1$ to $R^6$ each independently represent a hydrogen atom or a substituent; $R^1$ and $R^2$, $R^2$ and $R^3$, $R^3$ and $R^4$, $R^4$ and $R^5$, $R^5$ and $R^6$ and $R^6$ and $R^7$ may be taken together to form a ring; and $R^7$ represents a group represented by the following formula (2) or formula (3):

Formula (2)

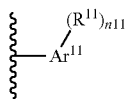

wherein $Ar^{11}$ represents an aryl group or an aryl-substituted aryl group; RH represents a substituent other than an aryl group; n11 represents an integer of from 1 to the number of substitutable positions in $Ar^{11}$; when n11 is 2 or more, then each RH may be the same or different; and at least one $R^{11}$ is an electron-donating group;

Formula (3)

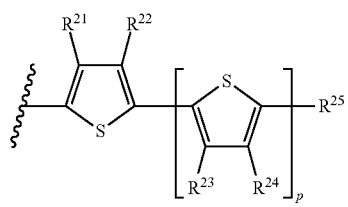

wherein $R^{21}$ to $R^{25}$ each independently represent a hydrogen atom or a substituent; and p is an integer of from 0 to 2; and wherein the organic electroluminescent device emits delayed fluorescence.

10. A compound represented by the following formula (12):

Formula (12)

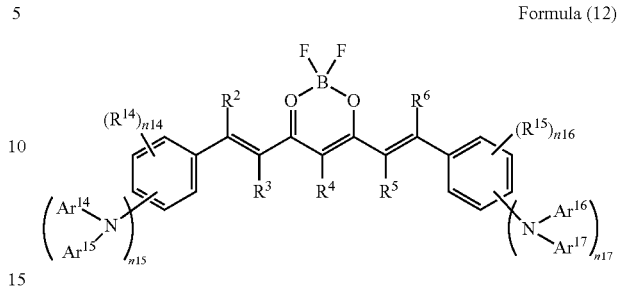

wherein $Ar^{14}$ to $Ar^{17}$ each independently represent a substituted or unsubstituted aryl group; $R^2$, $R^3$, $R^5$ and $R^6$ each independently represent a hydrogen atom or a substituent; $R^4$ represents a substituent; $R^{14}$ and $R^{15}$ each independently represent a substituent; $R^{14}$ and $R^2$, $R^3$ and $R^4$, $R^4$ and $R^5$, and $R^6$ and $R^{15}$ may be taken together to form a ring; n14 and n16 each independently represent an integer of 0 or more; n15 and n17 each independently represent an integer of 1 or more; provided that n14+n15 is an integer of from 1 to 5 and n16+n17 is an integer of from 1 to 5; when n14 is 2 or more, then each $R^{14}$ may be the same or different; when n15 is 2 or more, then each of the diarylamino group in the parentheses of n15 may be the same or different; when n16 is 2 or more, then each $R^{15}$ may be the same or different; when n17 is 2 or more, then each of the diarylamino group in the parentheses of n17 may be the same or different.

11. An organic semiconductor laser, having an optical resonator structure and comprising a compound represented by the following formula (1) as an emitter:

Formula (1)

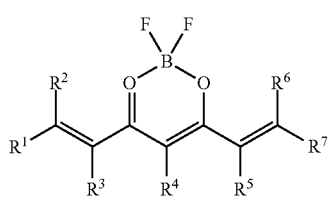

wherein $R^1$ to $R^6$ each independently represent a hydrogen atom or a substituent; $R^1$ and $R^2$, $R^2$ and $R^3$, $R^3$ and $R^4$, $R^4$ and $R^5$, $R^5$ and $R^6$ and $R^6$ and $R^7$ may be taken together to form a ring; and $R^7$ represents a group represented by the following formula (2) or formula (3):

Formula (2)

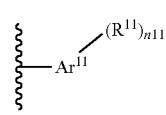

wherein $Ar^{11}$ represents an aryl group or an aryl-substituted aryl group; $R^{11}$ represents a substituent other than an aryl group; n11 represents an integer of from 1 to the number of substitutable positions in $Ar^{11}$; when n11 is 2 or more, then each $R^{11}$ may be the same or different; and at least one RH is an electron-donating group;

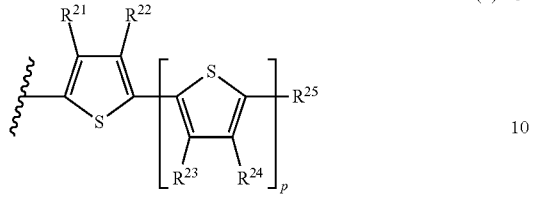

Formula (3)

wherein $R^{21}$ to $R^{25}$ each independently represent a hydrogen atom or a substituent; and p is an integer of from 0 to 2.

12. The organic semiconductor laser according to claim 11, wherein the optical resonator structure is composed of a second-order Bragg scattering region surrounded by a first-order Bragg scattering region.

* * * * *